United States Patent
Farrenkopf et al.

[11] Patent Number: 5,889,315
[45] Date of Patent: Mar. 30, 1999

[54] SEMICONDUCTOR STRUCTURE HAVING TWO LEVELS OF BURIED REGIONS

[75] Inventors: Douglas R. Farrenkopf, Santa Clara; Richard B. Merrill, Daly City; Samar Saha, Milpitas; Kevin E. Brehmer; Kamesh Gadepally, both of San Jose; Philip J. Cacharelis, Menlo Park, all of Calif.

[73] Assignee: National Semiconductor Corporation, Santa Clara, Calif.

[21] Appl. No.: 393,622

[22] Filed: Feb. 23, 1995

Related U.S. Application Data

[63] Continuation-in-part of Ser. No. 292,891, Aug. 18, 1994, abandoned.

[51] Int. Cl.⁶ .................................................. H01L 29/00
[52] U.S. Cl. ........................................ 257/552; 257/565
[58] Field of Search .................................. 257/552, 565, 257/593, 655, 657, 370, 378, 544, 545, 549

[56] References Cited

U.S. PATENT DOCUMENTS

| | | | |
|---|---|---|---|
| 3,595,713 | 7/1971 | Brebisson et al. | 148/175 |
| 3,826,698 | 7/1974 | Antipov et al. | 148/191 |
| 3,869,321 | 3/1975 | Davis | 148/175 |
| 3,971,059 | 7/1976 | Dunkley et al. | 357/44 |
| 4,038,680 | 7/1977 | Yagi et al. | 357/44 |
| 4,046,605 | 9/1977 | Nelson et al. | 148/175 |
| 4,120,707 | 10/1978 | Beasom | 148/186 |
| 4,168,997 | 9/1979 | Compton | 257/544 |
| 4,403,395 | 9/1983 | Curran | 29/571 |
| 4,637,125 | 1/1987 | Iwasaki et al. | 29/571 |
| 4,826,780 | 5/1989 | Takemoto et al. | 437/37 |
| 4,830,973 | 5/1989 | Mastroianni | 437/31 |
| 4,853,559 | 8/1989 | Min et al. | 307/270 |
| 4,918,026 | 4/1990 | Kosiak et al. | 437/33 |
| 4,994,887 | 2/1991 | Hutter et al. | 357/43 |
| 5,028,978 | 7/1991 | Hall | 257/370 |
| 5,034,337 | 7/1991 | Mosher et al. | 437/31 |
| 5,117,274 | 5/1992 | Mastroianni | 357/43 |

(List continued on next page.)

FOREIGN PATENT DOCUMENTS

| | | |
|---|---|---|
| 0110313 | 6/1984 | European Pat. Off. . |
| 0 253 724 | 1/1988 | European Pat. Off. . |
| 0 381 071 | 8/1990 | European Pat. Off. . |
| 0 545 521 | 6/1993 | European Pat. Off. . |
| 61-208235 | 9/1986 | Japan . |
| 1-192131 | 8/1989 | Japan . |
| 2-112272 | 4/1990 | Japan ........ 257/544 |
| 2-143453 | 6/1990 | Japan . |
| 2-238664 | 9/1990 | Japan ........ 257/544 |

OTHER PUBLICATIONS

Baliga, "Power Integrated Circuits—A Brief Overview", *IEEE Trans. Elec. Devs.*, vol. ED–33, Dec. 1986, pp. 1936–1939, reprinted as pp. 3–36.

(List continued on next page.)

*Primary Examiner*—Mark V. Prenty
*Attorney, Agent, or Firm*—Skjerven, Morrill, MacPherson, Franklin & Friel LLP; Ronald J. Meetin

[57] ABSTRACT

Integrated circuits suitable for high-performance applications, especially mixed signal products that have analog and digital sections, are fabricatable from a semiconductor structure having two levels of buried regions. In a typical embodiment lower buried regions of opposite conductivity types are situated along a lower semiconductor interface between a semiconductive substrate and an overlying lower semiconductive layer. Upper buried regions of opposite conductivity type are similarly situated along an upper semiconductor interface between the lower semiconductive layer and an overlying upper semiconductive layer. The upper semiconductive layer contains P-type and N-type device regions in which transistor zones are situated. The semiconductor structure is normally configured so that at least one of each of the P-type and N-type device regions is electrically isolated from the substrate. Complementary bipolar transistors can be integrated with complementary field-effect transistors in the structure.

114 Claims, 41 Drawing Sheets

U.S. PATENT DOCUMENTS

| | | | |
|---|---|---|---|
| 5,119,160 | 6/1992 | Hall | 357/43 |
| 5,124,271 | 6/1992 | Havemann | 437/31 |
| 5,156,989 | 10/1992 | Williams et al. | 437/41 |
| 5,179,036 | 1/1993 | Matsumoto | 437/59 |
| 5,181,095 | 1/1993 | Mosher et al. | 257/370 |
| 5,208,169 | 5/1993 | Shah et al. | 437/31 |
| 5,256,582 | 10/1993 | Mosher et al. | 437/31 |
| 5,283,460 | 2/1994 | Mita | 257/544 |
| 5,394,007 | 2/1995 | Reuss et al. | 257/544 |
| 5,578,855 | 11/1996 | Gaffur et al. | 257/371 |

OTHER PUBLICATIONS

Merrill et al, "Effect of Substrate Material on Crosstalk in Mixed Analog/Digital Integrated Circuits", IEDM 1994, pp. 433–436, Dec. 1994.

Rumennik, "Power Devices are in the Chips", IEEE Spectrum, vol. 22, Jul. 1985, pp. 42–48, reprinted as pp. 27–33.

Williams et al, "A DI/JI–Compatible Monolithic High–Voltage Multiplexer", *IEEE Trans. Elec. Devs.*, vol. ED–33, Dec. 1986, pp. 1977–1984.

IBM Technical Disclosure Bulletin, vol. 16, No. 6, Nov. 1973 pp. 1985–1986 W.B. Chin et al. "Integrated Circuit Including Bipolar and Complementary Metal–Oxide Silicon Devices".

IBM Technical Disclosure Bulletin, vol. 11, No. 10 Mar. 1969 pp. 1342–1343 O.R. Viva et al. "Forming Buried Layer by Diffusion".

Stolfa et al., "A BiCMOS 0.8$\mu$m Process with a Toolkit for Mixed–Mode Design", IEEE 1993 Custom Integrated Circuits Conference, May 9–12, 1993, Conf. No. 18817, pp. 24.2.1–24.2.4.

Ham et al., "A 0.8$\mu$m BiCMOS Technology for ASIC Applications", IEEE 1993 Custom Integrated Circuits Conference, May. 9–12, 1993, pp. 24.3.1–24.3.4.

Kobayashi et al. "High Performance LSI Process Technology: SST CBi–CMOS", *IEDM 88*, 1988, pp. 760–763, Dec. 1988.

de Lang et al., "Integration of Vertical PNP Transistors in a Double–Polysilicon Bi–CMOS Process", IEEE 1989 Bipolar Circuits and Technology Meeting, Sep. 18–19, 1989, pp. 190–193.

Tanabe et al., "Device Structure and Electrical Characteristics of SST–CMOS", *Extended Abstracts of the 19th Conference on Solid State Devices*, 1987, pp. 343–346, Dec. 1987.

Verdonckt–Vandebroek et al., "A Complementary High Current Gain Transistor for Use in a CMOS Compatible Technology", IEEE 1990 Bipolar Circuits and Technology Meeting, 1990, pp. 82–85, Dec. 1990.

Kobayashi et al., "A New Bipolar Transistor Structure for Very High Speed VLSI", 1985 Symposium on VLSI Technology, *Digest of Technical Papers,* May 14–16, 1985, pp. 40–41.

Wolf, *Silicon Processing for the VLSI Era, vol. 2: Process Integration,* 1990, pp. 432–434, Dec. 1990.

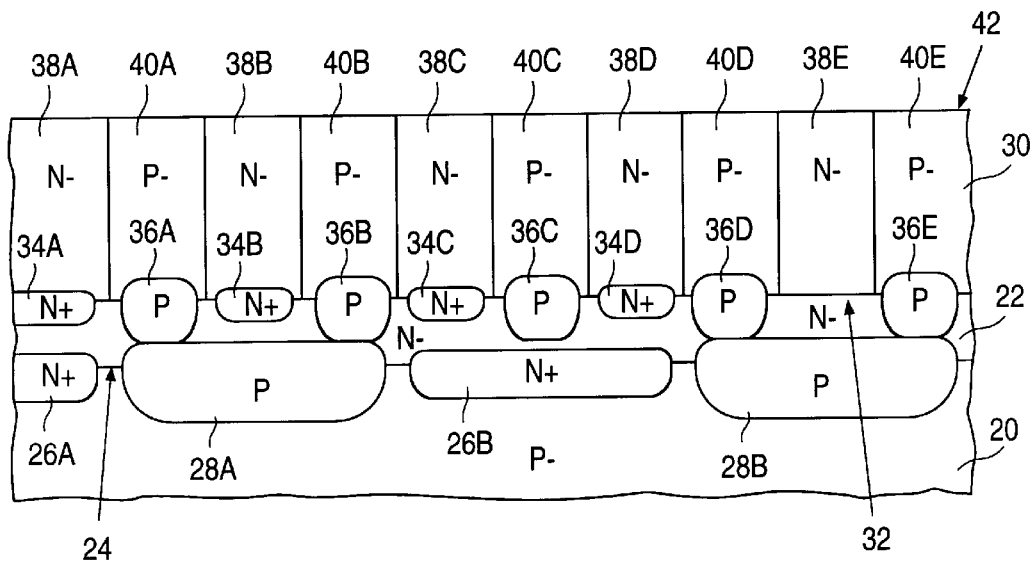
Fig. 1.1
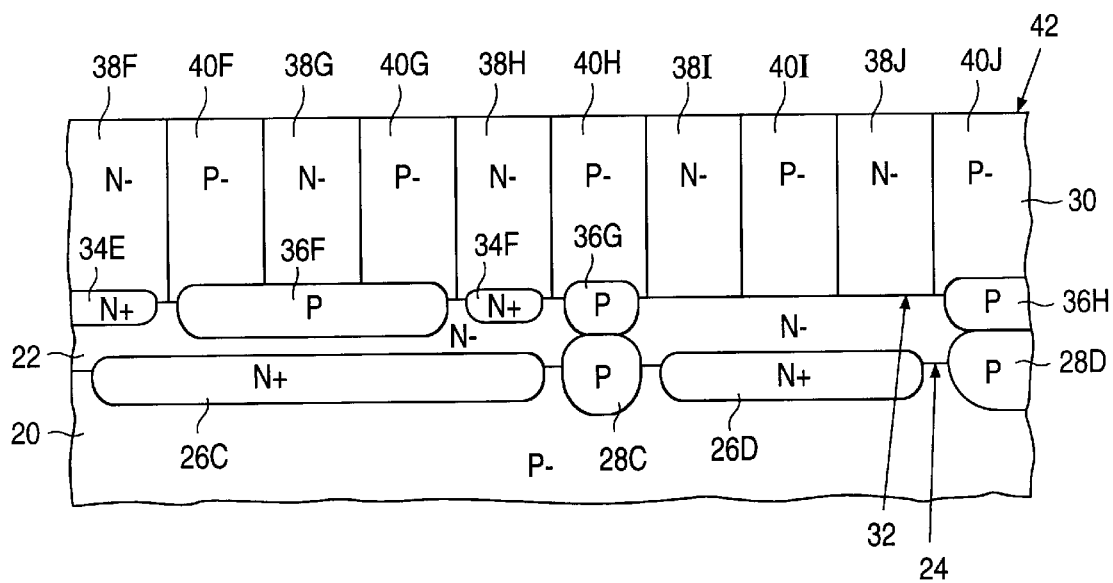
Fig. 1.2

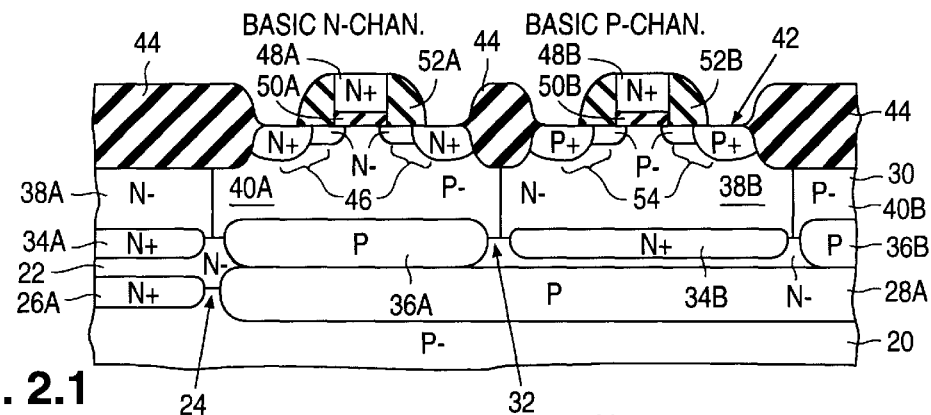
Fig. 2.1
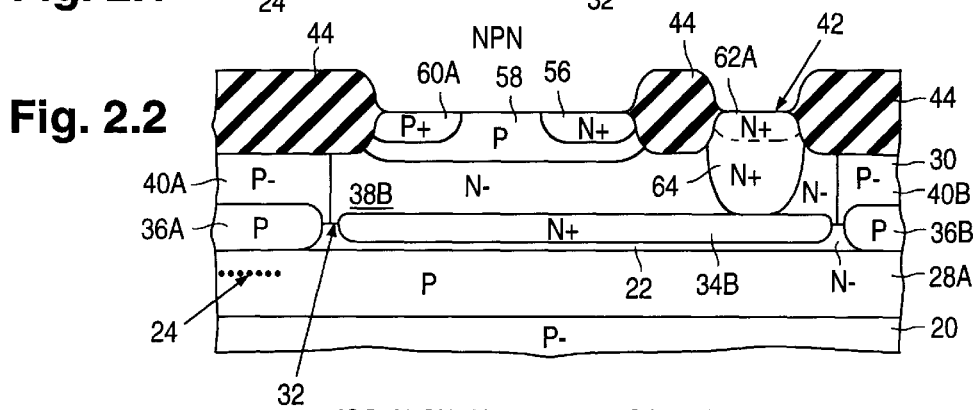
Fig. 2.2
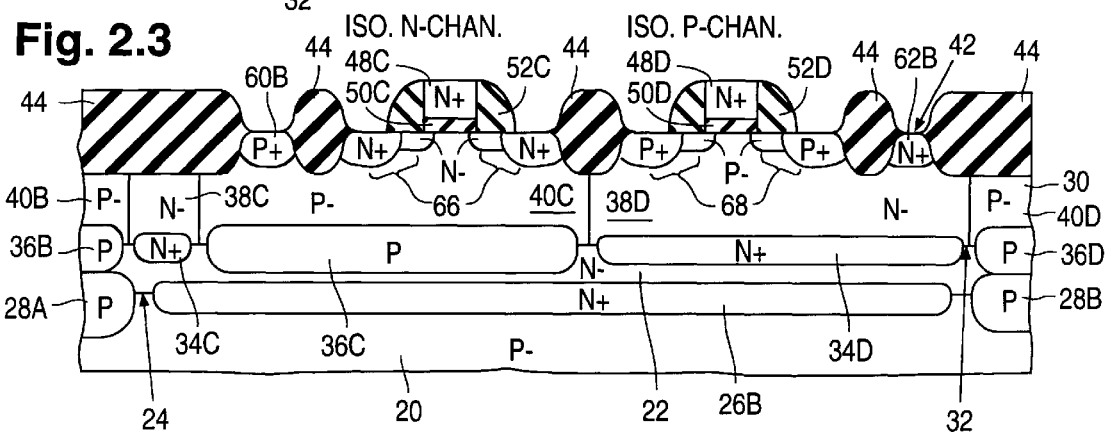
Fig. 2.3
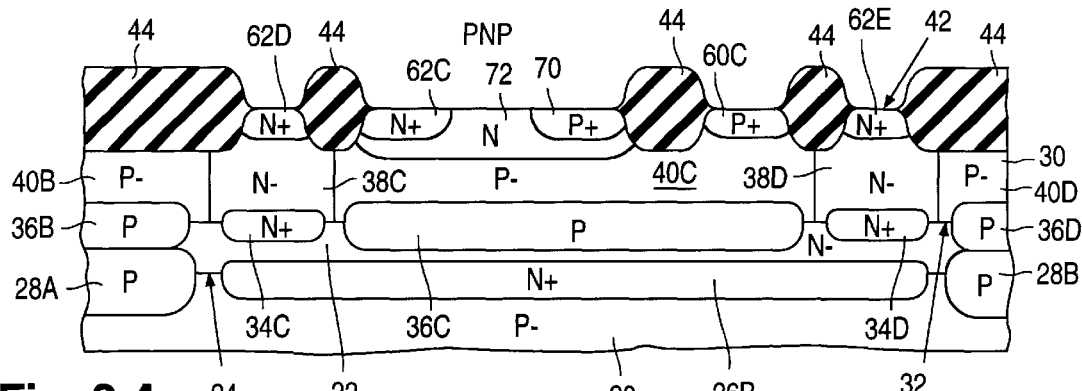
Fig. 2.4

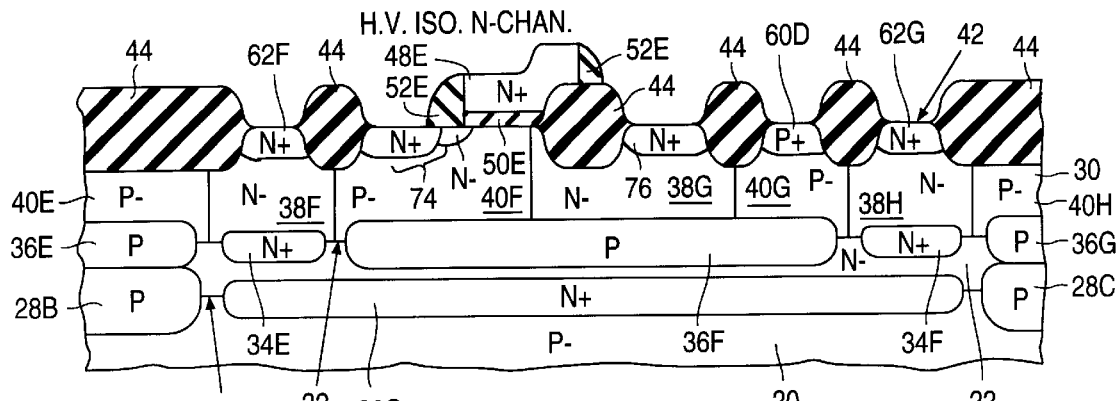
Fig. 2.5
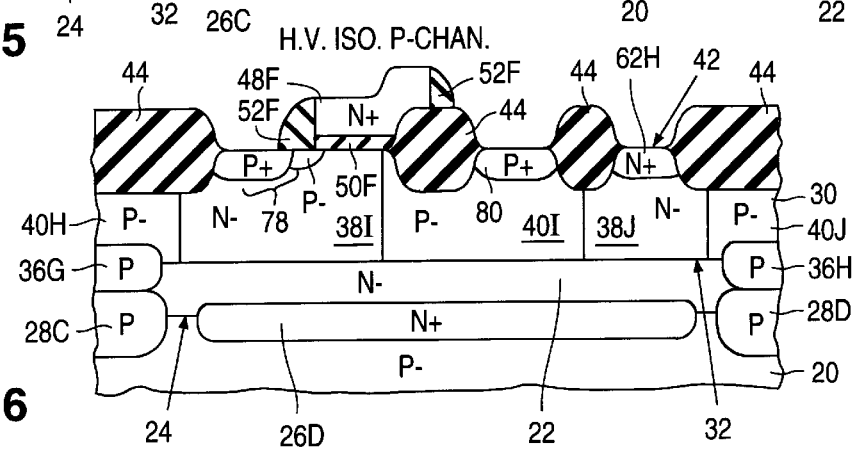
Fig. 2.6
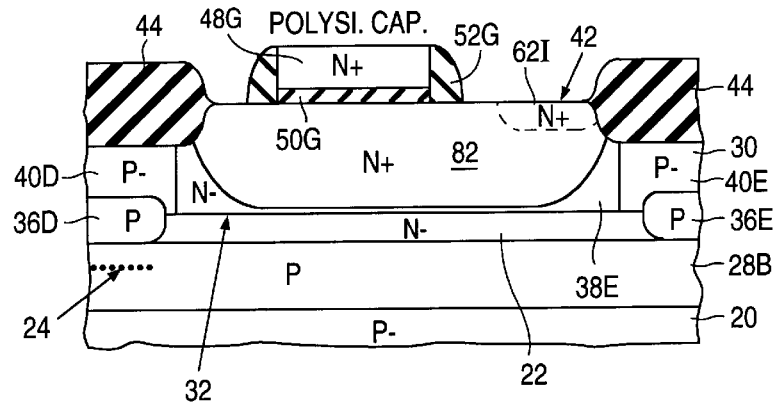
Fig. 2.7
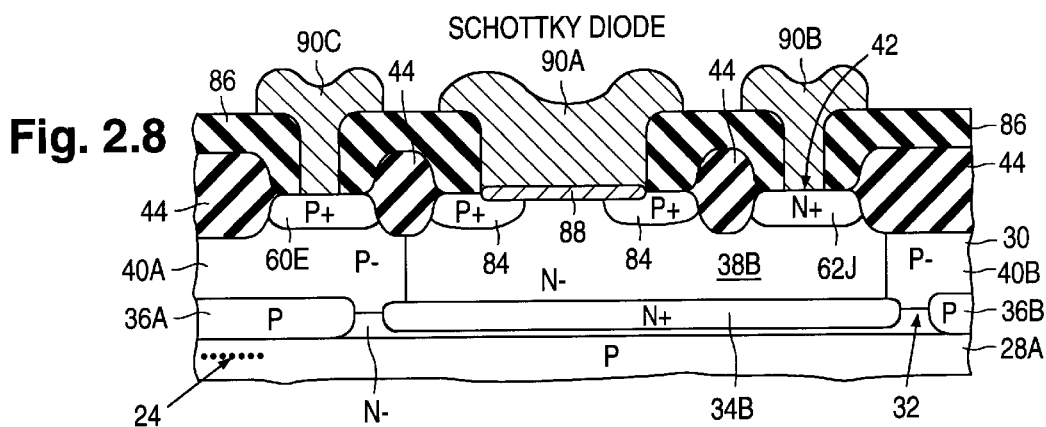
Fig. 2.8

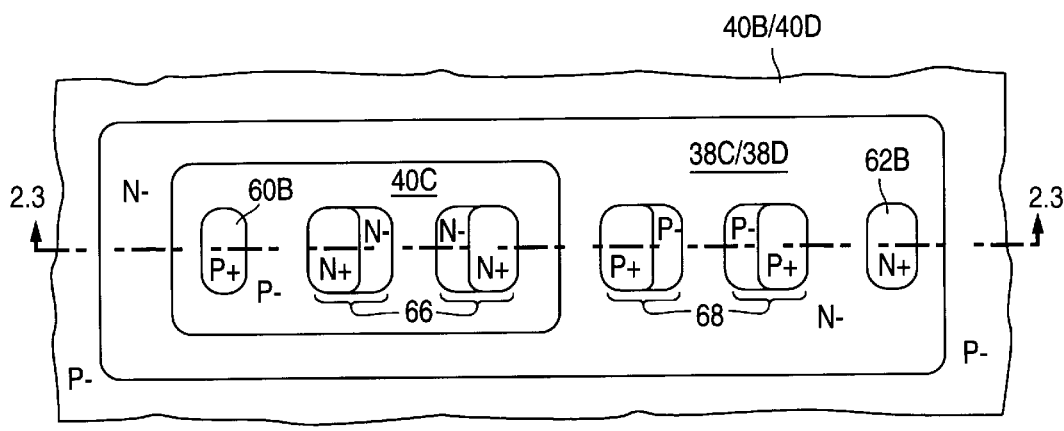
Fig. 3
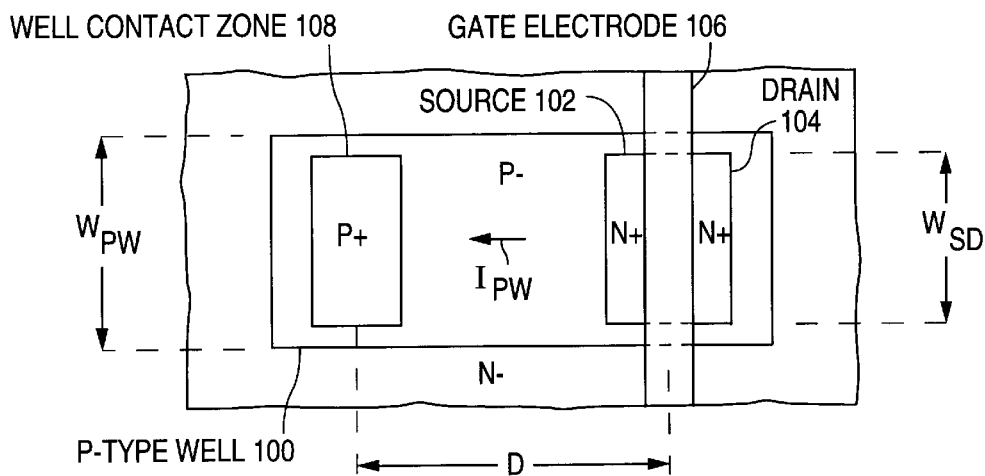
Fig. 4.1
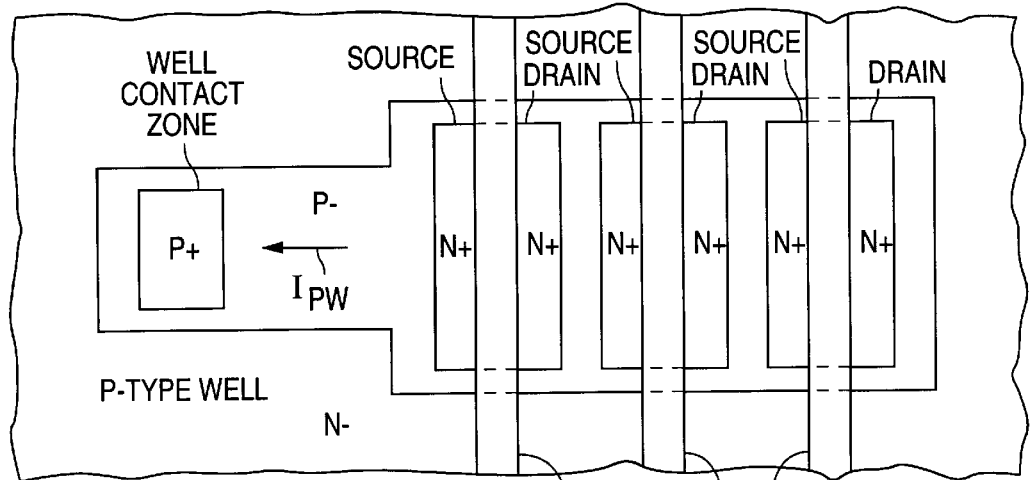
Fig. 4.2

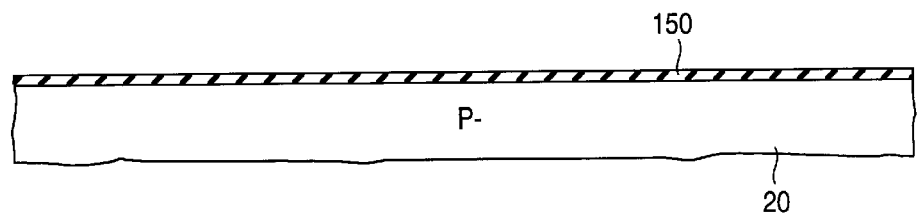
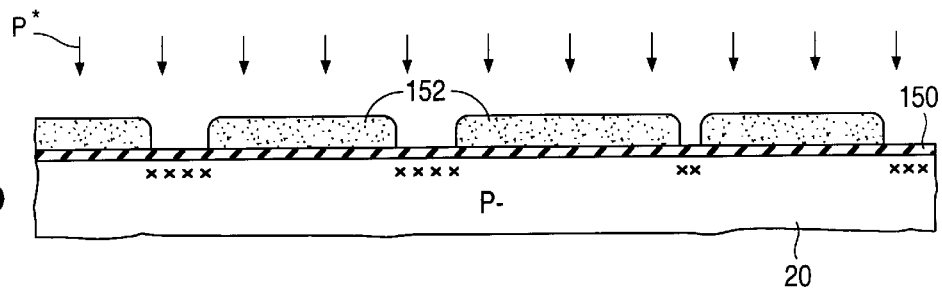
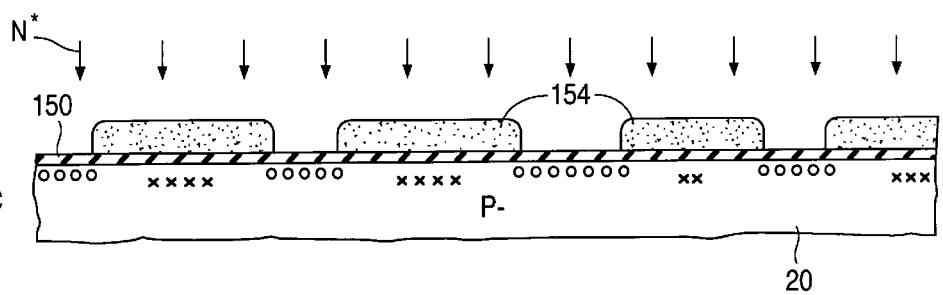
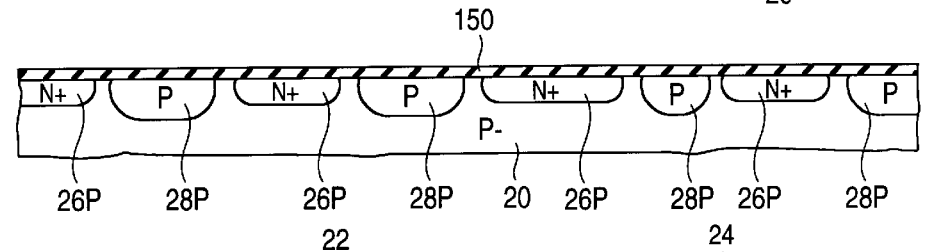
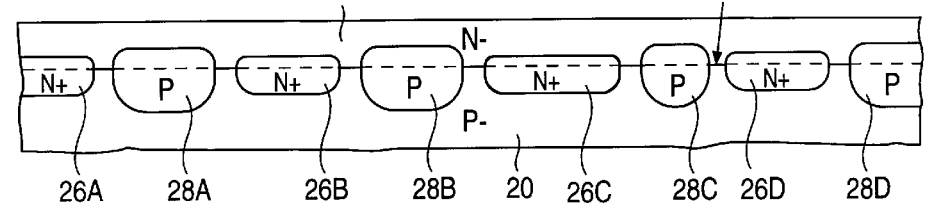
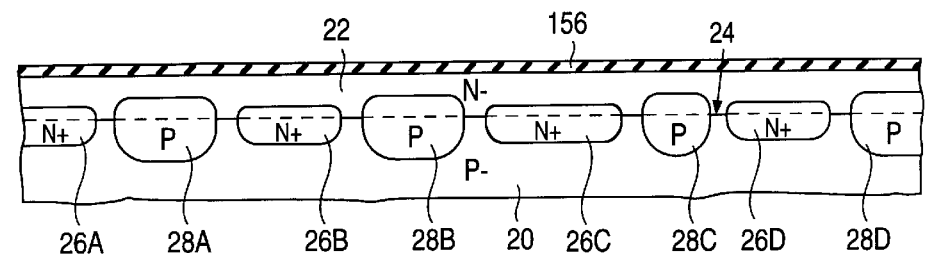

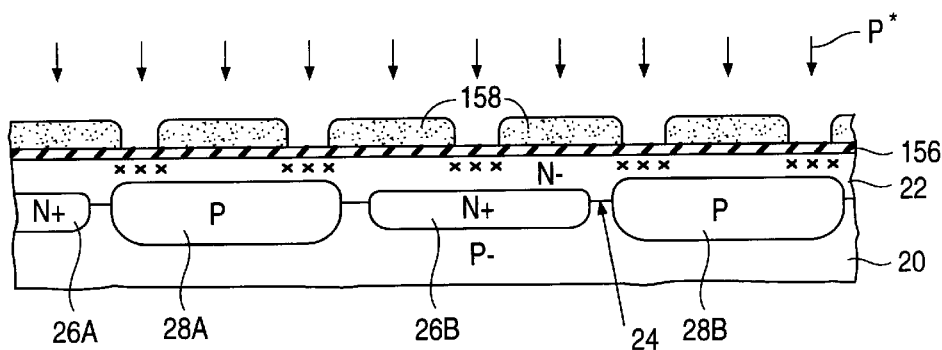
Fig. 9g.1
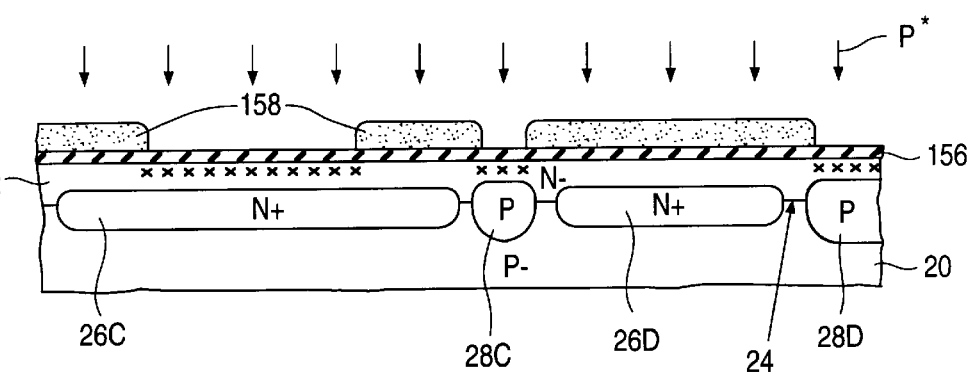
Fig. 9g.2
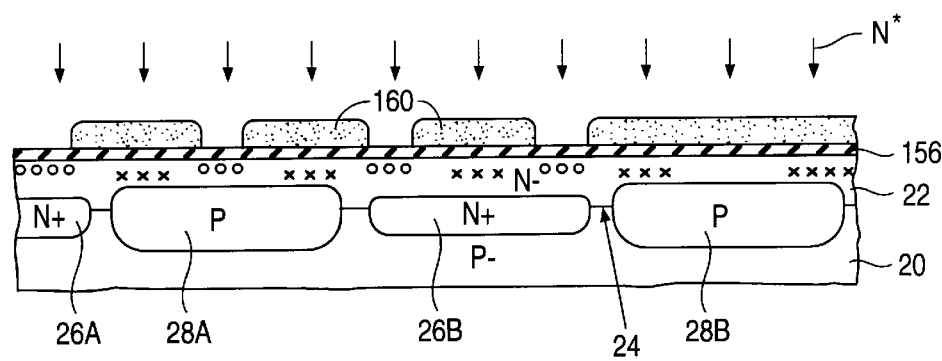
Fig. 9h.1
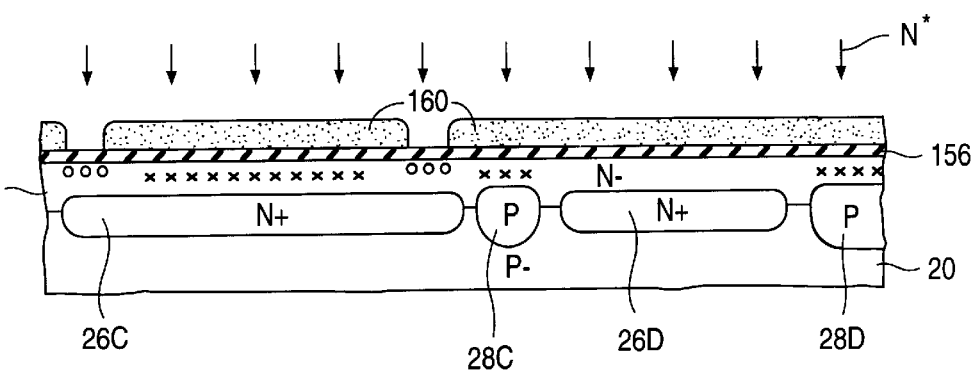
Fig. 9h.2

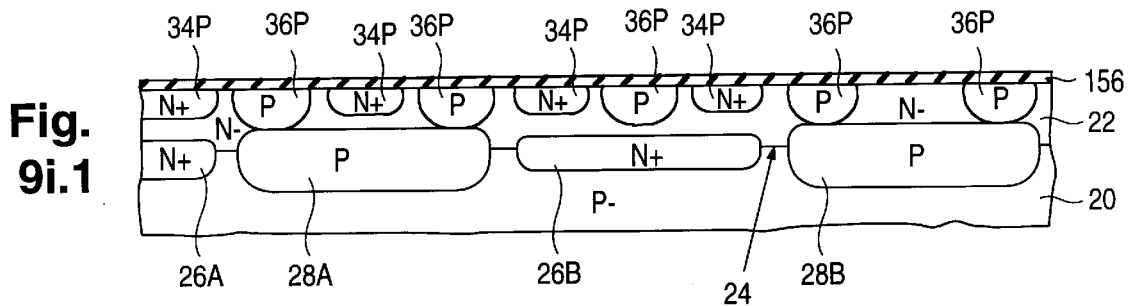
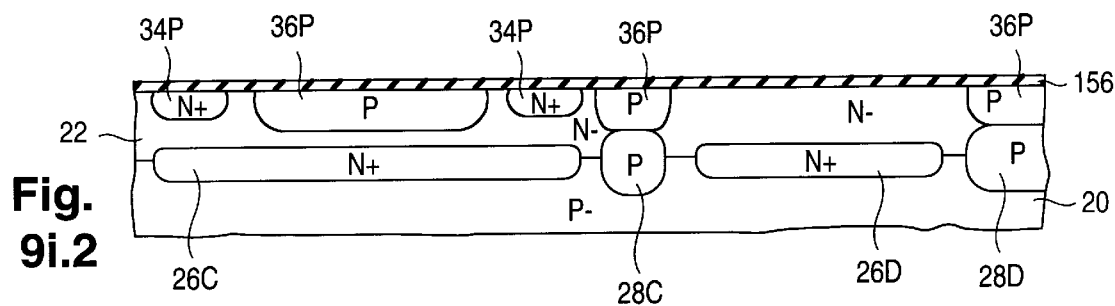
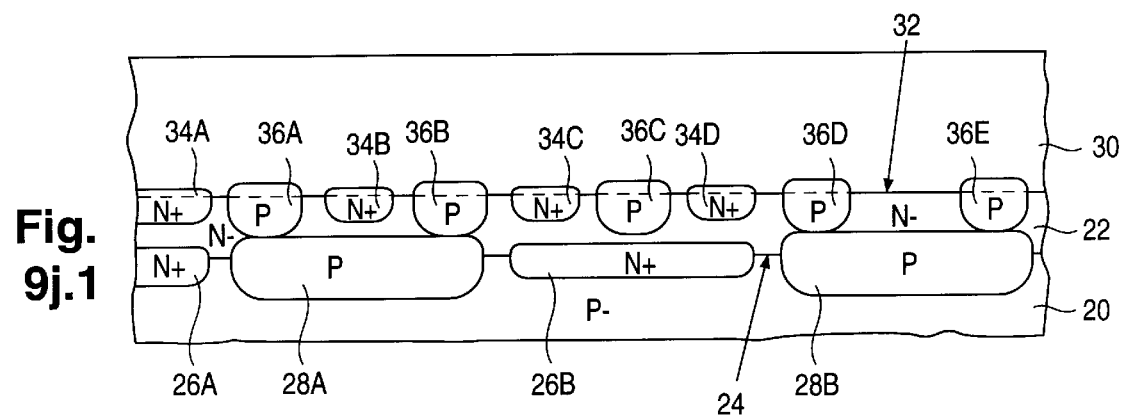
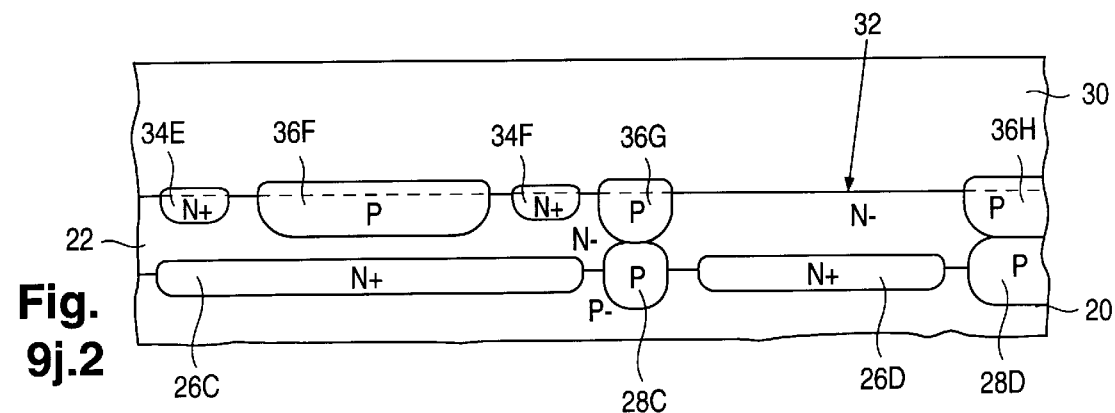

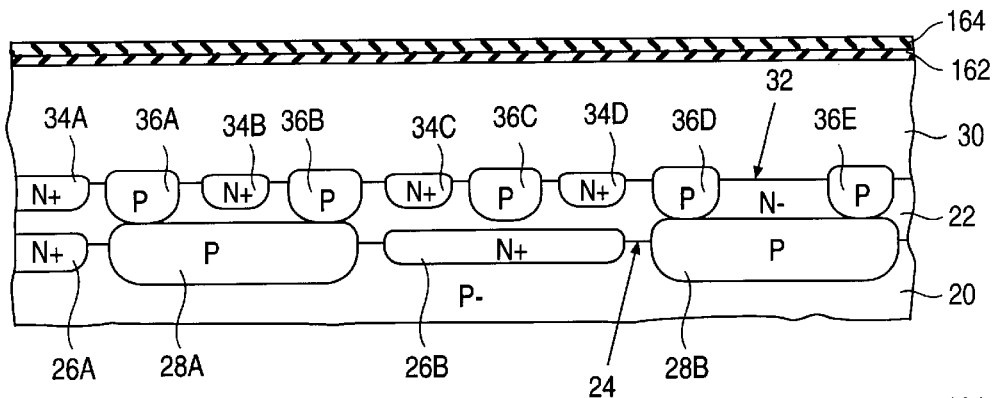
Fig. 9k.1
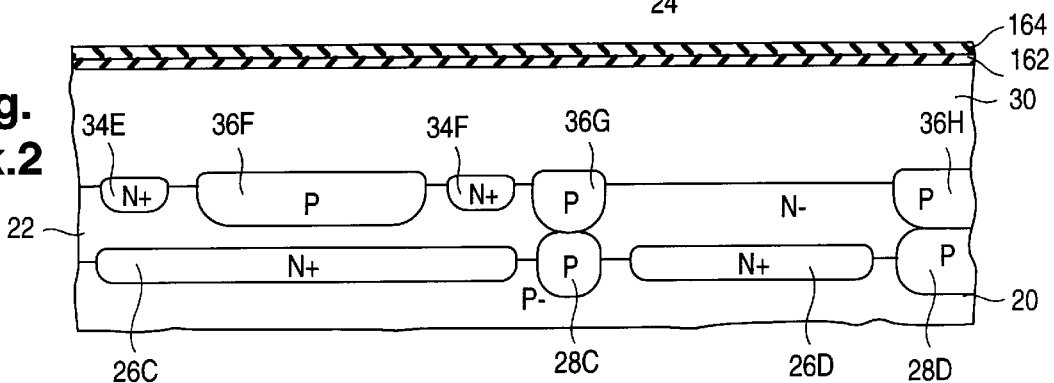
Fig. 9k.2
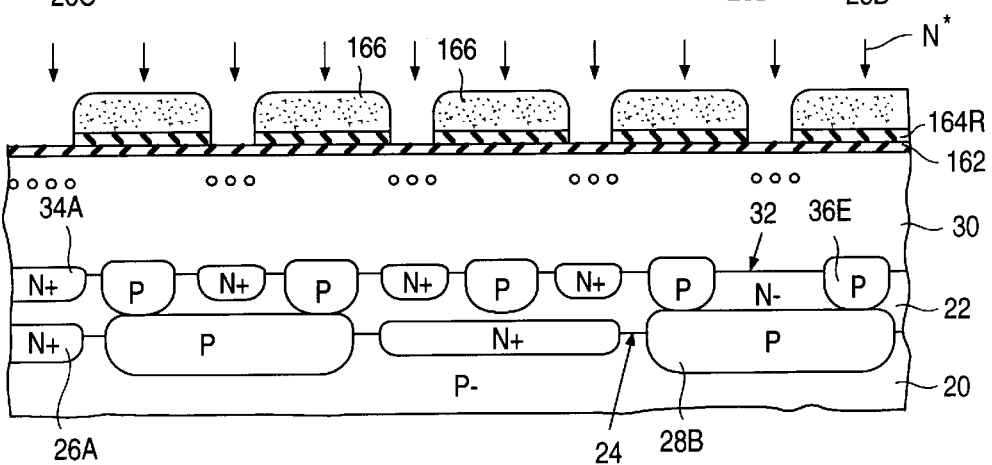
Fig. 9l.1
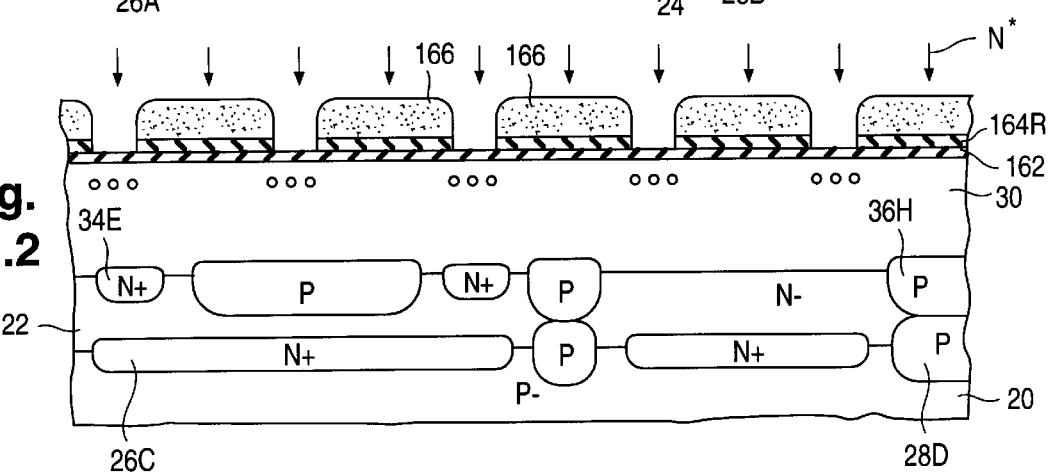
Fig. 9l.2

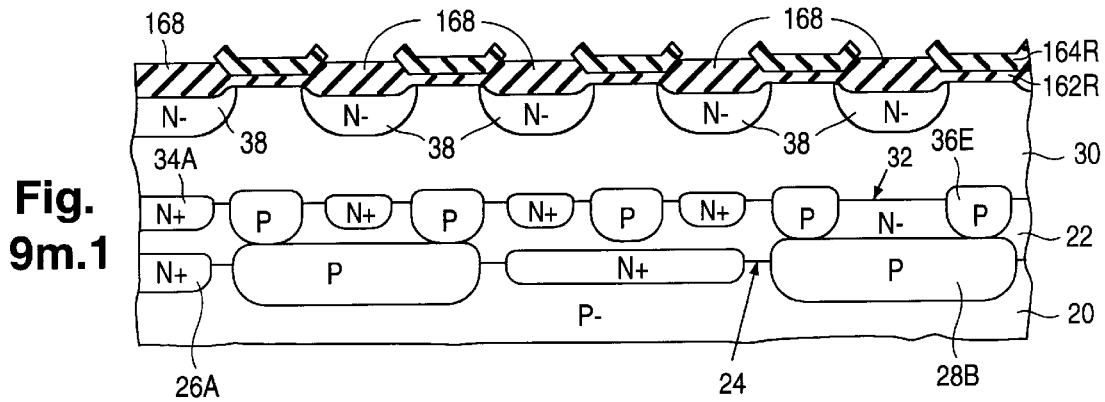
Fig. 9m.1
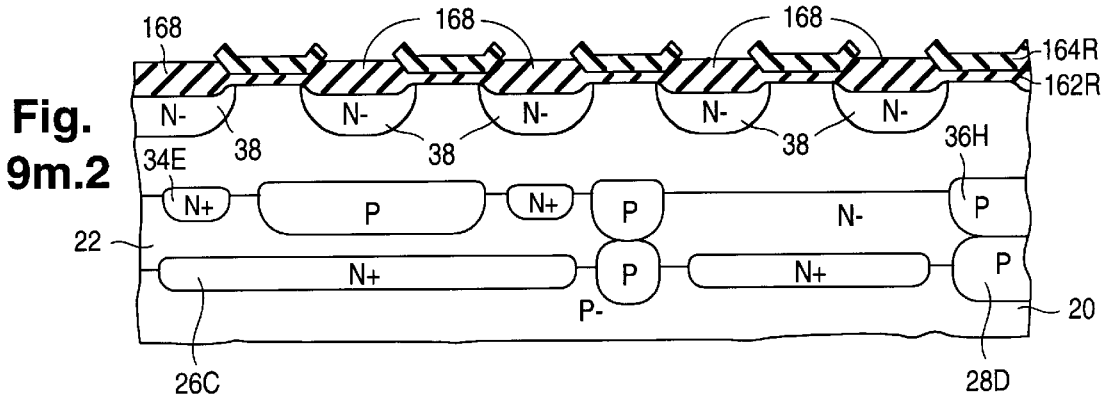
Fig. 9m.2
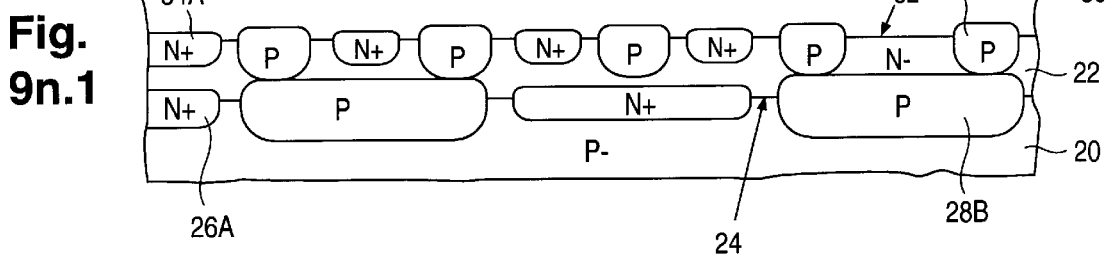
Fig. 9n.1
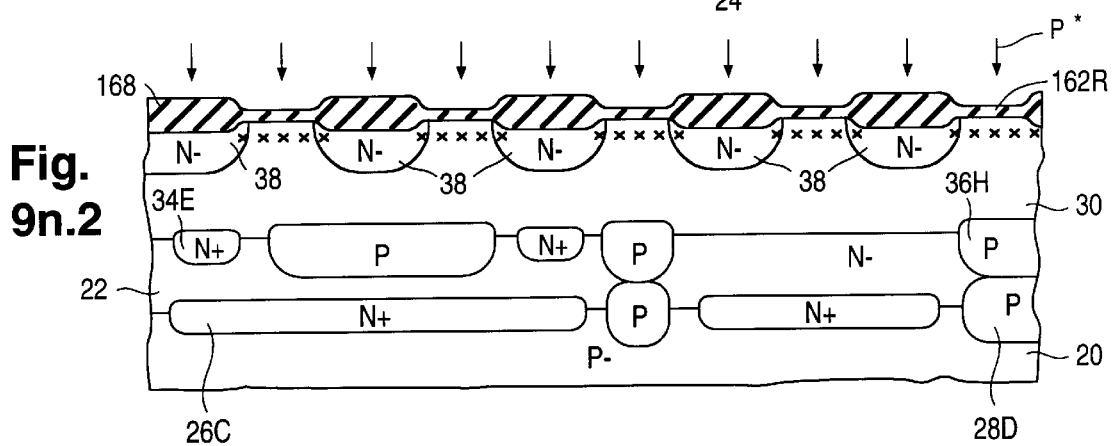
Fig. 9n.2

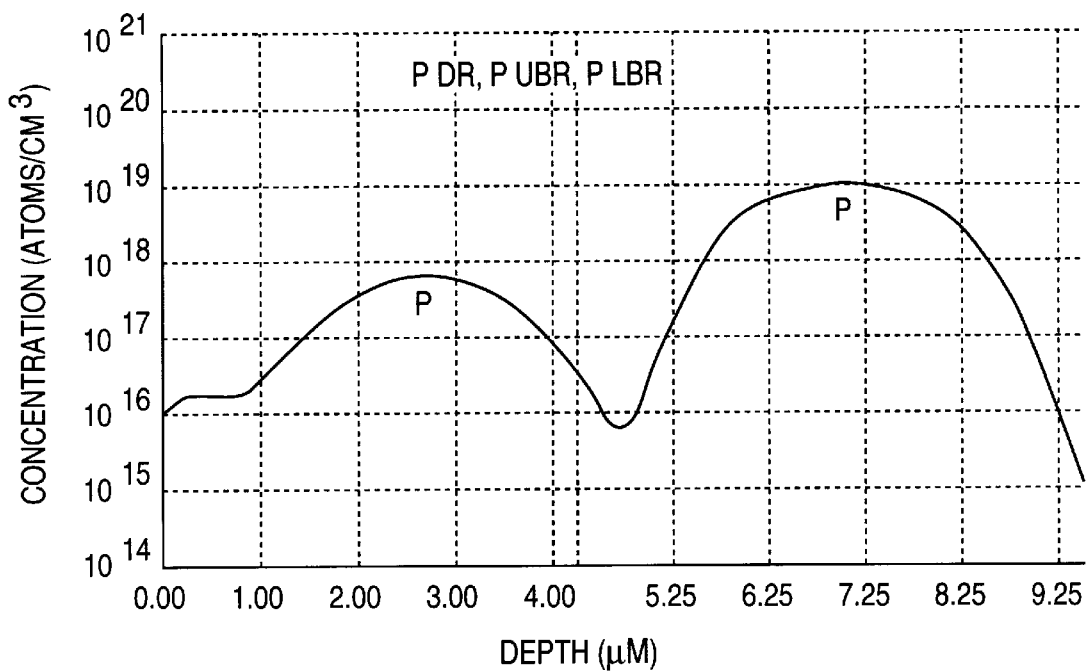
Fig. 10.1
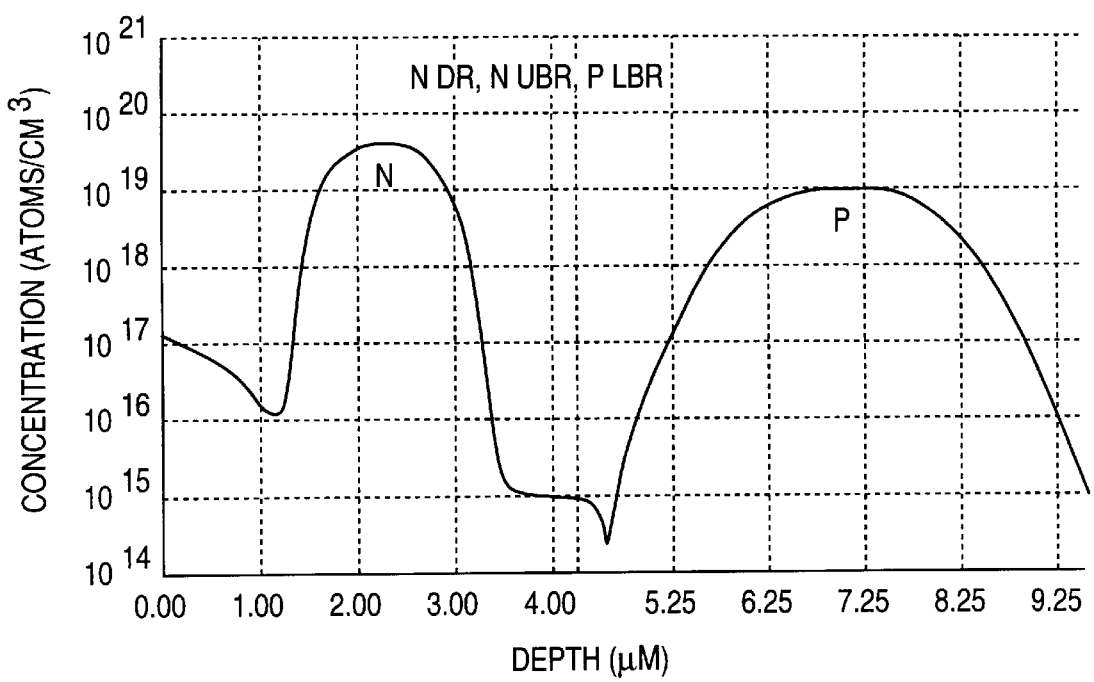
Fig. 10.2

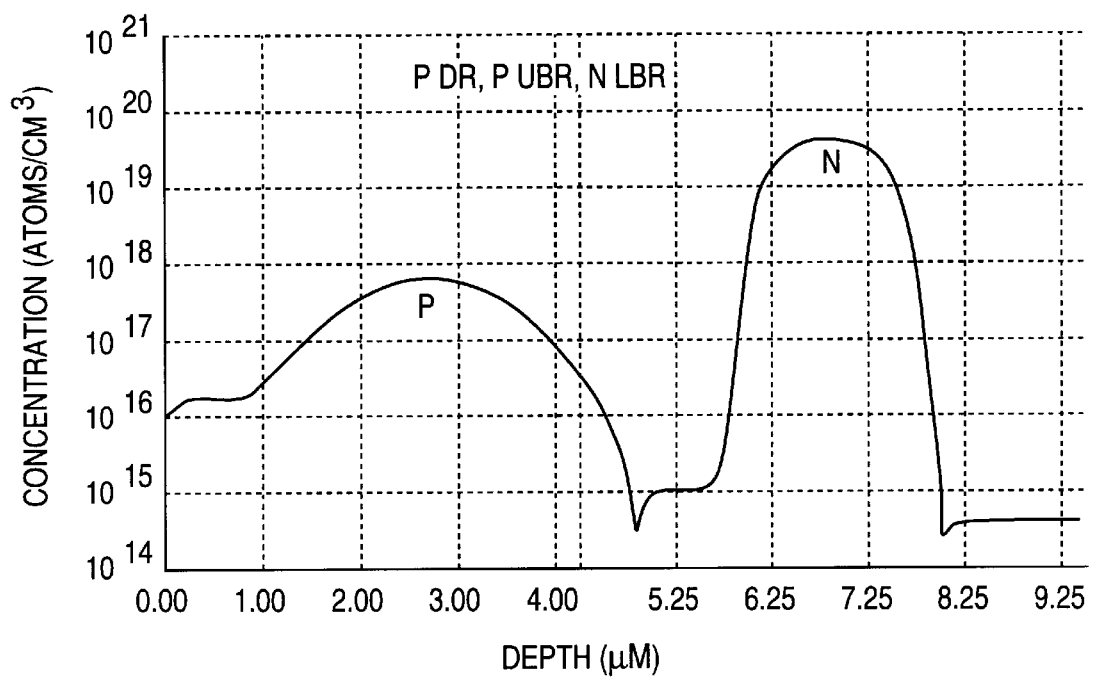
Fig. 10.3
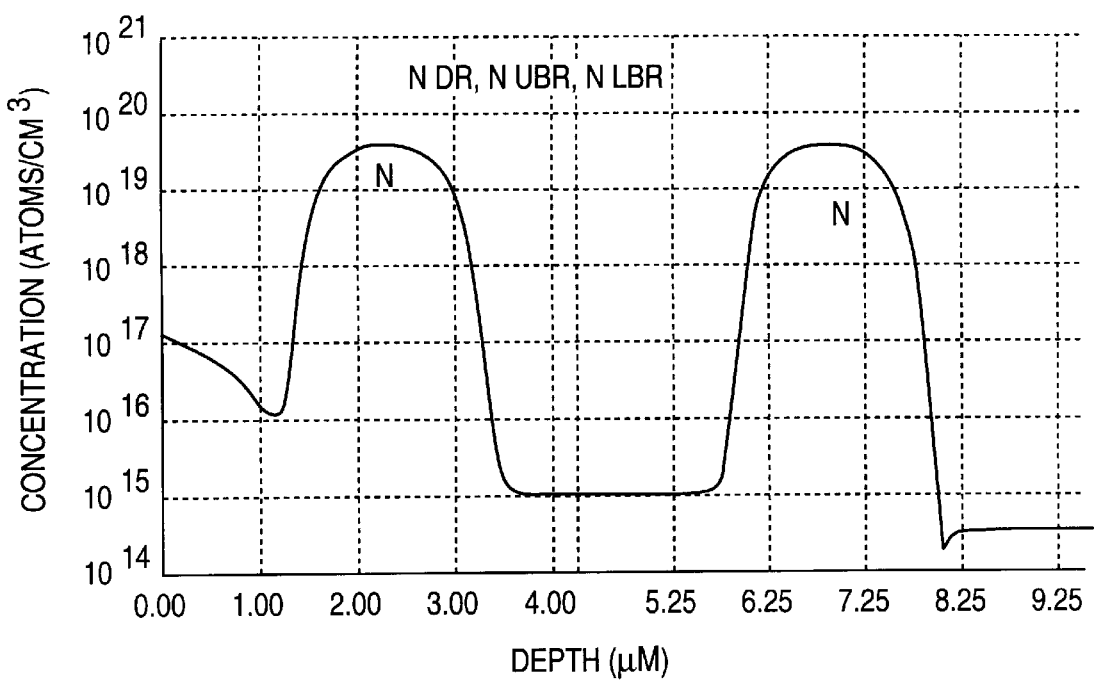
Fig. 10.4

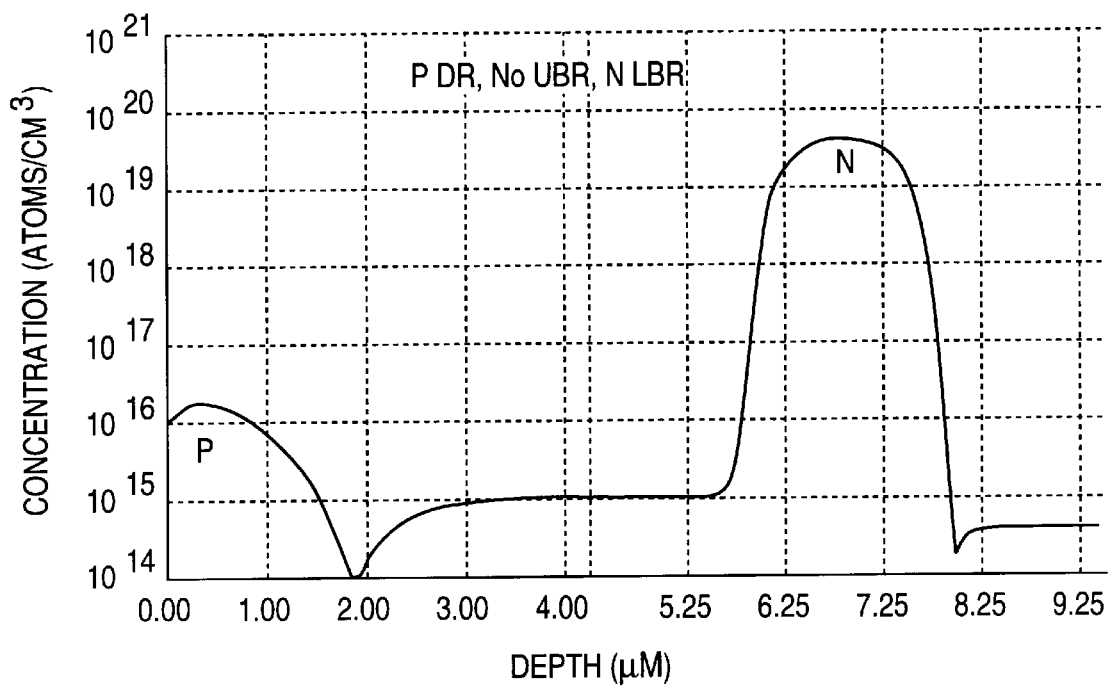
Fig. 10.5
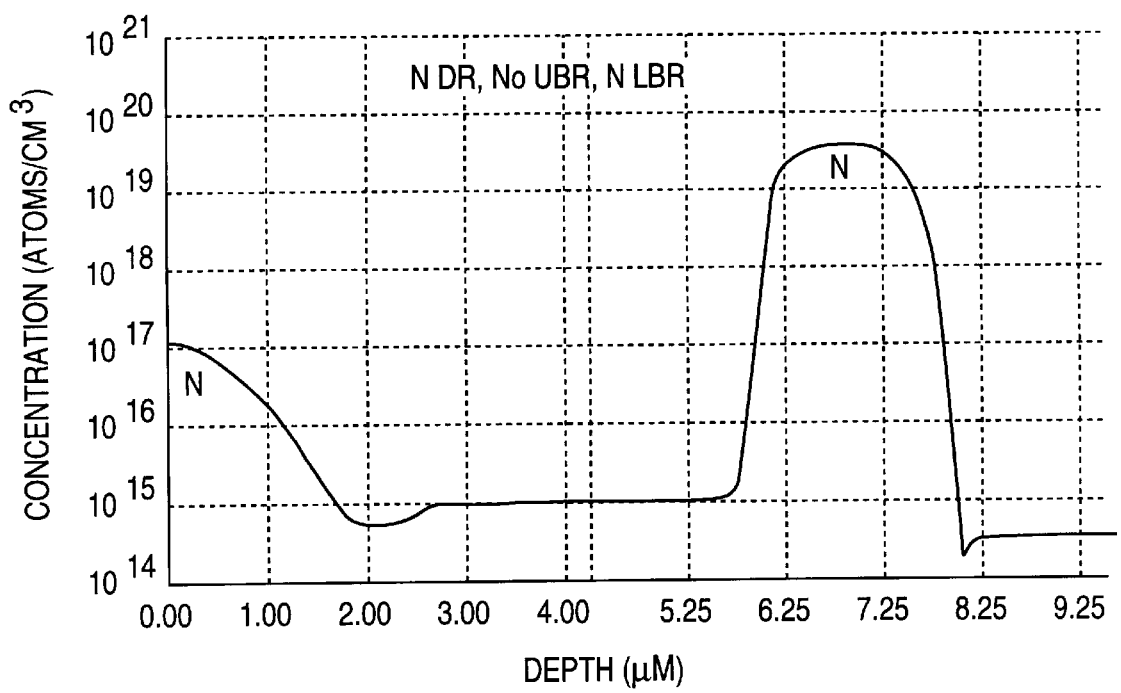
Fig. 10.6

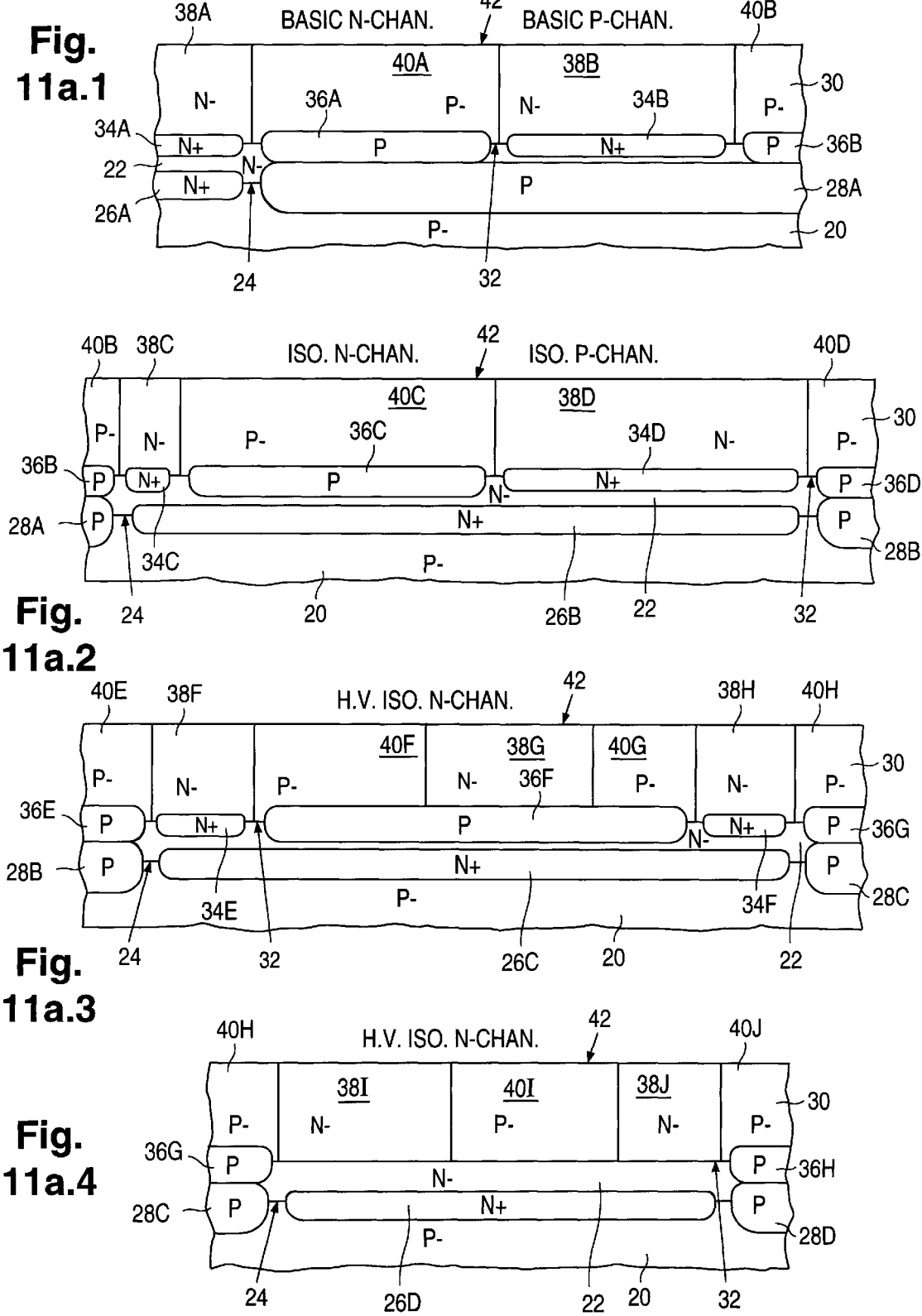

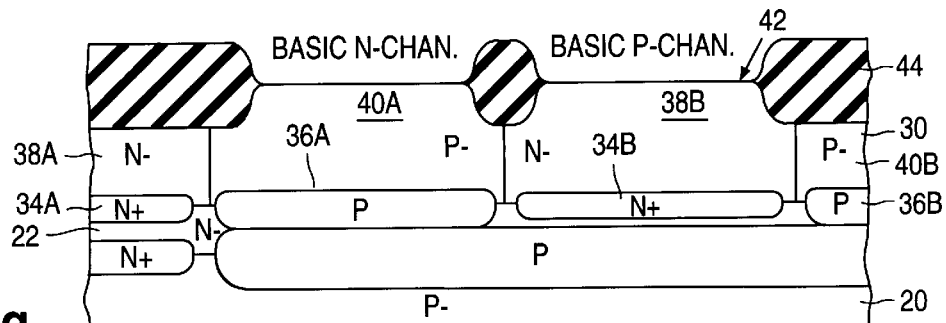
Fig. 11b.1
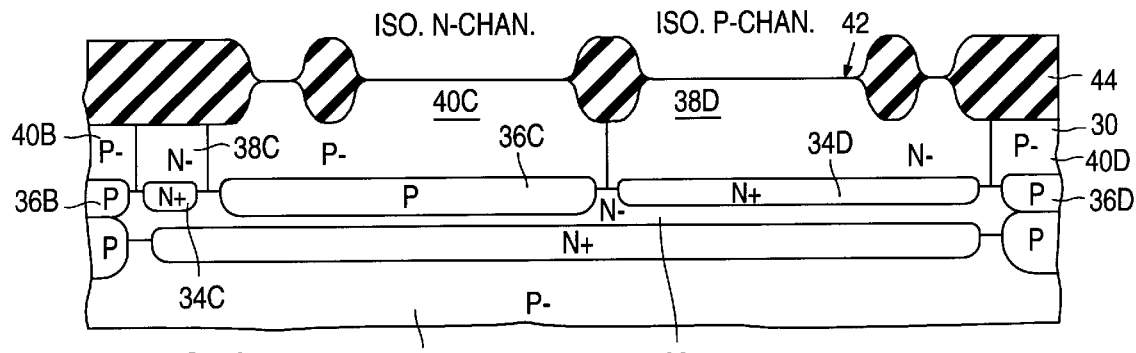
Fig. 11b.2
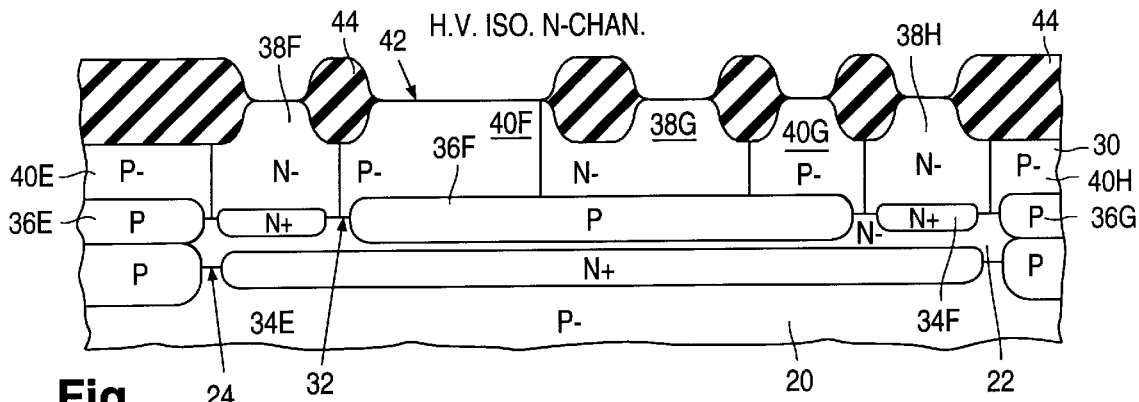
Fig. 11b.3
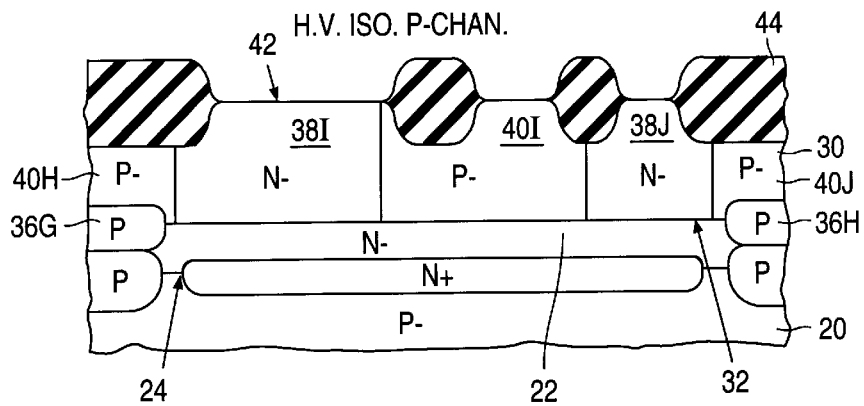
Fig. 11b.4

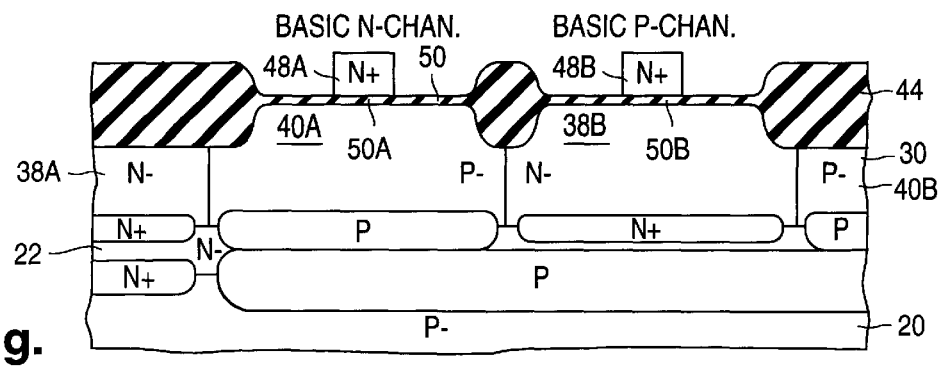
Fig. 11c.1
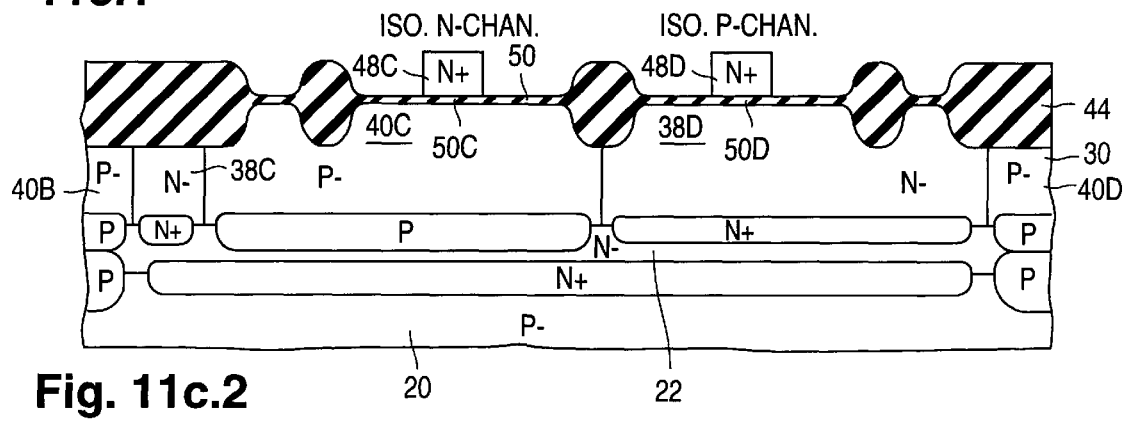
Fig. 11c.2
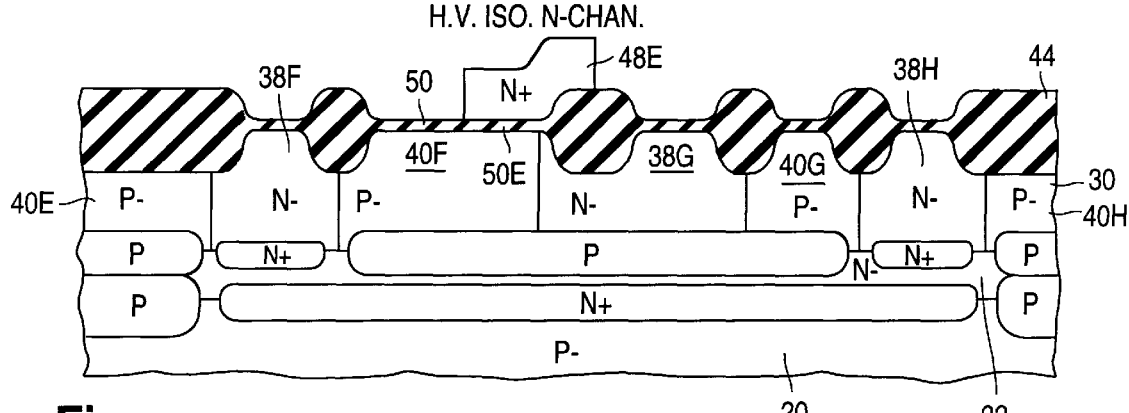
Fig. 11c.3
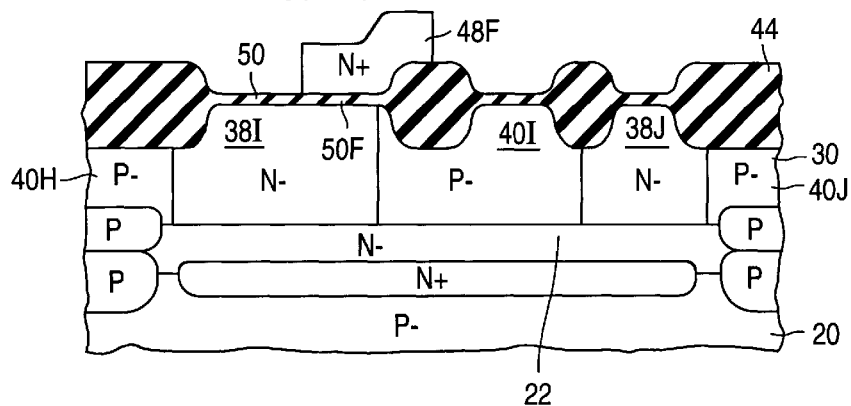
Fig. 11c.4

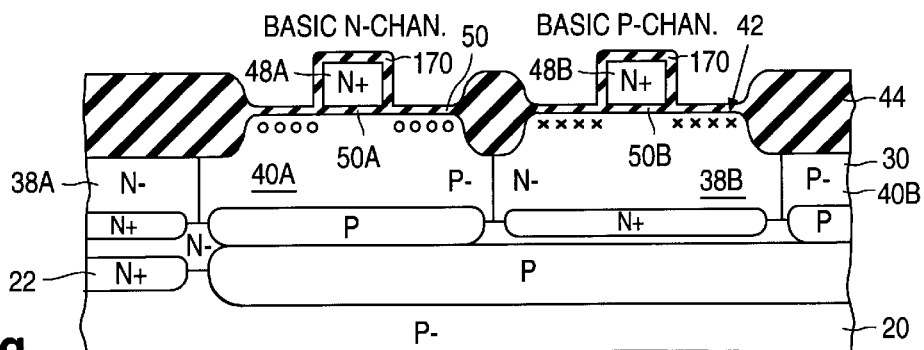
Fig. 11d.1
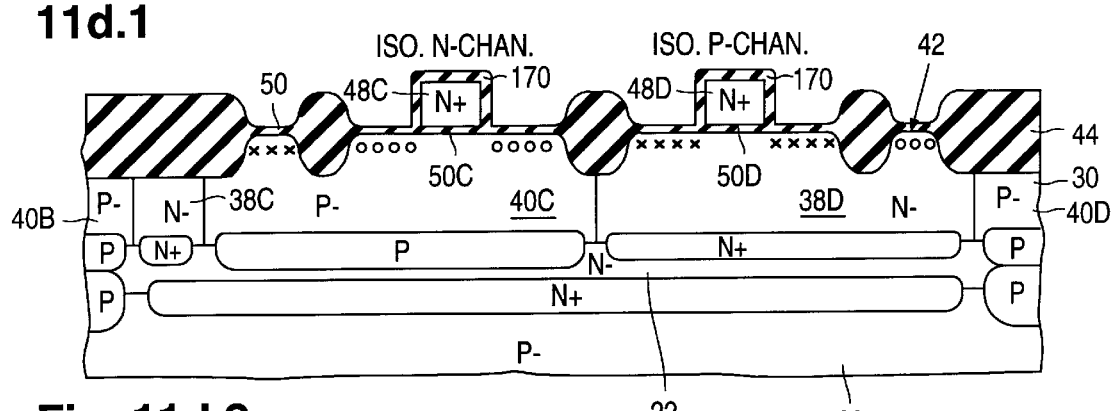
Fig. 11d.2
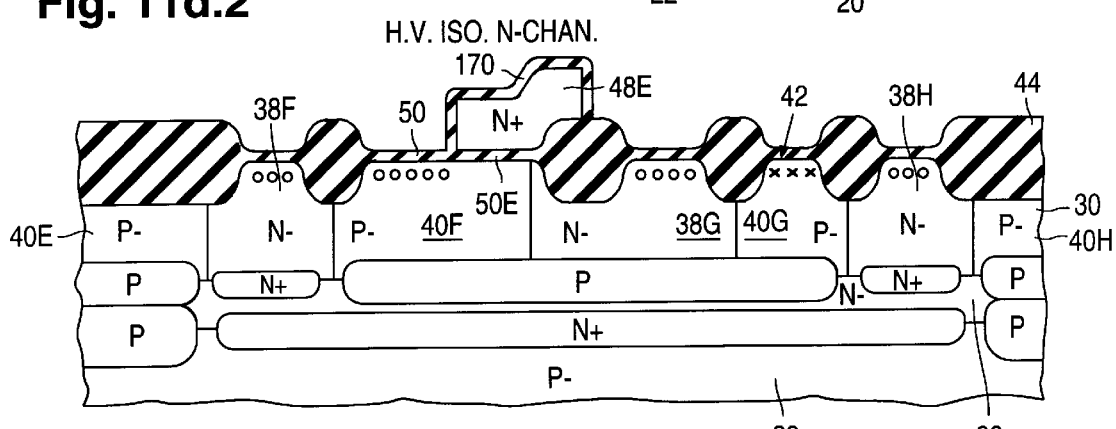
Fig. 11d.3
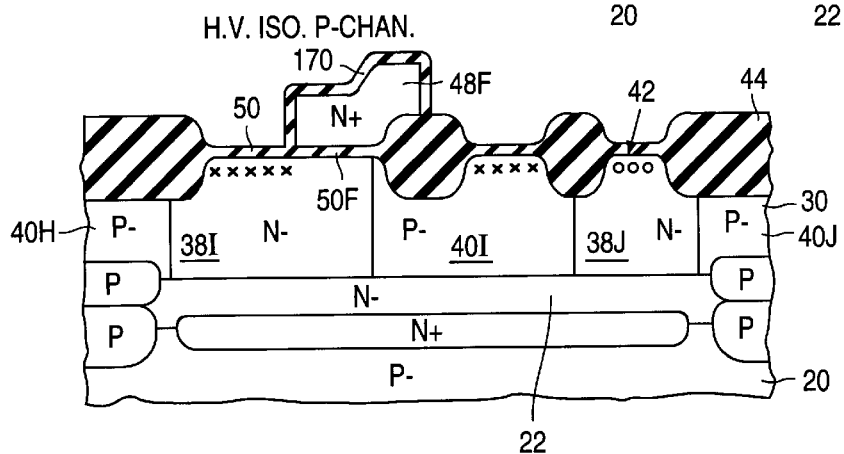
Fig. 11d.4

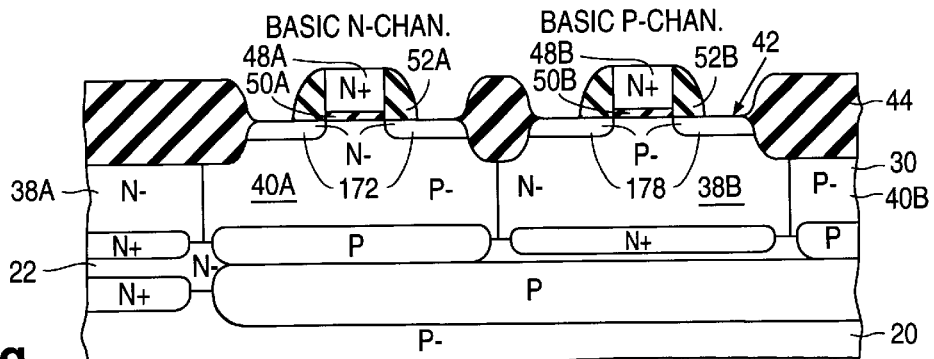
Fig. 11e.1
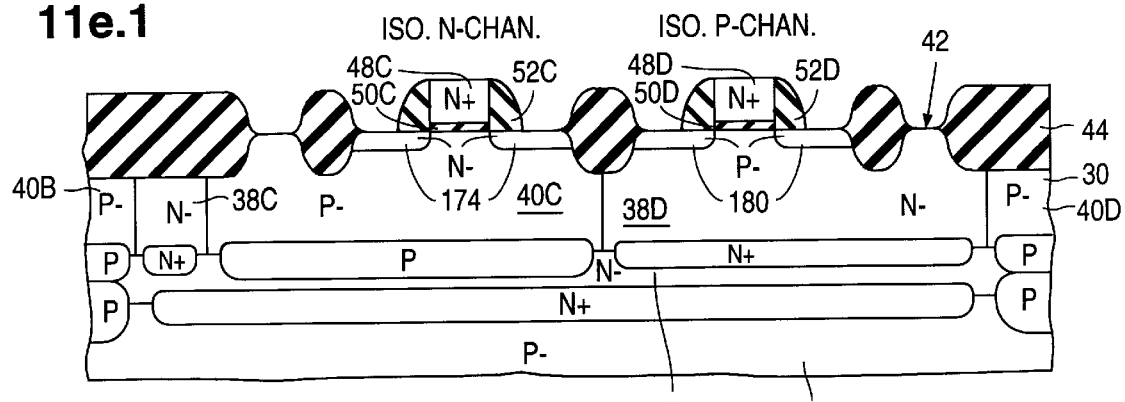
Fig. 11e.2
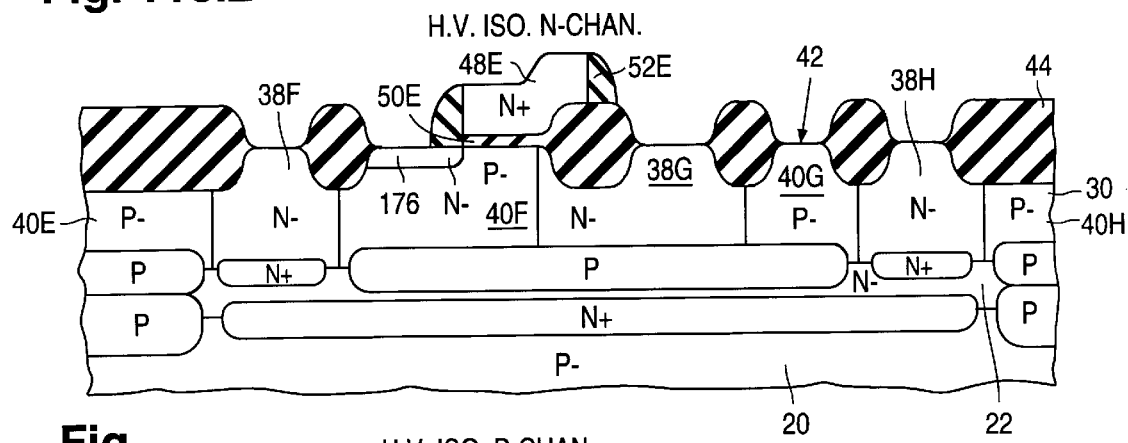
Fig. 11e.3
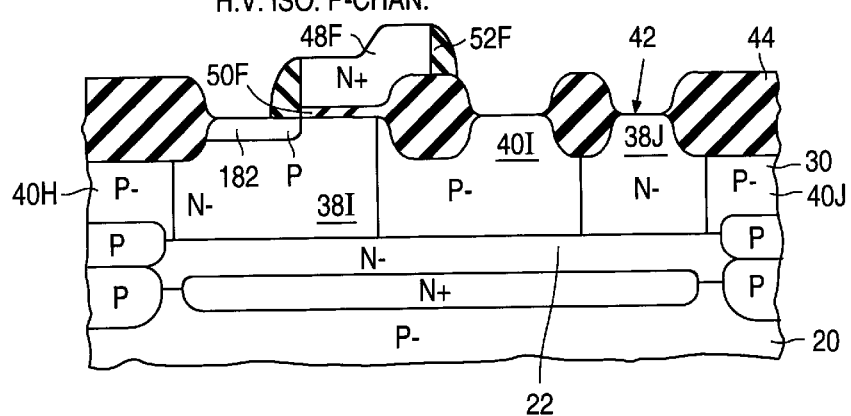
Fig. 11e.4

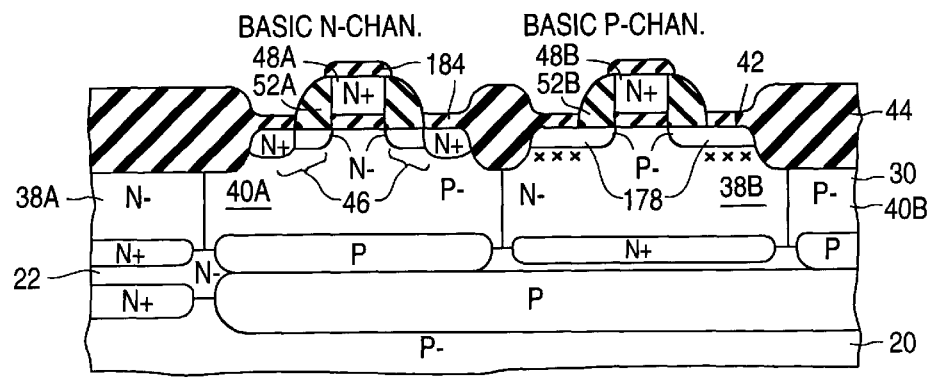
Fig. 11f.1
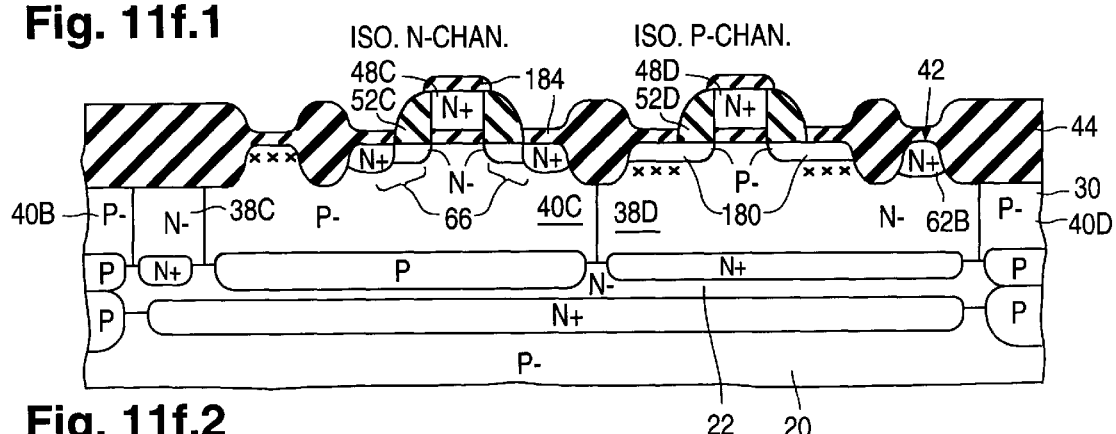
Fig. 11f.2
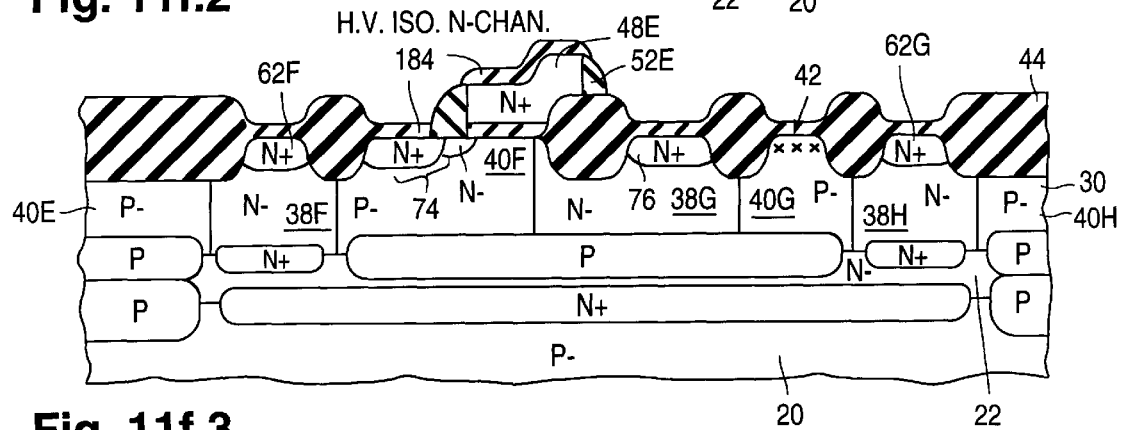
Fig. 11f.3
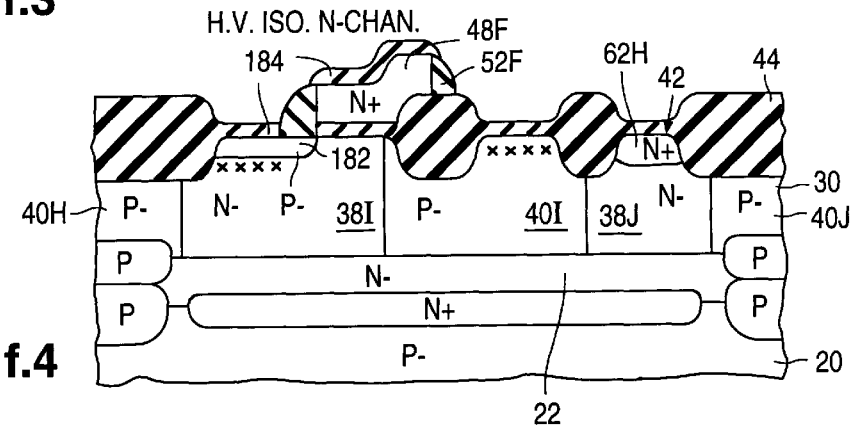
Fig. 11f.4

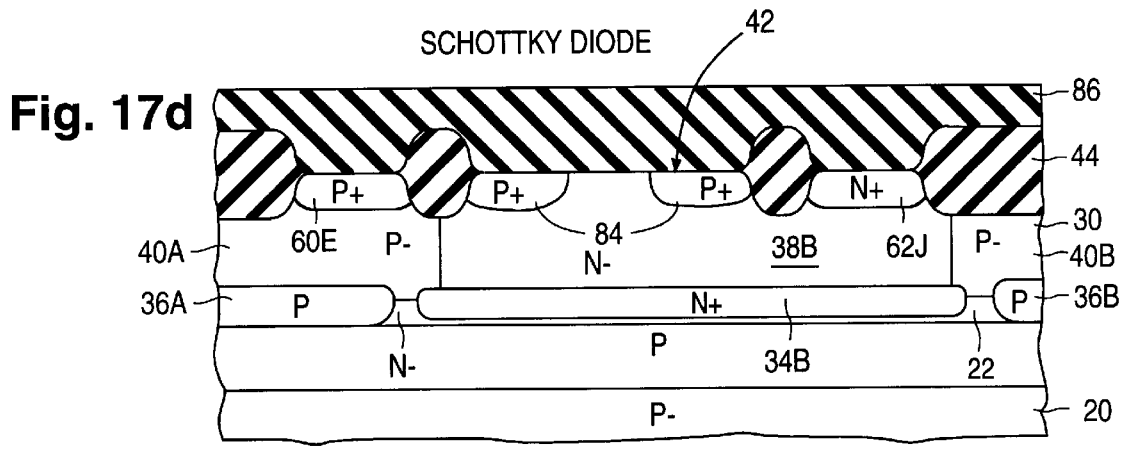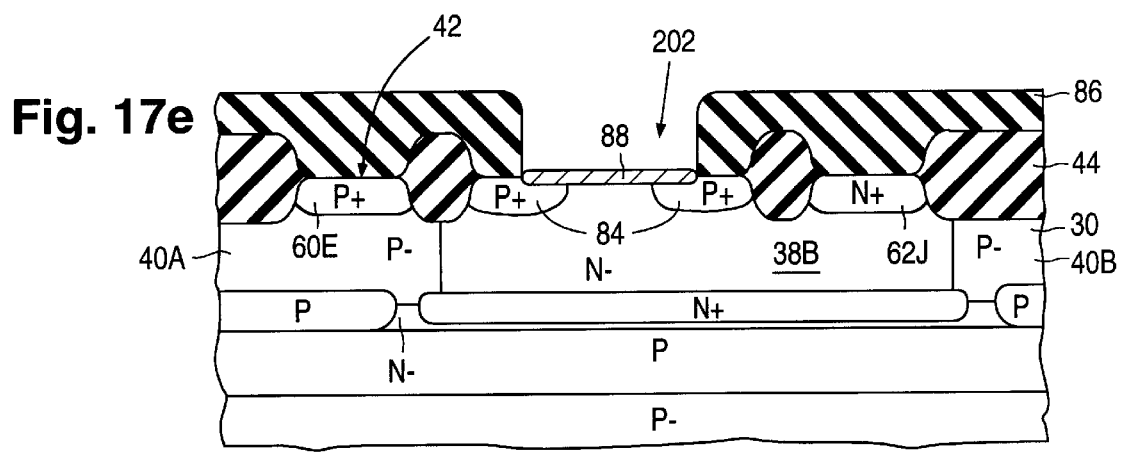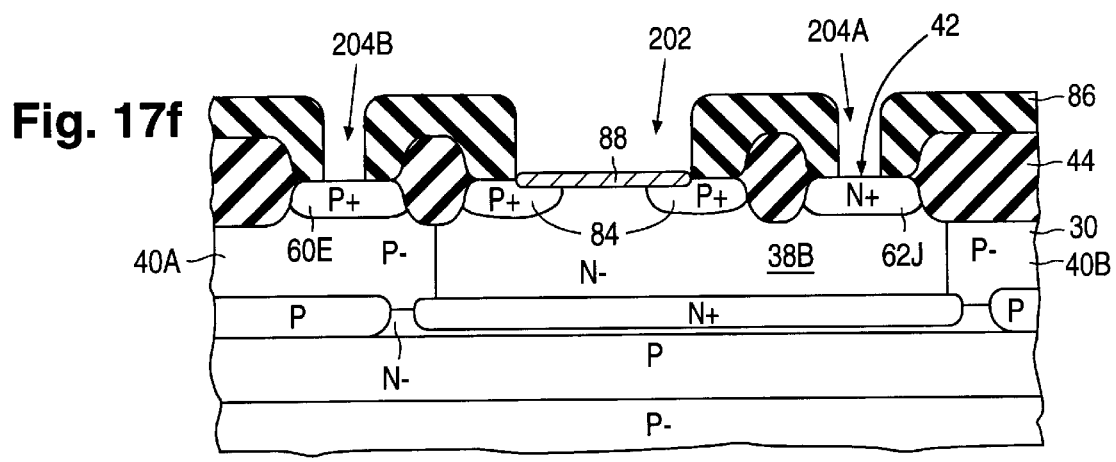

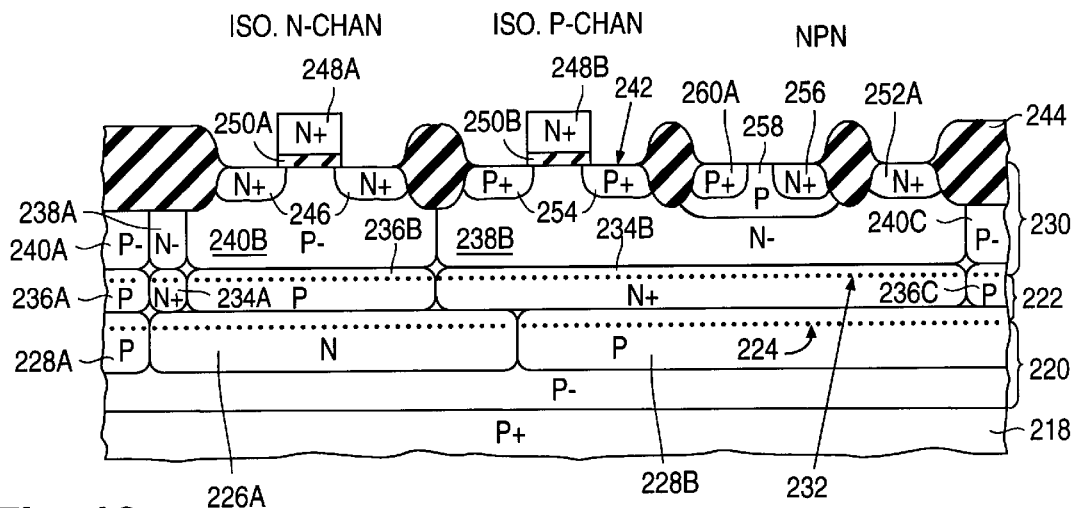
Fig. 18
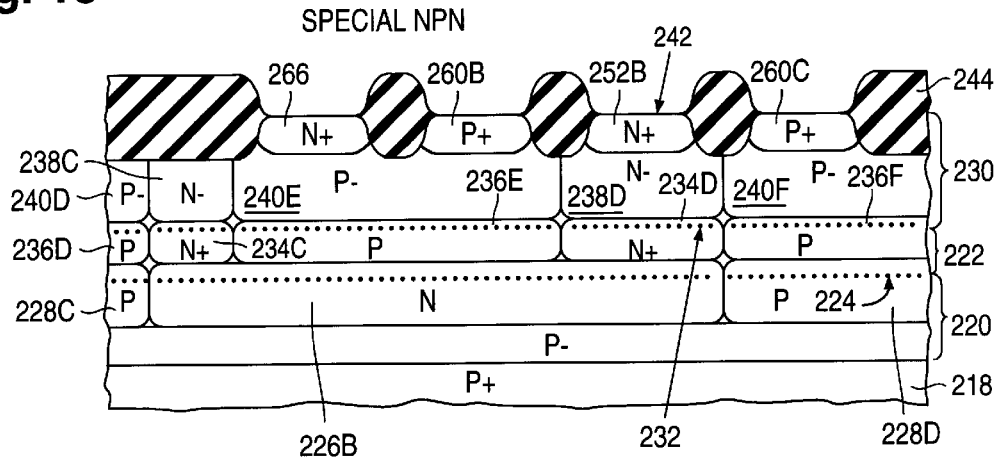
Fig. 19.1
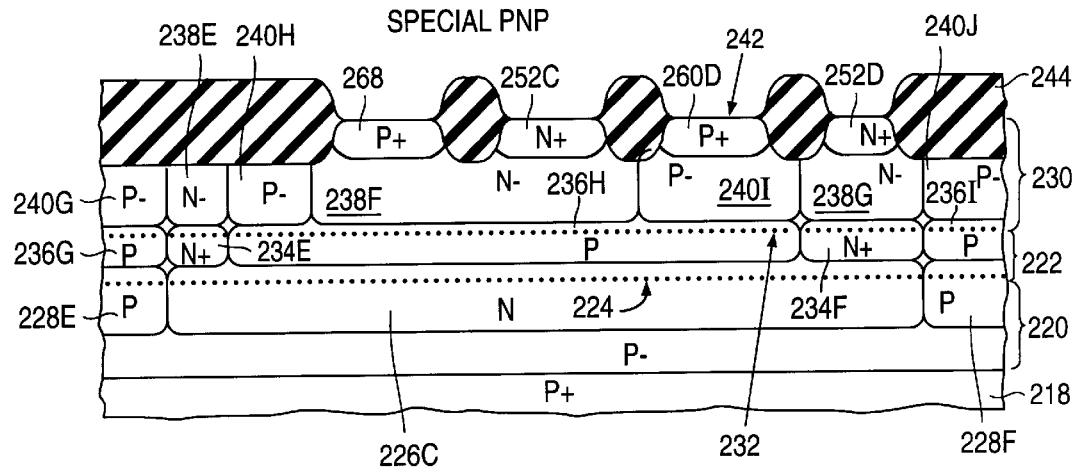
Fig. 19.2

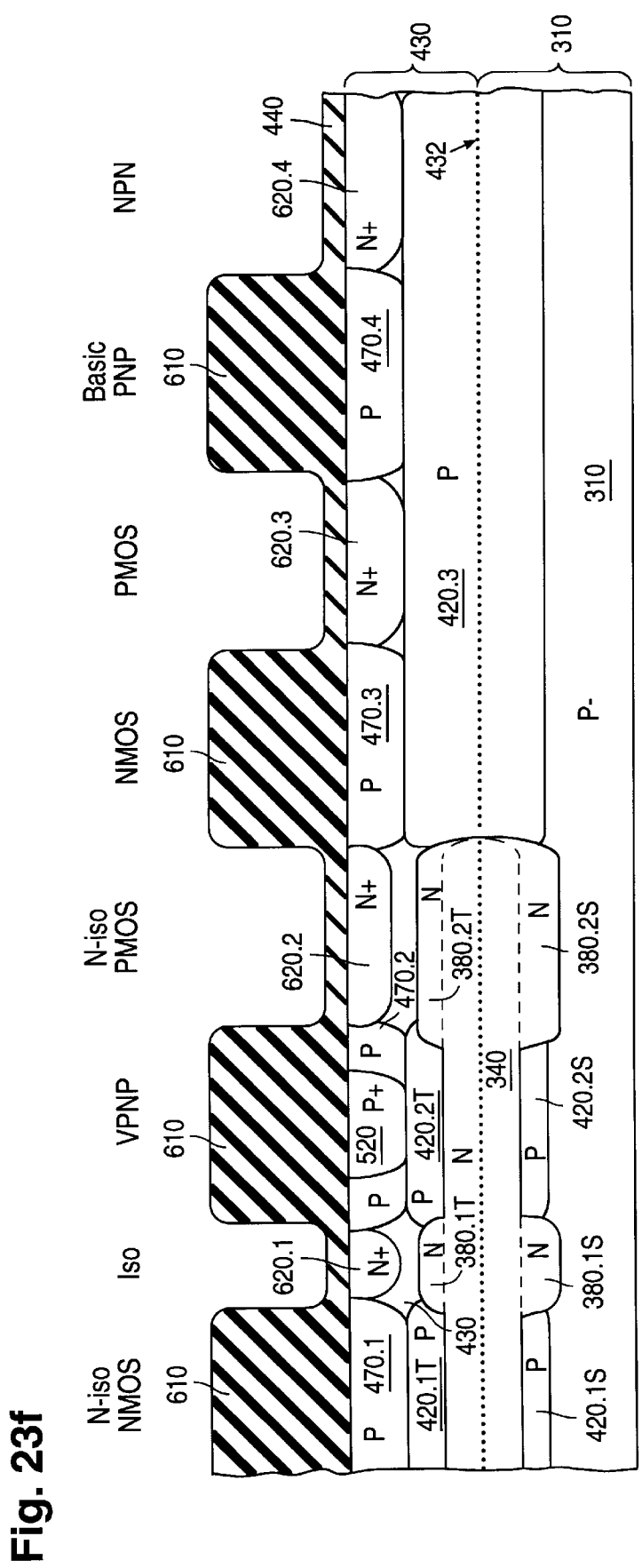

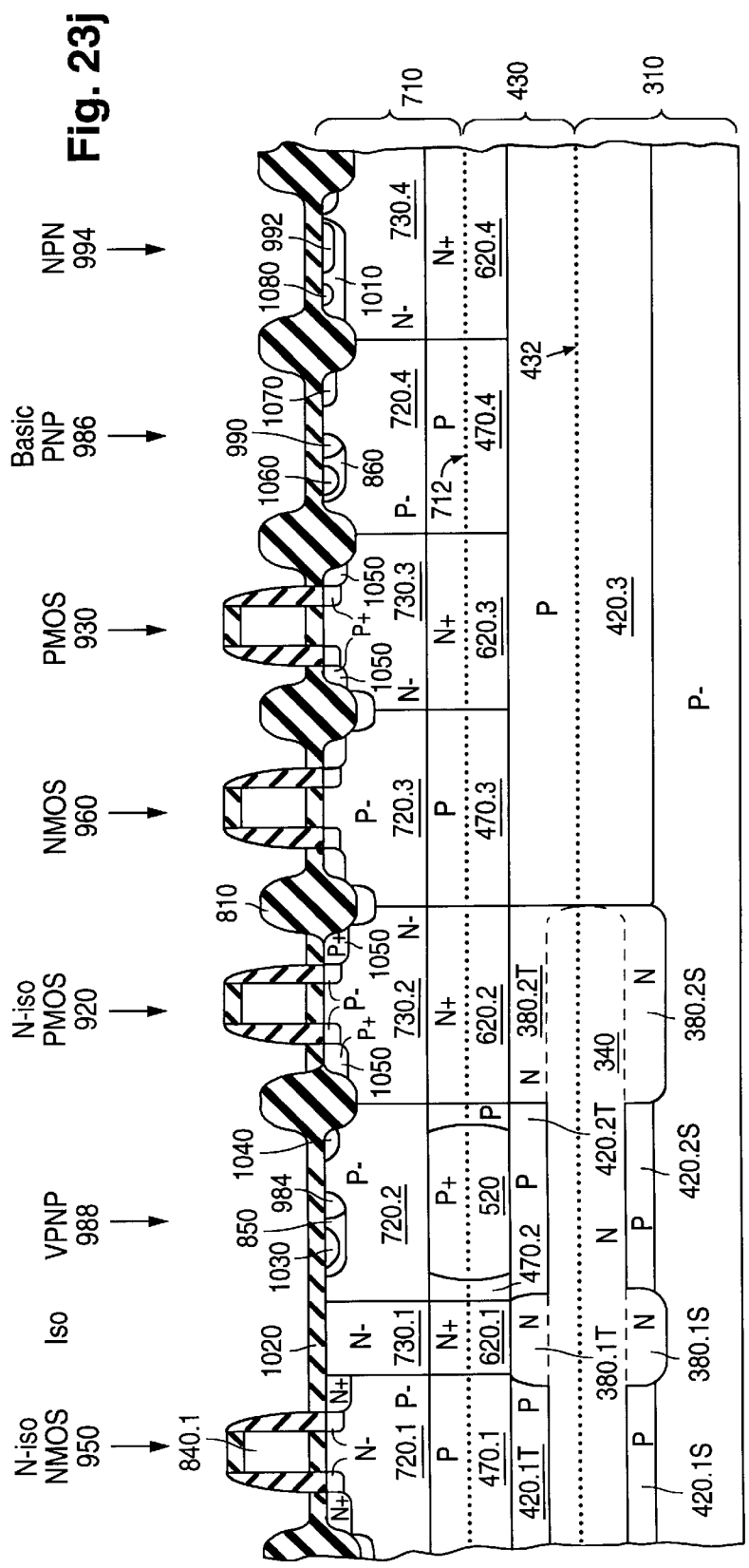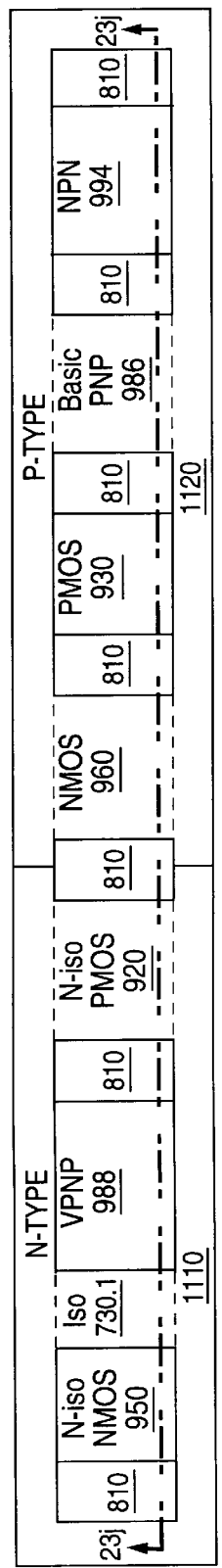

SEMICONDUCTOR STRUCTURE HAVING TWO LEVELS OF BURIED REGIONS

CROSS-REFERENCE TO RELATED APPLICATION

This is a continuation-in-part of U.S. Pat. application Ser. No. 08/292,891, filed 18 Aug. 1994, now abandoned. To the extent not repeated herein, the contents of application Ser. No. 08/292,891 are incorporated by reference herein.

FIELD OF USE

This invention relates to semiconductor structures suitable for monolithic integrated circuits. More particularly, this invention relates to the configuration and manufacture of semiconductor structures that utilize buried semiconductive regions to improve performance. This invention also relates to semiconductor structures that contain transistors of both the field-effect and bipolar type.

BACKGROUND

Semiconductor devices made according to CMOS technology employ complementary insulated-gate field-effect transistors ("FETs"). An advantage of CMOS devices is that insulated-gate FETs individually occupy relatively small chip area and, when arranged in complementary configurations, consume little power. CMOS devices commonly use a power supply voltage of 5 V, especially in digital applications.

A mixed signal integrated circuit is a semiconductor device that contains analog and digital sections. Traditional CMOS technology is generally not suitable for high-quality mixed signal devices due to crosstalk (noise) which occurs between the analog and digital sections. In crosstalk, the effect of actions taking place in one part—e.g., the digital section—of the mixed signal device is partially transmitted through the device substrate and can detrimentally affect actions taking place in another part—e.g., the analog section—of the device. Also, many mixed signal devices need to operate at voltages much greater than 5 V. Accordingly, traditional 5-V CMOS technology is not suitable for high-voltage mixed signal applications.

Bipolar transistors are often combined with FETs to improve overall performance. Bipolar transistors generally respond fast. In addition, bipolar transistors provide readily controllable current gain and high transconductance, both of which are advantageous. Integrating bipolar transistors and FETs into a single integrated circuit permits the high-speed and current-gain features of bipolar transistors to be combined with the low power consumption and high packing density of FETs.

An integrated circuit made according to BiCMOS technology typically combines NPN transistors with complementary insulated-gate FETs. Some BiCMOS devices also contain PNP transistors. In this case, BiCMOS is sometimes referred to as CBiCMOS where the first "C" indicates that complementary bipolar transistors are provided.

The performance improvements available with BiCMOS technology make it attractive for mixed signal integrated circuits, especially those used in high-voltage applications. In high-voltage BiCMOS, some of the transistors handle low-voltage tasks and are not generally suited for high-voltage operation, while other transistors are specially designed to operate at high voltage.

Kosiak et al, U.S. Pat. No. 4,918,026, discloses a method of fabricating high-voltage complementary insulated-gate FETs for a BiCMOS process. The high-voltage FETs in Kosiak et al differ from (standard) low-voltage FETs in that the drains of the high-voltage devices include lightly doped portions which extend under thick portions of the gate dielectric layers. Kosiak et al reports that their high-voltage FETs can tolerate a 30-volt source-drain voltage without incurring avalanche breakdown.

In Kosiak et al, the sources and drains of high-voltage P-channel FETs are formed in N wells provided in a P-type substrate. As a result, the high-voltage P-channel FETs are not resistively connected to the substrate. However, the sources and drains of high-voltage N-channel FETs are formed directly in the P-type substrate. Substantial crosstalk can thus occur between N-channel FETs in one part of the structure and N-channel FETs in another part of the structure.

Mosher et al, U.S. Pat. No. 5,256,582, discloses a CBiCMOS structure that utilizes three epitaxial layers: (a) a lower N-type epitaxial layer, (b) an intermediate P-type epitaxial layer, and (c) an upper N-type epitaxial layer. A P-type buried region lies along the interface between the P-type epi and the lower N-type epi. P-type and N-type buried regions lie along the interface between the upper N-type epi and the P-type epi. An N-type plug, created by implanting an N-type semiconductor dopant into the P-type epi and then thermally driving the implanted dopant, extends fully through the P-type epi to connect the two N-type epis.

Both low-voltage and high-voltage transistors are available in the CBICMOS structure of Mosher et al. However, it takes 10 hours for Mosher et to drive the N-type plug through the P-type epi. This is a very long time for a commercial fabrication process. It is desirable to have a semiconductor technology which substantially avoids crosstalk, can handle both low-voltage and high-voltage operations, and is suitable for production-scale fabrication.

In addition, a semiconductor technology that combines different types of transistors is difficult to optimize for all the transistors. For example, an integrated circuit having only vertical NPN transistors can be fabricated on a P-doped substrate that helps isolate the NPN transistors from each other. Likewise, an N-type substrate can be conveniently used to achieve transistor isolation in a circuit having only vertical PNP transistors. However, in a circuit that integrates both NPN and PNP transistors, neither a P-type nor an N-type substrate will provide isolation for all the transistors. Further isolation is necessary.

Additional doped regions can be used to provide further PN-junction isolation. But, the capacitances associated with the additional PN junctions reduce transistor speed. Thus, there is also a need for a semiconductor technology which allows NPN and PNP transistors to be integrated with each other and with their FET counterparts, is not highly complex, and provides low capacitances and high transistor speeds while allowing transistors to be isolated from one another.

GENERAL DISCLOSURE OF THE INVENTION

The present invention furnishes a semiconductor structure particularly suitable for mixed signal and high-voltage applications as well as low-voltage tasks. The semiconductor structure of the invention contains two levels of buried regions provided along internal semiconductor interfaces. The lower level is formed with both N-type and P-type buried regions. The two levels of buried regions are employed so as to substantially reduce crosstalk between different parts of the structure, especially between analog and digital sections. The buried regions are also utilized to provide high resistance to latchup and snapback. Capacitances can be held to low values so as to achieve high device switching speed.

Various types of transistors and other semiconductor elements can be created from the present structure. For example, complementary FETs suitable for low-voltage operation are normally provided. Complementary FETs capable of high-voltage operation can be furnished in the structure. Both NPN and PNP transistors are also available. In addition, capacitors and floating-gate FETs suitable for EPROM cells of the ultraviolet and electrically erasable type can be created from the structure.

The present semiconductor structure contains P-type and N-type device regions, sometimes termed wells, provided above a semiconductive substrate. The structure is normally configured so that certain device regions of both conductivity types are electrically isolated from—i.e., not resistively connected to—the substrate. As a result, N-channel and P-channel FETs created from these device regions are electrically isolated from the substrate. This isolation feature is available with both low-voltage and high-voltage FETs. Due to the isolation, crosstalk between isolated FETs in different sections of the structure is reduced to a low level.

More particularly, in one aspect of the structure of the invention, a lower semiconductive layer overlies the substrate. A pair of lower buried regions of opposite conductivity types lie along the interface between the lower semiconductive layer and the substrate. Each of the lower buried regions extends partway through the substrate and partway through the lower semiconductive layer.

An upper semiconductive layer overlies the lower semiconductive layer. An upper buried region is situated along the interface between the two semiconductive layers. The upper buried region extends partway through the lower semiconductive layer and partway through the upper semiconductive layer. The conductivity type of the upper buried region may be the same as that of either lower buried region, depending on the particular embodiment desired.

An additional upper buried region of opposite conductivity type to the first-mentioned upper buried region is preferably situated along the interface between the two semiconductive layers. As with the first-mentioned upper buried region, the additional upper buried region extends partway through each of the semiconductive layers. In short, there can be four different types of buried regions: an N-type lower buried region, a P-type lower buried region, an N-type upper buried region, and a P-type upper buried region.

The P-type and N-type device regions are situated in the upper semiconductive layer. Transistor zones, such as source/drain zones for FETs and emitter, base, and collector zones for bipolar transistors, are situated in the device regions.

The locations of the buried regions and the device regions are preferably arranged so that at least one of each of the P-type and N-type device regions is electrically isolated from the substrate. In particular, consider the case in which the substrate contains a major substrate region of a first conductivity type (for example, P-type). With appropriate voltages applied to the structure, a device region of an opposite second conductivity type (N-type in this parenthetical example) is automatically isolated from the substrate region because the device and substrate regions are of opposite conductivity types.

Next, consider a device region of the first conductivity type (exemplary P-type) situated in the upper semiconductive layer and overlying the lower buried region of the second conductivity type (exemplary N-type). At least one such device region of the first conductivity type is surrounded within the semiconductive material by a tub of the second conductivity type formed at least with the and lower buried region of the second conductivity type and a device region of the second conductivity type. Since the tub (exemplary N-type) is of opposite conductivity type to the substrate region (exemplary P-type), the tub of the second conductivity type laterally and vertically isolates the device region of the first conductivity type from the substrate region.

The tub of the second conductivity type is normally used for isolating an FET, typically an N-channel device, whose source/drain zones are situated in the so-surrounded device region of the first conductivity type. The surrounded device region extends through the upper semiconductive layer to meet the upper buried region of the first conductivity type. The sheet resistance of the upper buried region of the first conductivity type is preferably no more than 1000 ohms/sq. This sheet-resistance value is sufficiently low to provide the isolated FET with good resistance to latchup and snapback. Also, the lower buried region of the second conductivity type contained in the isolating tub preferably has a sheet resistance of no more than 200 ohms/sq. This low sheet-resistance value enables crosstalk to be reduced to a low level and provides the isolated FET with further latchup resistance.

In manufacturing the preceding structure, first and second semiconductor dopants of opposite conductivity types are selectively introduced into the substrate. The lower semiconductive layer is then provided over the substrate such that (a) the lower semiconductive layer adjoins the substrate and (b) the two dopants respectively form the two lower buried regions along the substrate/semiconductor layer interface. A third semiconductor dopant is then selectively introduced into the lower semiconductive layer. The upper semiconductive layer is subsequently provided over the lower semiconductive layer such that the semiconductive layers adjoin each other, and the third dopant forms one of the upper buried regions along the inter-layer interface.

To form an additional upper buried region of opposite conductivity type to the first-mentioned upper buried region, suitable fourth semiconductor dopant is selectively introduced into the lower semiconductive layer. When the upper semiconductive layer is provided over the lower semiconductive layer, the additional upper buried region forms along the inter-layer interface. The buried-region dopants are typically introduced into the substrate and lower semiconductive in such a manner that the buried regions on each level are spaced laterally apart from one another.

The P-type and N-type device regions are subsequently furnished by selectively introducing appropriate further semiconductor dopant(s) into the upper semiconductive layer. The transistor zones are created by selectively introducing appropriate semiconductor dopants into the device regions. This part of the manufacturing process can be performed with fabrication techniques of conventional type.

An important feature of the invention is a special vertical bipolar transistor that can be fabricated without a separate base-dopant masking step. The special bipolar transistor has an emitter situated in a device region along the upper semiconductor surface. The transistor's base includes the portion of the device region outside the emitter. The transistor can be a PNP or NPN device regardless of the actual conductivity type of the underlying substrate region. In either case, the transistor is isolated from the substrate region. Because the base is formed with the device-region material outside the emitter, a separate base masking step is not needed for doping the base. A masking step is thereby saved in fabricating the transistor.

Another important feature of the invention is a bipolar transistor which is vertically isolated from an underlying major region of the first conductivity type by way of a path through a capacitance-lowering region. A vertical isolation region of the second conductivity type overlies the major region of the first conductivity type and provides the vertical isolation for the transistor. The capacitance-lowering region consists of a buffer region of the first conductivity type overlying the vertical isolation region. The transistor has a main collector zone whose conductivity type is the same as that of the buffer region—i.e., the first conductivity type. The main collector zone overlies and meets the buffer region.

The buffer region has a lower net peak dopant concentration than the main collector zone. In addition, along the location where the main collector zone meets the buffer region, the net dopant concentration of the buffer region has a different vertical gradient than the main collector zone. The net result is that the buffer region reduces the capacitance between the collector zone and the underlying vertical isolation region. This enables the transistor to switch faster.

In a typical implementation, a lateral isolation region of the second conductivity type laterally surrounds the transistor. The vertical and lateral isolation regions meet so as to provide the transistor with junction isolation laterally and from below. The main collector zone of the transistor is preferably separated from the lateral isolation region by a more lightly doped further collector zone of the first conductivity type. This reduces the collector-to-isolation capacitance even further.

In accordance with the invention, fabrication of a semiconductive structure that contains the preceding bipolar transistor begins with a semiconductor substrate containing the major region of the first conductivity type. First semiconductor dopant of the second conductivity type is introduced into the major region to define the vertical isolation region. Second semiconductor dopant is introduced into the major region to define a first lateral isolation region of the second conductivity type continuous with the vertical isolation region. The second dopant has a greater diffusivity than the first dopant.

A transistor is now formed in a semiconductive layer formed over the major region. During formation of the semiconductive layer and the transistor, part of each of the first and second dopants diffuses into the semiconductive layer. Since the second dopant has a higher diffusivity than the first dopant, the second dopant diffuses further into the semiconductive layer than the first dopant. Consequently, the first lateral isolation region diffuses into the semiconductive layer to provide at least partial lateral junction isolation for the transistor. The vertical isolation region diffuses into the semiconductive layer to at least partially isolate the transistor from first-conductivity-type material of the major region.

The semiconductive layer is normally furnished with an additional lateral isolation region of the second conductivity type. The additional lateral isolation region meets the first lateral isolation region in such a manner that the vertical and two lateral isolation regions fully isolate the transistor from the major region. In a typical case, the semiconductive layer is created by forming a lower semiconductive layer and then forming an upper semiconductive layer over the lower layer. The additional isolation region is then formed with second and third lateral isolation regions provided respectively in the lower and upper layers.

When the transistor formed in the structure is the bipolar transistor whose main collector zone meets the buffer region, the following procedure is preferably employed to create the buffer region. Prior to forming the semiconductive layer, a semiconductor dopant of the first conductivity type is introduced into the major region to define a more heavily doped region of the first conductivity type laterally encircled by the lower isolation region. During formation of the semiconductive layer and the transistor, part of the dopant of the first conductivity type diffuses into the semiconductive layer. In particular, the dopant of the first conductivity type diffuses further into the semiconductive layer than the first dopant of the second conductivity type. The buffer region is thereby created by diffusion of the more heavily doped region into the semiconductive layer.

In short, the present invention utilizes two levels of buried regions to provide electrical isolation that substantially reduces crosstalk between different parts of the structure. This makes the structure particularly attractive for mixed signal applications. Both low-voltage and high-voltage transistors are available. Fabrication of the structure in this aspect of the invention is straightforward. After the buried regions are defined according to the principles of the invention, conventional fabrication techniques can be employed to form transistor zones in the upper semiconductive layer. Accordingly, commercial semiconductor fabrications processes currently in use can readily be modified to incorporate the features of the invention. The invention thus provides a large advance over the prior art.

BRIEF DESCRIPTION OF THE DRAWINGS

FIGS. 1.1 and 1.2 are cross-sectional views of two sections of a semiconductor structure in accordance with the invention.

FIGS. 2.1–2.8 are cross-sectional views of implementations of he structure of FIGS. 1.1 and 1.2. FIG. 2.1 illustrates a structural portion for a pair of basic low-voltage complementary FETs. FIG. 2.2 depicts a structural portion for an NPN transistor. FIG. 2.3 illustrates a structural portion for a pair of isolated low-voltage complementary FETs. FIG. 2.4 depicts a structural portion for a PNP transistor. FIGS. 2.5 and 2.6 illustrate structural portions for a pair of isolated high-voltage complementary FETs. FIG. 2.7 depicts a structural portion for a polysilicon capacitor. FIG. 2.8 illustrates a structural portion for a Schottky diode.

FIG. 3 is a top view below field oxide of the isolated complementary FETs of FIG. 2.3. The cross-section of FIG. 2.3 is taken through plane 2.3—2.3 in FIG. 3.

FIGS. 4.1 and 4.2 are layout views of isolated P-type wells containing N-channel FETs.

FIGS. 9a–9f and 9g.1–9n.2 are cross-sectional structure views representing stages in manufacturing the structure of FIGS. 1.1 and 1.2. Each pair of FIGS. 9g.1 and 9g.2, 9h.1 and 9h.2, 9i.1 and 9i.2, 9j.1 and 9j.2, 9k.1 and 9k.2, 91.1 and 91.2, 9m.1 and 9m.2 and 9n.1 and 9n.2 illustrates two sections of the structure at one stage of the process.

FIGS. 10.1–10.6 are graphs of dopant concentration as a function of depth at various locations for an embodiment of the structure of FIG. 1 as fabricated according to the process of FIGS. 9a–9n.2.

FIGS. 11a.1–11f.4 are cross-sectional structural views representing stages in fabricating the FETs of FIGS. 2.1, 2.3, 2.5, and 2.6 starting from structural portions of the type illustrated in FIGS. 1.1 and 1.2. Each tetrad of FIGS. 11a.1–11a.4, 11b.114 11b.4, 11c.1–11c.4, 11d.1–11d.4, 11e.1–11e.4, and 11f.1 –11f.4 illustrates four sections of the structure at one stage in the fabrication process.

FIGS. 7a–17f are cross-sectional structural views representing stages in fabricating the Schottky diode of FIG. 2.8.

FIG. 18 is a cross-sectional view of a variation of the semiconductor structure of FIGS. 1.1, 2.2, and 2.3 in accordance with the invention.

FIGS. 19.1 and 19.2 are cross-sectional views of two sections of a variation of the semiconductor structure of FIGS. 1.1, 2.2, and 2.4 in accordance with the invention.

FIGS. 23a–23j are cross-sectional structural views representing stages in manufacturing another semiconductor structure in accordance with the invention.

FIG. 24 is a top view below field oxide of the transistors of FIG. 23j. The cross section of FIG. 23j is taken through plane 23j—23j in FIG. 24.

Figure 5:
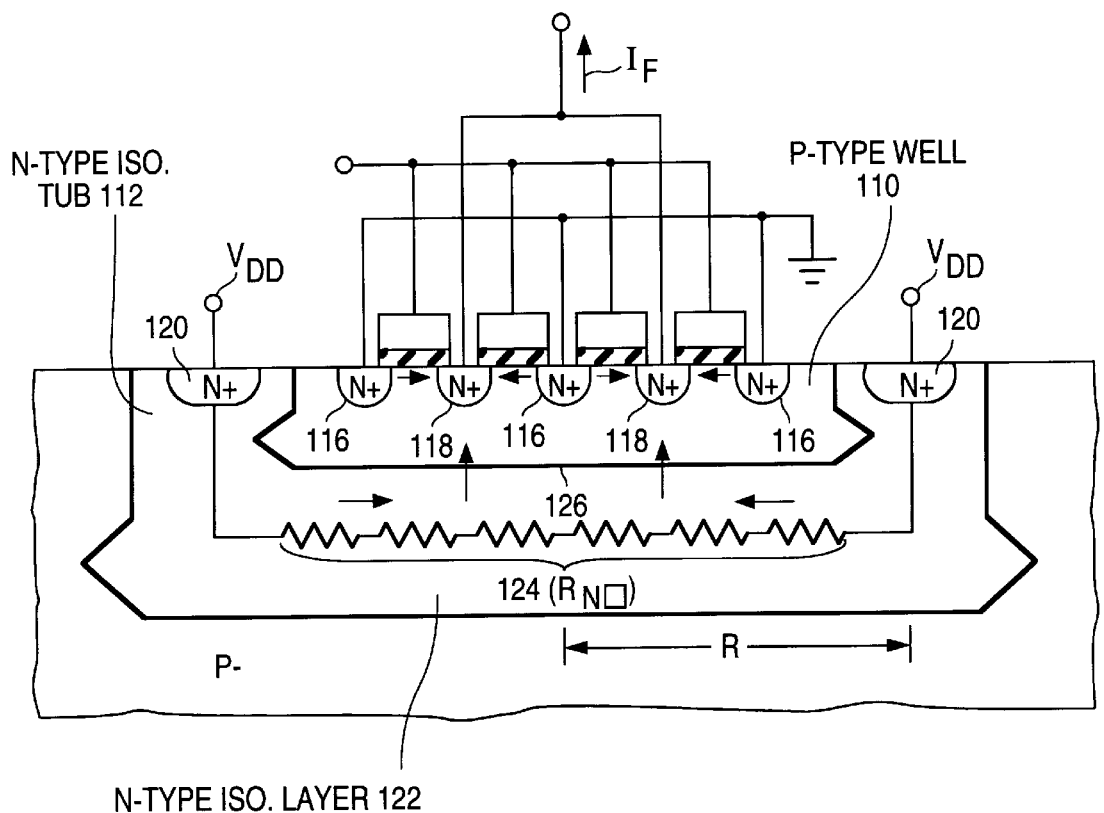
FIG. 5 is a simplified cross-sectional view of an N-channel FET created from a P-type well enclosed by an N-type isolation tub according to the invention.

Like reference symbols are employed in the drawings and in the description of the preferred embodiments to represent the same or very similar item or items. The "N*" and "P*" notations applied to arrows indicating ion implantation in the fabrication drawings respectively mean N-type and P-type dopants.

The dotted lines which indicate metallurgical interfaces between semiconductive substrates and overlying epitaxial-grown semiconductive material are presented for illustrative purposes in the drawings since such internal semiconductor interfaces are often not physically discernible.

DESCRIPTION OF THE PREFERRED EMBODIMENTS

1. General Two-Level Buried-Layer Configuration

Referring to the drawings, FIGS. 1.1 and 1.2 (collectively "FIG. 1") illustrate two sections of a general embodiment of a semiconductor structure provided with two levels of buried regions for achieving vertical electrical isolation in accordance with the teachings of the invention. The two structural sections shown in FIG. 1 may be laterally separated, or may adjoin each other, for example, along the right-hand side of FIG. 1.1 and the left-hand side of FIG. 1.2. FIG. 1 does not illustrate any transistor or capacitor zones. The incorporation of zones for active and passive semiconductor elements into the structure of FIG. 1 is depicted in later figures. The purpose of FIG. 1 is to illustrate the general nature of the two-level buried-region configuration.

The starting point for the structure of FIG. 1 is a lightly doped major P-type region 20 of a monocrystalline silicon semiconductive substrate. P– substrate region 20, which extends to the upper substrate surface, may consist of substantially the entire substrate. Alternatively, the substrate may include a heavily doped P-type substructure that underlies substrate region 20. The resistivity of substrate region 20 is 5–50 ohm-cm, typically 20 ohm-cm.

A lightly doped lower N-type epitaxial silicon layer 22 is situated on P– substrate region 20 along a lower semiconductor interface 24. Lower N– epitaxial layer 22 has a resistivity of 1–30 ohm-cm, typically 20 ohm-cm. The thickness of lower epitaxial layer 22 is 1–8 $\mu$m, typically 5 $\mu$m.

A heavily doped N-type lower buried layer consisting of N+ regions 26A–26D (collectively "26") is situated along lower semiconductor interface 24. Each N+ lower buried region 26 extends partway into both substrate region 20 and lower epitaxial layer 22. Although labeled with reference symbols that end with different letters, certain of lower buried regions 26 may be continuous with one another outside the plane of FIG. 1. Each lower buried region 26 has a greater net N-type dopant concentration than epitaxial layer 22. N+ lower buried regions 26 have a sheet resistance of 20–200 ohms/sq., typically 30 ohms/sq.

A moderately doped P-type lower buried layer formed with P regions 28A–28D (collectively "28") is also situated along lower metallurgical semiconductor interface 24. As with N+ buried regions 24, each P+ lower buried region 28 extends partway into both substrate region 20 and epitaxial layer 22. Likewise, certain of lower buried regions 28 may be continuous with one another outside the plane of FIG. 1. Each buried region 28 has a greater net P-type dopant concentration than substrate region 20. P lower buried regions 28 have a sheet resistance of 200–1000 ohms/sq., typically 400 ohms/sq.

Preferably, each P lower buried region 28 is laterally separated from each N+ lower buried region 26. This increases the breakdown voltage between N+ buried regions 26, on one hand, and P buried regions 28, on the other hand. The separation between N-type buried regions 26 and P-type buried regions 28 also enables N-type regions 26 to have low resistance without creating high capacitance between regions 26 and 28. Depending on the types of semiconductor elements furnished in the present structure, certain of P buried regions 28 may laterally surround certain of N+ buried regions 26. Buried regions 26 and 28 together form a lower level of buried regions.

N+ lower buried regions 26 form the bottoms of N-type tubs that isolate N-channel FETs and PNP transistors from P− substrate region 20. N+ buried regions 26 furnish the vertical portion of the isolation. P lower buried regions 28 are part of a mechanism for providing electrical access to substrate region 20. P buried regions 20 also help reduce transistor sensitivity to latchup.

An upper epitaxial silicon layer 30 is situated on lower epitaxial layer 22 along an upper metallurgical semiconductor interface 32. As discussed below, upper epitaxial layer 30 is typically provided in intrinsic (undoped) form. The thickness of upper epitaxial layer 30 is 0.8–3.0 μm, typically 2.2 μm.

A heavily doped N-type upper buried layer consisting of N+ regions 34A–34F (collectively "34") is situated along upper semiconductor interface 32. Each N+ upper buried region 34 extends partway into both of epitaxial layers 22 and 30. Although labeled with reference symbols that end with different letters, certain of upper buried regions 34 are usually continuous with one another outside the plane of FIG. 1. Each buried region 34 has a greater net N-type dopant concentration than lower epitaxial layer 22. The sheet resistance of N+ upper buried regions 34 is 20–200 ohms/sq., typically 30 ohms/sq.

N+ upper buried regions 34 variously overlie lower buried regions 26 and 28. Each N+ buried region 34 (e.g., region 34A) that overlies one of N+ buried regions 26 (e.g., region 26A) typically does not extend down to underlying N+ buried region 26. The intervening N-type material of epitaxial layer 22 provides an electrical connection between each such N+ buried region 34 and underlying N+ buried region 26. Each N+ buried region 34 (e.g., region 34B) that overlies one of P buried regions 28 (e.g., region 28A) is preferably vertically separated from underlying P buried region 28.

A moderately doped P-type upper buried layer formed with P regions 36A–36H (collectively "36") is also situated along upper semiconductor interface 32. As with N+ buried regions 34, each P upper buried region 36 extends partway into both of epitaxial layers 22 and 30. Similarly, certain of upper buried regions 36 are usually continuous with one another outside the plane of FIG. 1. P upper buried regions 36 have a sheet resistance of 200–1000 ohms/sq., typically 400 ohms/sq.

Preferably, each P upper buried region 36 is laterally separated from each N+ upper buried region 34. As with lower buried regions 26 and 28, the upper-buried-region spacing increases the breakdown voltage between N+ buried regions 3A, on one hand, and P upper buried regions 36, on the other hand. Likewise, the separation between N-type buried regions 34 and P-type buried regions 36 enables N-type regions 34A to have low resistance without creating high capacitance between regions 34 and 36. Depending on the desired application of the present structure, certain of N+ upper buried regions 34 laterally surround certain of P upper buried regions 36, and vice versa. Buried regions 34 and 36 together form an upper level of buried regions.

P upper buried regions 36 variously overlie lower buried regions 26 and 28. Each P buried region 36 (e.g., region 36A) that overlies one of P buried regions 28 (e.g., region 28A) extends down to that P region 28 so that the two P regions are electrically connected. Each P buried region 36 (e.g., region 36C) that overlies one of N+ buried regions 26 (e.g., region 26B) is preferably vertically separated from underlying N+ buried region 26. In some parts of the structure, certain of N+ lower buried regions 26 (e.g., region 26D) may not underlie any of upper buried regions 34 and 36.

As discussed further below, N+ upper buried regions 34 perform a number of functions. For example, N+ buried regions 26 provide low-resistance buried collector zones in NPN transistors and help prevent latchup in P-channel FETs. Buried regions 26 also provide part of the lateral isolation in N-type isolation tubs. P upper buried regions 36 perform similar functions in PNP transistors, N-channel FETs, and P-type tubs. P buried regions 36 also provide part of the mechanism for electrically accessing P− substrate 20.

Upper epitaxial layer 30 is divided into a group of lightly doped N-type device regions 38A–38J (collectively "38") and a group of lightly doped P-type device regions 40A–40J (collectively "40"). Each of device regions 38 and 40 extends from the upper surface 42 of epitaxial layer 30 down to upper semiconductor interface 32 and/or one of upper buried regions 34 and 36. Transistor zones are provided in device regions 38 and 40 in the manner described below.

Preferably, each N− device region 38 laterally adjoins at least one P− device region 40, and vice versa. Although labeled with reference symbols that end with different letters, certain of N− device regions 38 are continuous with one another outside the plane of FIG. 1. The same applies to P− device regions 40.

N-type device regions 38 are more lightly doped than N-type buried regions 34. Device regions 38 have a sheet resistance of 1000–4000 ohms/sq., typically 2000 ohms/sq. Likewise, P-type device regions 40 are more lightly doped than P-type buried regions 36. Device regions 40 have a sheet resistance of 2000–4000 ohms/sq., typically 4000 ohms/sq.

With the foregoing in mind, the way in which the two levels of buried layers are employed to achieve vertical electrical isolation can be readily understood. Electrical isolation here means that two so-isolated regions are not resistively connected to each other by way of a path through monocrystalline semiconductive material of the substrate. For example, two semiconductive regions are electrically isolated from each other when they are separated by a PN junction that is not forward biased. In this regard, two regions can be capacitively coupled even though they are electrically isolated from each other. Provisions taken in the invention to avoid undesirable effects of capacitive coupling are described later below.

Looking specifically at electrical isolation, N− device regions 38 are of opposite conductivity type to P− substrate region 20. Accordingly, each device region 38 is separated from substrate region 20 by a PN junction. For example, part of the PN junction for N− device region 38A runs along the bottom of underlying N+ lower buried region 26A. Part of the PN junction for N− device region 38B runs along the top of underlying P lower buried region 28A. The present semiconductor structure is provided with voltages of such a nature that the PN junction separating each N− device region 38 from substrate region 20 does not normally become forward biased. Accordingly, each device region 38 is automatically vertically isolated from substrate region 20.

Next consider P− device regions 40. Certain of device regions 40 are always electrically connected to substrate 20. For example, device regions 40A and 40B (which may be laterally connected to form a single P− device region) are connected to P lower buried region 28A by way of P upper buried regions 36A and 36B (which may similarly form a single P upper buried region). Thus, device regions 40A and 40B are permanently electrically connected to substrate region 20.

Other P− device regions 40 are located in such a way with respect to regions 26, 28, 34, 36, and 38 that these device regions 40 are electrically isolated from substrate region 20 by "tubs" of N-type silicon. Device region 40C is one example of such an isolated P− device region. N− device regions 38C and 38D, which are laterally connected to form a single N− device region 38C/38D, laterally surround P− device region 40C. P upper buried region 36C, which underlies device region 40C to form a composite P-type device region 40C/36C, does not extend laterally beyond region 40C to contact P-type material electrically connected to substrate region 20. N− device region 38C/38D and underlying N+ upper buried regions 34C and 34D (which may form a single N+ upper buried region) thereby combine with underlying N+ lower buried region 26B and the intervening N− material of lower epitaxial layer 22 to form an N-type tub that surrounds composite P-type region 40C/36C along its lateral and lower surfaces—i.e., along the portion of its outside surface located in epitaxial layers 22 and 30. Accordingly, the N-type tub electrically isolates composite P-type region 40C/36C from P− substrate region 20.

The source/drain zones of an N-channel FET may be provided in P− device region 40C. With region 40C arranged in the preceding way, the N-channel FET is vertically isolated from substrate region 20. Likewise, a PNP transistor formed in composite P-type region 40C/36C is vertically isolated from substrate region 20.

Another example of an isolated P− device region is the combination of device regions 40F and 40G which are laterally connected to form a single P− device region 40F/40G. P− device region 40F/40G and underlying P upper buried layer 36F form a P-type tub 40F/40G/36F which surrounds N− device region 38G along its lateral and lower surfaces. N− device regions 38F and 38H, which likewise form a single N− device region 38F/38H, laterally surround P− device region 40F/40G. P upper buried region 36F does not extend laterally beyond P− device region 40F/40G to contact P-type material electrically connected to substrate region 20.

N− device region 38F/38H and underlying N+ upper buried regions 34E and 34F (which may also form a single N+ upper buried region) thus combine with underlying N+ lower buried region 26 and the intervening N− material of lower epitaxial layer 22 to form an N-type tub that surrounds P-type tub 40F/40G/36F along the portion of its outside surface located in epitaxial material 22 and 30. P-type tub 40F/40G/36F, along with N− device region 38G, is thereby electrically isolated from substrate region 20. The combination of P− device regions 40F/40G and N− device region 38G is suitable for the source/drain zones of a high-voltage N-channel FET. Due to the presence of the surrounding N-type tub, this high-voltage N-channel FET is electrically isolated from substrate region 20.

A third example of an isolated P− device region is device region 40I. N− device regions 38I and 38J form a single N− device region 38I/38J that laterally surrounds P− device region 40I. N− device region 38I/38J combines with underlying N+ lower buried region 26D and the intervening N− material of lower epitaxial layer 22 to form an N-type tub that surrounds P− device region 40I along its lateral and lower surfaces. The combination of device regions 38I/38J and 40I is suitable for a high-voltage P-channel FET.

2. Transistors and Other Semiconductor Elements Implemented with Two-Level Buried-Layer Structure FIGS. 2.1–2.8 (collectively "FIG. 2") depict how various low-voltage and high-voltage transistors, a capacitor, and a Schottky diode are implemented by using the structure of FIG. 1 in accordance with the invention. In the implementation of FIG. 2, a patterned semi-recessed electrically insulating field layer 44 of silicon oxide is situated along upper surface 42 of upper epitaxial layer 30. Field-oxide region 44 has a thickness of 0.4–0.9 $\mu$m, typically 0.65 $\mu$m.

Thin electrically insulating layers of silicon oxide, not shown in FIG. 2, normally lie along the otherwise exposed upper surface portions of epitaxial layer 30. Each of the exemplary structural implementations shown in FIG. 2 has an overlying electrical interconnection system, likewise not shown in FIG. 2, that makes electrical contact to the various transistor zones and capacitor plates. The short dotted lines in FIGS. 2.2 and 2.7 indicate the location of lower semiconductor interface 24.

Turning specifically to FIG. 2.1, it illustrates (a) a basic low-voltage lightly doped drain ("LDD") N-channel insulated-gate FET created from P− device region 40A and (b) a basic low-voltage LDD P-channel insulated-gate FET created from N− device region 38B. P− device region 40A is connected to substrate region 20 by way of intervening P buried regions 36A and 28A. In addition to providing part of the connection to substrate region 20, P upper buried region 36A makes the N-channel FET more resistance to latchup. N− device region 38B, which extends down to N+ upper buried region 34B, is automatically electrically isolated from substrate region 20 for the reasons given above. N+ buried region 34B increases the latchup resistance of the P-channel FET.

The N-channel FET in FIG. 2.1 is formed with a pair of N-type source/drain zones 46 separated by a channel zone in P− device region 40A. Each source/drain zone 46 consists of a heavily doped N-type main portion and a lightly doped N-type extension. A heavily doped N-type polysilicon gate electrode 48A is situated on a gate dielectric layer 50A located above the channel zone. A pair of dielectric spacers 52A overlie the N− portions of source/drain zones 46. P− device region 40A is connected to a heavily doped P-type surface contact zone (not shown) by way of a path through P buried regions 36A and 28A.

The P-channel FET in FIG. 2.1 is similarly formed with a pair of P-type source/drain zones 54 separated by a channel zone in N− device region 38B. Each source/drain zone 54 consists of a heavily doped P-type portion and a lightly doped P-type extension. A heavily doped N-type polysilicon gate electrode 48B is situated on a gate dielectric layer 50B located above the channel zone. A pair of dielectric spacers 52B overlie the P− portions of source/drain zones 54. N− device region 38B also has a heavily doped N-type surface contact zone (not shown).

FIG. 2.2 depicts a vertical NPN transistor created from N− device region 38B and underlying N+ upper buried region 34B. P− device regions 40A and 40B here form a single P− device region 40A/40B that laterally surrounds N− device region 38B. P− device region 40A/A0B and underlying P upper buried regions 36A and 36B (which also form a single P upper buried region) then combine with underlying P lower buried region 28A to form a P-type tub that surrounds N− device region 38B, including N+ upper buried region 34B and the directly underlying N− material of lower epitaxial layer 22, along its lateral and lower surfaces. The PN junction along the inside of the P-type tub laterally and vertically isolates the NPN transistor from other NPN transistors in the structure. This PN junction also isolates the NPN transistor of FIG. 2.2 from P-channel FETs created from N− device regions other than device region 38B.

The NPN transistor in FIG. 2.2 consists of a heavily doped N-type emitter 56, a moderately doped P-type base 58 including a heavily doped P-type base contact zone 60A, and an N-type collector formed with N+ upper buried region 34B and the overlying N− material of device region 38B. The collector also includes a heavily doped N-type contact zone 62A and a heavily doped N-type collector sink 64 that extends from N+ collector contact zone 62A substantially down to N+ buried region 34B.

FIG. 2.3 illustrates (a) an isolated low-voltage N-channel LDD insulated-gate FET created from P− device region 40C and (b) an isolated low-voltage P-channel LDD insulated-gate FET created from N− device region 38D. P− device region 40C and underlying P upper buried region 36C are situated in an N-type tub which, as described above, separates composite P-type region 40C/36C from P− substrate region 20. Consequently, the N-channel FET in FIG. 2.3 is electrically isolated from substrate region 20. P buried region 36C is instrumental in improving the FET resistance to latchup and snapback as discussed further below. N− device region 38D, which extends down to N+ upper buried region 34D, is automatically electrically isolated from substrate region 20 for the reasons described above. As with P buried layer 36C, N+ buried region 34D improves the FET latchup resistance.

The isolated N-channel FET in FIG. 2.3 is formed with a pair of N-type source/drain zones 66 separated by a channel zone in P− device region 40C. Each source/drain zone 66 consists of a heavily doped N-type portion and a lightly doped N-type extension. A heavily doped N-type polysilicon gate electrode 48C is situated on a gate dielectric layer 50C lying above the channel zone. A pair of dielectric spacers 52C overlie the N− portions of source/drain zones 66. In addition, a heavily doped P-type contact zone 60B is provided for P− device region 40C since it is isolated from substrate region 20.

The isolated P-channel FET in FIG. 2.3 is similarly formed with a pair of P-type source/drain zones 68 separated by a channel zone in N− device region 38D. Each source/drain zone 68 consists of a heavily doped P-type portion and a lightly doped P-type extension. A heavily doped N-type polysilicon gate electrode 48D is situated on a gate dielectric layer 50D located above the channel zone. A pair of dielectric spacers 52D overlie the P− portions of source/drain zones 68. FIG. 2.3 also illustrates a heavily doped N-type contact zone 62B for N− device region 38D.

The general layout of the N-channel and P-channel FETs of FIG. 2.3 along upper semiconductor surface 42 below field-oxide region 44 is shown in FIG. 3. Field oxide 44 overlies all of upper semiconductor surface 42 except where source/drain zones 66 and 68, contact zones 60B and 62B, and the gate-electrode structures (including spacers 52C and 52D) are located. FIG. 3 shows how P− device region 40B/40D laterally surrounds N− device region 38C/38D which, in turn, laterally surrounds P− device region 40C.

FIG. 2.4 depicts a fully isolated vertical PNP transistor created from P− device region 40C and underlying P upper buried region 36C. The N-type tub that encloses composite P-type region 40C/36C separates it both laterally and vertically from other PNP transistors in the structure. The N-type tub also isolates the PNP transistor of FIG. 2.4 from N-channel FETs created from P− device regions other than device region 40C.

The PNP transistor in FIG. 2.4 consists of a heavily doped P-type emitter 70, a moderately doped N-type base 72 including a heavily doped N-type base contact zone 62C, and a P-type collector formed with P upper buried region 36C and the overlying P− material of device region 40C. The collector further includes a heavily doped P-type collector contact zone 60C.

In addition, P− device region 40B and underlying P buried regions 36B and 28A are respectively connected to P− device region 40D and underlying P buried regions 36D and 28B to form a P-type ring that laterally surrounds the N-type tub. The P-type ring and P− substrate region 20 form a P-type tub that isolates the N-type tub from other such N-type tubs, some of which may be maintained at different voltages than the N-type tub of FIG. 2 depending on circuit design. Since the N-type tub is so isolated, heavily doped N-type contact zones 62D and 62E are provided for N− device region 38C/38D.

FIG. 2.5 illustrates an isolated high-voltage N-channel insulated-gate FET created from the combination of P− device region 40F/40G and N− device region 38G. As discussed above, P− device region 40F/40G and underlying P upper buried region 36F are situated in an N-type tub and also surround N− device region 38G along its lateral and lower surfaces. Accordingly, the high-voltage N-channel FET is vertically isolated from substrate region 20. P buried region 36F increases the FET resistance to latchup and snapback for substantially the same reasons, discussed below, as P upper buried region 36C in the low-voltage N-channel FET of FIG. 2.3.

The high-voltage N-channel FET in FIG. 2.5 is formed with an N-type source 74 and an N-type drain separated by a channel zone located in P− device region 40F. Source 74 consists of a heavily doped N-type main portion and a lightly doped N-type extension. The N− source extension is a byproduct of the steps used to form the N− source/drain extensions for the low-voltage N-channel FETs. The drain consists of N− device region 38G and a heavily doped N-type main portion 76 situated in region 38G. Part of field oxide 44 separates N+ main drain portion 76 from the channel zone so that the high-voltage N-channel FET is an LDD device.

A heavily doped N-type polysilicon gate electrode 48E is situated on a gate dielectric layer 50E located above the channel zone for the high-voltage N-channel FET. N+ gate electrode 48E extends over the part of field oxide 44 separating N+ main drain portion 76E from the channel zone. Inasmuch as field oxide 44 is much thicker than gate dielectric 50E, the gate-drain breakdown voltage is increased by an amount depending on the thickness of field oxide 44. In turn, this causes the source-drain avalanche breakdown voltage to be increased, typically to a value of 30–50 V. A pair of dielectric spacers 52E, produced in creating the N− source extension, are situated along the sides of gate electrode 48E.

Also, P− device region 40E and underlying P buried regions 36E and 28B are respectively connected to P− device region 40H and underlying P buried regions 36G and 28C to form a P-type ring that laterally surrounds the N-type tub. As with the PNP transistor, this P-type ring and substrate region 20 form a P-type tub that isolates the N-type tub from other such N-type tubs that may be maintained at different voltages than the illustrated N-type tub. Because the N-type tub of FIG. 2.5 is so isolated, heavily doped N-type contact zones 62F and 62G are provided for N− device region 38F/38H.

FIG. 2.6 illustrates an isolated high-voltage P-channel insulated-gate FET created from the combination of N− device region 38I/38J and P− device region 40I. As discussed above, N− device region 38I/38J and the underlying N-type material form an N-type tub that surrounds P− device region 40I along its lateral and lower surfaces so that device region 40I is electrically isolated from substrate region 20. In this case, N+ lower buried region 26D improves the FET latchup resistance while simultaneously being sufficiently far away from P+ drain 80 to avoid significantly degrading the source-drain breakdown voltage.

The high-voltage P-channel FET in FIG. 2.6 is formed with a P-type source 78 and a P-type drain separated by a channel zone located in N− device region 38I. Source 78 consists of a heavily doped P-type main portion and a lightly doped P-type extension. The P− source extension is a byproduct of the steps employed in forming the P− source/drain extensions for the low-voltage P-channel FETs. The drain consists of P− device region 40I and a heavily doped P-type main portion 80 provided in device region 40I. As with the high-voltage N-channel FET, part of field oxide 44 separates P+ main drain portion 80 from the channel zone so that the high-voltage P-channel FET is an LDD device.

A heavily doped N-type polysilicon gate electrode 48F is situated on a gate dielectric layer 50F located above the channel zone for the high-voltage P-channel FET. N+ gate electrode 48F extends over the part of field oxide 44 separating P+ main drain portion 76 from the channel zone. As with the high-voltage N-channel FET, this increases the gate-drain breakdown voltage for the P-channel FET by an amount depending on the field-oxide thickness. Accordingly, the P-channel source-drain avalanche breakdown voltage is raised to a value typically in the range of 30–50 V. A pair of dielectric spacers 52F, produced in forming the P− source extension, are situated along the sides of gate electrode 48F.

FIG. 2.7 depicts a polysilicon capacitor created from N− device region 38E which overlies P lower buried region 28B. The capacitor consists of (a) a heavily doped N-type lower plate 82 that extends deep into N− device region 38E, (b) a heavily doped N-type polysilicon upper plate 48G, and (c) a dielectric layer 50G separating N+ plates 82 and 48G. N+ lower plate 82 includes a shallow more heavily doped N-type plate contact zone 62I. A pair of dielectric spacers 52G, produced in the course of forming the LDD extensions for the FETs, are situated along the sides of upper plate 48G.

FIG. 2.8 depicts a guard-ring Schottky diode created from N− device region 38B. A heavily doped P-type ring 84 situated along upper epitaxial surface 42 in device region 38B forms the guard ring for the diode. A dielectric layer 86 lies on field-oxide region 44 and the portions of upper epitaxial layer 30 exposed through openings in field oxide 44.

The Schottky diode consists of (a) an anode formed with a metal silicide layer 88 and an overlying metallic contact 90A and (b) a cathode formed with N+ upper buried region 34B and the overlying N-type portion of device region 38B. Metal silicide layer 88 and metallic contact 90A extend through an opening in dielectric layer 86. The cathode includes a heavily doped N-type contact zone 62J lying in device region 38B. A metallic contact 90B extends through another opening in dielectric layer 86 to meet N+ contact zone 62J.

FIG. 2.8 also illustrates how an external connection to P− substrate 20 (not actually shown here) is made through upper surface 42. The external connection is accomplished with a heavily doped P-type contact zone 60E, underlying P− device region 40A, and underlying P buried layers 36A and 28A. As indicated in FIG. 1.1, P lower buried region 28A is continuous with P− substrate region 20. A metallic contact 90C contacts substrate contact zone 60E through a third opening in dielectric 86. Each of metallic contacts 90A–90C (collectively "90") preferably consists of a lower barrier-metal layer and an upper primary-interconnect metal layer.

The gate-electrode thickness for the FETs in FIGS. 2.1, 2.3, 2.5, and 2.6, including the upper-plate thickness for the capacitor in FIG. 2.7, is 250–600 nm, typically 400 nm. The FET gate-dielectric thickness is 8–30 nm, typically 15 nm. Since heavily doped N-type silicon thermally oxidizes about twice as much as lightly doped (or intrinsic) silicon, the capacitor-dielectric thickness is approximately twice the gate-dielectric thickness. The (lateral) spacer thickness is 100–250 nm, typically 150 nm.

P+ contact zones 60B and 60D for the N-channel FETs in FIGS. 2.3 and 2.5, along with the (unshown) P+ device-region contact zone for the N-channel FET in FIG. 2.1, are held at low voltage, typically 0 V (ground), during circuit operation. P+ substrate contact zone 60E is also held at the same low voltage. N+ contact zones 62B and 62D–62H for the P-channel FETs in FIGS. 2.3 and 2.6, along with the (unshown) N+ device-region contact zone for the P-channel FET in FIG. 2.1, are held at high voltage, typically 5 V, during circuit operation. As a result, the PN junctions along the outside boundaries of the above-described N-type tubs are reverse biased.

3. Sheet Resistance Considerations

In manufacturing the structure of FIGS. 1 and 2, N− device regions 38 and P− device regions 40 are preferably created by selectively introducing appropriate semiconductor dopants into upper epitaxial layer 30. Each of device regions 38 and 40 thus constitutes a well in conventional semiconductor terminology. Any buried region which is situated along the bottom of the well and which is of the same conductivity type as the well is considered to be part of the well. For example, P− device region 40C and underlying P upper buried region 36C constitute a P-type well. Likewise, P− device region 40F/40G and underlying P upper buried region 36F form a P-type well.

The sheet resistance of the isolated P-type wells—i.e., the P-type wells enclosed by N-type tubs—is quite low in the structure of FIGS. 1 and 2. A low isolated P-type well sheet resistance is needed to prevent snapback and latchup. The isolated P-type well sheet resistance $R_{PW\square}$ for the structure of FIGS. 1 and 2 is 200–1000 ohms/sq., typically 400 ohms/sq. This low $R_{PW\square}$ value is achieved by utilizing P upper buried regions 36 at the bottom of the isolated P-type wells.

For example, consider the layout for an N-channel insulated-gate FET created from an isolated P-type well 100 as shown in FIG. 4.1. N+ source 102 and drain 104 are situated in P-type well 100. The center-to-center distance from gate electrode 106 to P+ well contact zone 108 is indicated as distance D in FIG. 4.1. The N-channel FET is assumed to be a wide device whose width $W_{SD}$ approximately equals the width $W_{PW}$ of isolated P-well 100. The maximum value of the well current $I_{PW}$ caused by the N-channel FET equals $J_W W_{SD}$, where $J_W$ is the hot-hole current density. $J_W$ typically equals $3.5 \times 10^{-6}$ A/μm. The resistance between source 102 and contact zone 108 equals $R_{PW\square}(D/W_{PW})$.

To prevent snapback, the voltage ΔV between source 102 and contact zone 108 should be less than 0.5 V. Accordingly:

$$\Delta V = I_{PW} R_{PW\square}(D/W_{PW}) = J_W W_{SD} R_{PW\square}(D/W_{PW}) \quad (1)$$

Since $W_{SD}$ approximately equals $W_{PW}$, the isolated P-well sheet resistance is given approximately as:

$$R_{PW\square} = \Delta V / D X_W \quad (2)$$

Assuming that D is approximately 50 μm, substituting the above-mentioned values for ΔV and $X_W$ into Eq. 2 yields a maximum $R_{PW\square}$ value of 2500–3000 ohms/sq.

If the isolated P-type well narrows as shown in FIG. 4.2, $R_{PW\square}$ must be lower. Also, if the isolated P-type well contains multiple N-channel FETs as indicated in FIG. 4.2 and if the FETs switch at nearly the same time, well current $I_{PW}$ becomes even greater. Lower temperature also causes current $I_{PW}$ to increase. As a result, $R_{PW\square}$ must be reduced even more. The 400-ohm/sq. typical $R_{PW\square}$ value for the structure of FIGS. 1 and 2 is sufficiently low to ensure that snapback does not occur.

The N-isolation sheet resistance—i.e., the resistance of the N-type material under an isolated P-type well—is also quite low in the structure of FIGS. 1 and 2. A low N-isolation sheet resistance is needed to prevent latchup. Noise suppression is also improved—i.e., crosstalk is decreased—as the N-isolation sheet resistance is reduced. The N-isolation sheet resistance $R_{N\square}$ for the structure of FIGS. 1 and 2 is 20–100 ohms/sq., typically 30 ohms/sq. This low $R_{N\square}$ value is achieved with N+ lower buried regions 26 that underlie the isolated P-wells. Without N+ buried regions 26, $R_{N\square}$ would be an undesirably high value of several thousand ohms/sq.

The need for low N-isolation sheet resistance can be seen by examining the semiconductor structure shown in FIG. 5 where a multi-fingered N-channel output driver FET created from a P-type well 110 enclosed by an N-type tub 112 is undergoing a latchup test. Interconnected gate electrodes 114 overlie the channel zones which extend between N-type sources 116 and drains 118 situated in P-type well 110. Sources 116 are grounded. A current $I_F$ flows out of drains 118.

N-type tub 112 is externally contacted through N+ contact zones 120 held at high supply voltage $V_{DD}$, typically 5 V. The portion of N-type tub 112 below P-type well 110 constitutes N-isolation layer 122. Resistors 124, which are situated in isolation layer 122 and extend between tub contact zones 120, represent N-isolation sheet resistance $R_{N\square}$. The arrows in FIG. 5 indicate the directions of positive current flow. Some current flows from sources 116 to drains 118, while other current flows from N-isolation layer 122.

As current flows from tub contact zones 120 through N-isolation layer 122 and then across the PN junction 126 between well 110 and isolation layer 122, a voltage drop occurs across isolation layer 122 from the outside towards the middle. If the voltage drop causes the voltage near the middle of isolation layer 122 to drop below ground, PN junction 126 becomes forward biased, causing the isolation to fail. Since tub contact zones 120 are at $V_{DD}$, N-isolation sheet resistance $R_{N\square}$ must be sufficiently low that the voltage drop from contact zones 120 to the middle of isolation layer 122 is less than $V_{DD}$.

Figure 6:
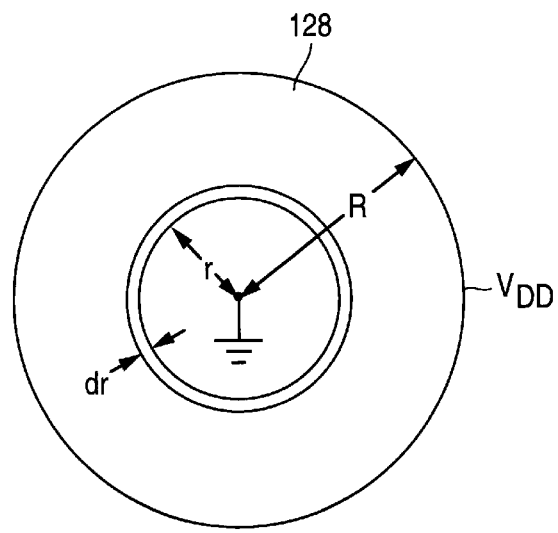
FIG. 6 is a simplified layout view of a variation of the N-type tub in FIG. 5.

N-type isolation tub 112 is typically rectangular in plan view. To estimate the maximum tolerable value of $R_{N\square}$, tub 112 is approximated by a circular N-type isolation tub 128 depicted in FIG. 6. N-type tub 128 has a radius R approximately equal to one half the average of the length and width of tub 112. The outer rim of tub 128 in FIG. 6 is at voltage $V_{DD}$, while the center is at ground.

A fraction $\gamma$ of current $I_F$ flows through N-type tub 128. Accordingly, $\delta I_F$ equals $JA_T$, where J is the current per unit area, and $A_T$ is the tub area. Since $A_T$ equals $\pi R^2$, $$J = \delta I_F / \pi R^2 \qquad (3)$$

The voltage $V_D$ from the outside rim of tub 128 to its center is:

$$V_D = \int_0^R (JR_{N\square}r/2)dr = JR_{N\square}R^2/4 \qquad (4)$$

Combining Eqs. 3 and 4 gives:

$$R_{N\square} = 4\pi V_D / \delta I_F \qquad (5)$$

$I_F$ is typically 250 mA. Assuming that $\delta$ is approximately 0.5 and using 5 V ($V_{DD}$) as the value for $V_D$ in Eq. 5 yields a maximum tolerable $R_{N\square}$ value of approximately 500 ohms/sq. The typical $R_{N\square}$ of 30 ohms/sq. that occurs in the structure of FIGS. 1 and 2 is well below the maximum tolerable value and provides a good safety margin against latchup.

Figure 7:
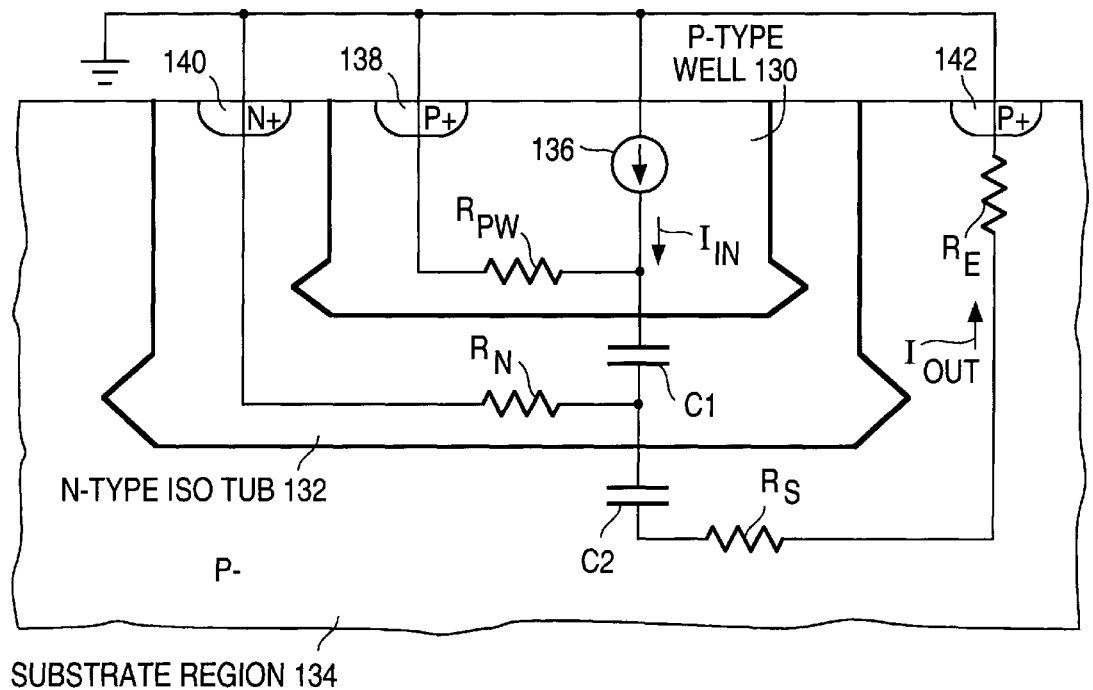
FIG. 7 is a simplified cross-sectional view of a P-type tub enclosed by an N-type isolation tub according to the invention.

As to noise suppression, FIG. 7 illustrates a structural model of how capacitive coupling causes noise to pass between (a) a P-type well 130 enclosed by an N-type isolation tub 132 and (b) an underlying P– substrate region 134 analogous to P– substrate region 20 in FIGS. 1 and 2. A current source 136 represents the action of one or more N-channel FETs whose source/drain zones are situated in P-type well 130. Current source 136 provides a hot-hole current $I_{IN}$. Well 130 has a P+ contact zone 138 coupled to current source 136 by way of a resistor $R_{PW}$ representing the isolated P-well sheet resistance $R_{PW\square}$.

Capacitor C1 in FIG. 7 represents the capacitance between P-type well 130 and N-type tub 132. Capacitor C2 represents the capacitance between tub 132 and substrate region 134. Tub 132 has an N+ contact zone 140 coupled to the capacitor junction point by way of a resistor $R_N$ representing the N-isolation sheet resistance $R_{N\square}$ of tub 132. Resistors $R_S$ and $R_E$ respectively represent the resistance of substrate region 134 and the resistance of the epitaxial material in which well 130 and tub 132 are situated. A current $I_{OUT}$ flows through resistors $R_S$ and $R_E$ and through a P+ contact zone 142 provided along the upper semiconductor surface.

The current ratio $I_{OUT}/I_{IN}$ indicates how much noise passes from P-type well 130 to substrate region 134 where the noise can affect other transistors. Ideally, $I_{OUT}/I_{IN}$ equals zero. Capacitors C1 and C2 couple part of the current from well 130 to substrate region 134, thereby preventing $I_{OUT}/I_{IN}$ from reaching zero.

Figure 8:
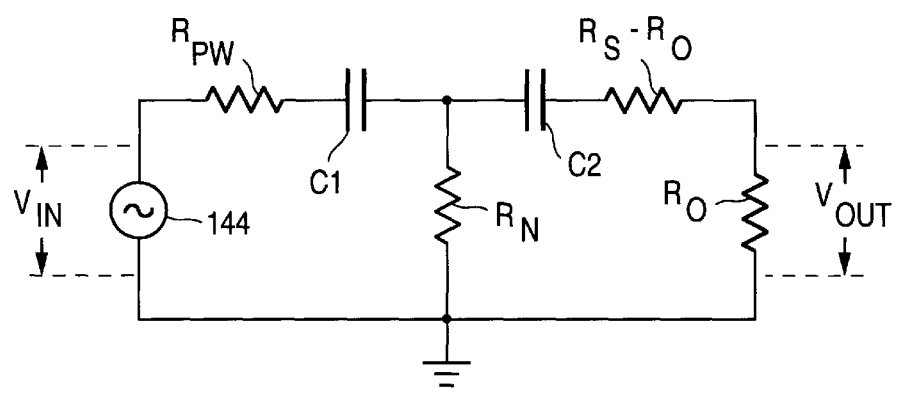
FIG. 8 is a circuit diagram of equivalent electronic circuitry for the structure of FIG. 7.

FIG. 8 depicts an equivalent circuit for FIG. 7. In FIG. 8, current source 136 is replaced with a voltage source 144 that provides an input voltage $V_{IN}$ equal to $R_{PW}I_{IN}$. Epitaxial resistor $R_E$ has a much smaller value than substrate resistor $R_S$ and, for approximate equivalency purposes, is not shown in FIG. 8. To establish an output voltage $V_{OUT}$, substrate resistor $R_S$ is divided into an output resistor $R_O$ and another resistor $R_S - R_O$ in FIG. 8. Output voltage $V_{OUT}$ equals $R_O I_{OUT}$. By arbitrarily setting $R_O$ equal to 1 ohm, $V_{OUT}$ is numerically equal to $I_{OUT}$. $I_{OUT}/I_{IN}$ then equals ($V_{OUT}/V_{IN}R_{PW}$) (1V/1A)

The circuit of FIG. 8 was computer simulated for various values of N-isolation sheet resistance $R_{N\square}$. In the simulations, N-type tub 132 was a 200-$\mu$m by 200-$\mu$m square. $R_{PW}$ was 400 ohms. This corresponds to an $R_{PW\square}$ value of 400 ohms/sq., the typical value achieved in the structure of FIGS. 1 and 2. $R_S$ was 20 ohms. C1 and C2 were each 6 pF.

Table 1 below presents a summary of the simulation results at three different input frequencies for voltage source 144:

TABLE 1

| $R_{N\square}$ (ohm/sq.) | Noise $I_{OUT}/I_{IN}$ (db) | | |
|---|---|---|---|
| | 10 MHz | 100 MHz | 1 GHz |
| 10,000 | −22.6 | −4.63 | 0 |
| 1,000 | −27.2 | −5.28 | −0.67 |
| 100 | −45.0 | −12.3 | −2.27 |
| 30 | −55.4 | −21.1 | −5.88 |
| 10 | −65.0 | −30.2 | −12.2 |

Table 1 clearly shows that reducing $R_{N\square}$ improves the noise suppression, thereby reducing crosstalk. For example, the noise is suppressed slightly over 20 db at 100 Mhz when $R_{N\square}$ equals 30 ohms/sq., the typical value attained in the structure of FIGS. 1 and 2.

With characteristics of the preceding nature, the structure of FIGS. 1 and 2 is particularly suitable for mixed signal applications. Entire circuit blocks can be situated in N-type tubs. For example, the digital section of a mixed signal integrated circuit could lie above an N+ lower buried region, while the analog section lies above a P lower buried region.

4. General Characteristics of Modular Process for Manufacturing Semiconductor Devices using Two-Level Buried-Layer Structure The structure of FIGS. 1 and 2 is manufactured according to a modular process. That is, steps for creating certain semiconductor elements can be added to the fabrication process depending on the manufacturer's needs. Consequently, the process of the invention is extremely flexible.

The core of the fabrication process is a sequence of steps for manufacturing complementary FETs. This includes the basic FETs of FIG. 2.1, the isolated FETs of FIG. 2.3, and the isolated high-voltage FETs of FIGS. 2.5 and 2.6. Modules for the bipolar transistors of FIGS. 2.2 and 2.4, the capacitor of FIG. 2.7, and the Schottky diode of FIG. 8 are added to the core process as desired. Modules for EPROM cells of the ultraviolet and electrically erasable type can also be incorporated into the process.

Table 2 below presents a summary of the core process plus the modules for the bipolar transistors, capacitors, EPROM cells (UV and EE), and Schottky diodes. Table 2 also indicates the number of masking steps needed in various parts of the process.

TABLE 2

| | Operation | Mask(s) |
|---|---|---|
| 1. | Form lower buried regions and lower epitaxial layer | 2 |
| 2. | Form upper buried regions and upper epitaxial layer | 2 |
| 3. | Provide complementary device regions as twin wells in upper epitaxial layer | 1 |
| 4. a. | Provide semi-recessed field-oxide lateral isolation with channel stops, and | 2 |
| b. | When EPROM included, provide high-voltage EPROM isolation | |
| 5. | Perform threshold adjust implant | |
| 6. a. | Perform heavy deep N-type sinker implant when NPN transistor and/or polysilicon capacitor included, and/or | 1 |
| b. | Form inter-poly capacitor layers when inter-poly capacitor included, or | 1 |
| c. | Form EPROM layers, including inter-poly capacitor layers, when EPROM and inter-poly capacitor included | 3 |
| 7. | Form gate dielectric layers and polysilicon gates | 1 |
| 8. | Perform light N-type and P-type LDD implants | 2 |
| 9. | Perform heavy N-type implant for N+ source/drain portions, N+ contact zones, and, when NPN transistor included, N+ emitter | 1 |
| 10. | Perform moderate P-type implant for P base when NPN transistor included | 1 |
| 11. | Perform heavy P-type implant for P+ source/drain portions, P+ contact zones, and, when PNP transistor included, P+ emitter | 1 |
| 12. | Perform moderate N-type implant for N base when PNP transistor included | 1 |
| 13. | Anneal/provide thick dielectric | |
| 14. | Form Schottky diode regions | 1 |
| 15. | Form contacts to silicon, provide double-layer metallization, and provide passivation | 5 |

Four masking steps are needed to fabricate buried regions 26, 28, 34, and 36. One masking step is used to fabricate device regions 38 and 40 as twin wells in a self-aligned manner. Fabrication of specific features for the complementary FETs of FIGS. 2.1, 2.3, 2.5, and 2.6 entails eleven more masking steps. Accordingly, there are sixteen masking steps in the core process. Two more masking steps are needed for the NPN transistor of FIG. 2.2. Adding the PNP transistor of FIG. 2.4 entails one further masking step. Nineteen masking steps are thus required to fabricate all the complementary field-effect and bipolar transistors.

5. Fabrication of Buried Regions and Device Regions

FIGS. 9a–9f and 9g.1–9n.2 (collectively "FIG. 9") illustrate steps involved in fabricating the structure of FIG. 1 using the normal lateral isolation procedure of operation 4a in Table II. The mean depth of implanted N-type dopant is indicated by small circles in FIG. 9. The mean depth of implanted P-type dopant is indicated by small "xs" in FIG. 9.

Each pair of FIGS. 9x.1 and 9x.2, where "x" varies from "g" through "n", represents a single stage in the fabrication procedure. For convenience, each such pair of FIGS. 9x.1 and 9x.2 is referred to as FIG. 9x in the following manufacturing discussion.

In the ion-implantation steps described below, boron is normally ion implanted as $B^+$ but could be implanted in the form of $BF_2^+$. The specified boron implant energies are for $B^+$. Phosphorus, arsenic, and antimony are respectively ion implanted as $P^+$, $As^+$, and $Sb^+$.

The fabrication process begins with a (100) monocrystalline silicon semiconductive substrate containing major P− substrate region 20 typically doped with boron. A layer 150 of silicon oxide is thermally grown along the top of substrate region 20 as shown in FIG. 9a.

A photoresist mask 152 is formed on oxide layer 150. See FIG. 9b. Mask 152 has openings at the general locations for P lower buried regions 28. A P-type dopant, preferably boron, is ion implanted at a moderate dosage through the mask openings, through oxide layer 150, and into substrate region 120. The boron implant dosage is $1 \times 10^{13}$–$2 \times 10^{15}$ ions/cm$^2$, typically $1 \times 10^{14}$ ions/cm$^2$. The implant energy is 30–150 KeV, typically 90 KeV.

After removing mask 152, a photoresist mask 154 is formed on oxide 150 as shown in FIG. 9c. Mask 154 has openings at the general locations for N+ lower buried regions 26. An N-type dopant, preferably arsenic or antimony, is ion implanted at a high dosage through the openings in mask 154, through oxide 150, and into substrate region 20. The implant dosage for arsenic is $1\times10^{14}-1\times10^{16}$ ions/cm$^2$, typically $6\times10^{15}$ ions/cm$^2$. The arsenic implant energy is 40–150 KeV, typically 75 KeV.

After removing mask 154, the structure is annealed to activate the implanted N-type and P-type dopants, drive them further into substrate region 20 to respectively form heavily doped N-type regions 26P and moderately doped P-type regions 28P, and repair lattice damage. See FIG. 9d. Regions 26P and 28P are precursors to lower buried regions 26 and 28. The anneal is preferably done in an inert environment, typically nitrogen. The anneal time is 30–300 min., typically 180 min. The anneal temperature is 900–1150° C., typically 1050° C.

Oxide layer 150 is removed. Lower N− epitaxial layer 22 is then deposited on top of substrate region 20. During the epitaxial deposition, part of each of the N-type and P-type dopants implanted into regions 26P and 28P updiffuses into N− epitaxial layer 22. N+ lower buried regions 26 and P lower buried regions 28 are thereby formed as shown in FIG. 9e. A layer 156 of silicon oxide is thermally grown along the top of epitaxial layer 22 to produce the structure illustrated in FIG. 9f.

A photoresist mask 158 is formed on oxide layer 156. See FIG. 9g. Mask 158 has openings at the general locations for P upper buried regions 36. A P-type dopant, preferably boron, is ion implanted at a moderate dosage through the mask openings, through oxide 156, and into lower epitaxial layer 22. The implant dosage is $1\times10^{13}-2\times10^{15}$ ions/cm$^2$, typically $1\times10^{14}$ ions/cm$^2$. The implant energy is 30–150 KeV, typically 90 KeV.

After removing mask 158, a photoresist mask 160 is formed on oxide 156 as shown in FIG. 9h. Mask 160 has openings at the general locations for N+ upper buried regions 34. An N-type dopant, preferably arsenic or antimony, is ion implanted at a high dosage through the openings in mask 160, through oxide 156, and into epitaxial layer 22. The implant dosage for arsenic is $1\times10^{14}-1\times10^{16}$ ions/cm$^2$, typically $6\times10^{15}$ ions/cm$^2$. The arsenic implant energy is 40–150 KeV, typically 75 KeV.

After removing mask 160, the structure is annealed to activate the just-implanted N-type and P-type dopants, drive them further into epitaxial layer 22 to respectively form heavily doped N-type regions 34P and moderately doped P-type regions 36P, and repair lattice damage. See FIG. 9i. Regions 34P and 36P are precursors to upper buried regions 34 and 36. The anneal is preferably done in an inert environment, typically nitrogen. The anneal time is 30–300 min., typically 180 min. The anneal temperature is 900–1150° C., typically 1050° C.

Oxide layer 156 is removed. Upper epitaxial layer 30 is then deposited in intrinsic form on top of lower epitaxial layer 22. During the epitaxial deposition, part of each of the N-type and P-type dopants implanted into precursor regions 34P and 36P updiffuses into upper epitaxial layer 30. N+ upper buried regions 34 and P upper buried regions 36 are thereby formed as shown in FIG. 9j.

A thin pad layer 162 of silicon oxide is thermally grown along the top of upper epitaxial layer 30. See FIG. 9k. A layer 164 of an oxygen-impervious material, typically silicon nitride, is deposited on oxide layer 162.

A photoresist mask 166 is formed on nitride layer 164 as depicted in FIG. 9l. Mask 166 has openings at the general locations for N− device regions (or wells) 38. An etch is performed to remove the material of nitride layer 164 exposed through the mask openings. The remainder of nitride layer is indicated as item 164R in FIG. 9l.

An N-type dopant, preferably phosphorus, is ion implanted at a low dosage through the openings in mask 166, through oxide layer 162, and into upper epitaxial layer 30. The implant dosage is $1\times10^{12}-5\times10^{13}$ ions/cm$^2$, typically $7\times10^{12}$ ions/cm$^2$. The implant energy is 50–200 KeV, typically 140 KeV.

After removing mask 166, a thermal oxidation is performed to grow moderately thick silicon oxide 168 along the material of epitaxial layer 30 not covered by nitride 164R. See FIG. 9m. Oxide 168 reaches a thickness sufficient to act as an ion implantation mask. The remainder of thin pad oxide layer 162 is indicated as item 162R in FIG. 9m. During the oxidation, the implanted N-type dopant in epitaxial layer 30 is activated and driven outward to the positions indicated by items 38 in FIG. 9m.

Nitride mask 164R is removed to expose thin oxide 162R. Using thick oxide 168 as a mask, a P-type dopant, preferably boron, is ion implanted at a low dosage through thin oxide 162R and into epitaxial layer 30. FIG. 9n shows the structure at this point. The implant dosage is $1\times10^{12}-1\times10^{14}$ ions/cm$^2$, typically $3.3\times10^{12}$ ions/cm$^2$. The implant energy is 40–200 KeV, typically 150 KeV.

Thick oxide 168 is now removed. The structure is annealed to drive the just-implanted N-type and P-type dopants further into epitaxial layer 30 to respectively form N− device regions 38 and P− device regions 40 as shown in FIG. 1. During the anneal, the implanted P-type dopant is activated, and lattice damage is repaired. The anneal causes buried regions 26, 28, 34, and 36 to expand somewhat. The anneal is preferably done in an inert environment, typically nitrogen. The anneal time is 120–480 min., typically 360 min. The anneal temperature is 1000–1250° C., typically 1050° C.

A thin layer of silicon oxide (not shown in FIG. 1) typically grows along the top of epitaxial layer 30 during the anneal even though an inert environment is used for the anneal. The upper-surface irregularities that result from using thick oxide 168 to create device regions 38 and 40 in a self-aligned manner are relatively small and are not indicated in FIG. 1.

FIGS. 10.1–10.6 (collectively "FIG. 10") illustrate computer-simulated dopant concentration profiles through various parts of the structure of FIG. 1 as fabricated according to the process of FIG. 9. The notations "DR", "UBR", and "LBR" in FIG. 10 respectively mean device region, upper buried region, and lower buried region. The "P" and "N" notations in FIG. 10 respectively mean P-type and N-type.

The concentration profile of FIG. 10.1 is taken through a cross section having a P device region 40, a P upper buried region 36, and a P lower buried region 28. An example is regions 40A, 36A, and 28A used for the N-channel FET of FIG. 2.1. The concentration profile of FIG. 10.2 is taken through a cross section having an N− device region 38, an N+ upper buried region 34, and a P lower buried region 28 such as regions 38B, 34B, and 28A used for the P-channel FET of FIG. 2.1 or the NPN transistor of FIG. 2.2.

FIG. 10.3 depicts a concentration profile taken through a cross section having a P− device region 40, a P upper buried region 36, and an N+ lower buried region 26. An example is regions 40C, 36C, and 26B used for the isolated N-channel FET of FIG. 2.3 or the PNP transistor of FIG. 2.4. Another example is regions 40F, 36F, and 26C used for the high-voltage isolated N-channel FET of FIG. 2.5. FIG. 10.4 depicts a concentration profile taken through a cross section having an N– device region 38, an N+ upper buried region 34, and an N+ lower buried region 26 such as regions 38D, 34D, and 26B used for the isolated P-channel FET of FIG. 2.3.

The concentration profile of FIG. 10.5 is taken through a cross section having a P– device region 40 and an N+ lower buried region 26 but no upper buried region. An example is regions 40I and 26D used in the high-voltage isolated P-channel FET of FIG. 2.6. The concentration profile of FIG. 10.6 is taken through a cross section having an N– device region 38 and an N+ lower buried region 26 but no upper buried region. An example is regions 38I and 26D also used in the high-voltage P-channel PET of FIG. 2.6.

6. Fabrication of FETs of Process Core

FIGS. 11a–11f.4 (collectively "FIG. 11") illustrate how the FETs of FIGS. 2.1, 2.3, 2.5, and 2.6 in the core of the present fabrication process are manufactured from the structure of FIG. 1. As in FIG. 9, the mean depth of implanted N-type dopant is indicated by small circles in FIG. 11. Similarly, the mean depth of implanted P-type dopant is indicated by small "xs" in FIG. 11.

The fabrication of the basic low-voltage N-channel and P-channel FETs of FIG. 2.1 is specifically depicted in FIGS. 11a.1–11f.1. FIGS. 11a.2–11f.2 illustrate the fabrication of the isolated low-voltage N-channel and P-channel FETs of FIG. 2.3. The fabrication of the isolated high-voltage N-channel FET of FIG. 2.5 is depicted in FIGS. 11a.3–11f.3. FIGS. 11a.4–11f.4 illustrate the fabrication of the isolated high-voltage P-channel FET of FIG. 2.6.

Each group of four FIGS. 11y.1–11y.4, where "y" varies from "a" through "f", represents a single stage in the core portion of the manufacturing process. For convenience, each such group of FIGS. 11y.1–11y.4 is referred to as FIG. 11y. For example, FIGS. 11a.1–11a.4 are collectively termed FIG. 11a.

Turning to FIG. 11a, it depicts portions of the structure of FIG. 1 suitable for creating the six FETs in the core of the fabrication process. Device regions 40A and 38B in FIG. 11a.1 are respectively utilized for the basic low-voltage N-channel and P-channel FETs of FIG. 2.1. Device regions 40C and 38D in FIG. 11a.2 are respectively employed for the isolated low-voltage N-channel and P-channel FETs of FIG. 2.3. Device regions 40F/40G and 38G, in combination with surrounding device region 38F/38H, are utilized for the isolated high-voltage N-channel FET of FIG. 2.5. Device regions 38I/38J and 40I are employed for the isolated high-voltage P-channel FET of FIG. 2.6.

Starting from the structures of FIG. 11a, the fabrication process continues with the formation of field-oxide region 44 along upper semiconductor surface 42. Field-oxide region 44 is created according to a local oxidation technique using a suitable photoresist mask (not shown) to define an oxygen-impervious mask (not shown), typically silicon nitride, that establishes the lateral contour of field oxide 44. FIG. 11b shows the resulting structure. During the formation of field oxide 44, a P-type channel-stop dopant (not indicated in the drawings) is introduced at a high dosage into the portions of P– device regions 40 situated below field oxide 44 to prevent inversion at those locations. The channel-stop dopant is preferably ion implanted through a photoresist mask (not shown) subsequent to establishing the field-oxide contour but prior to performing the local thermal oxidation to grow field oxide 44.

A P-type dopant (not indicated in the drawings) is ion implanted at a low dosage and a low energy into the portions of upper epitaxial layer 30 (particularly the FET channel zones) not covered by field oxide 44 to adjust the threshold voltages of the FETs. The N-channel threshold voltages are raised, while the P-channel threshold voltages are lowered. The threshold-adjust implant is preferably done through a thin sacrificial layer of silicon oxide thermally grown along upper surface 42. The sacrificial oxide layer is removed after the threshold-adjust implant.

Gate dielectric layers 50 of silicon oxide are thermally grown along the portions of upper surface 42 not covered by field oxide 44. A gate-electrode layer (48) of polysilicon is deposited on top of the structure and heavily doped with an N-type dopant, typically phosphorus. Using a suitable photoresist mask (not shown), the exposed portions of the N+ polysilicon layer are removed with an etchant to produce N+ gate electrodes 48A–48F as shown in FIG. 11c. The N-type doping level in gate electrodes 48A–48F is sufficiently high compared to the doping levels of the P-type dopants subsequently used in the fabrication process that electrodes 48A–48F remain heavily doped N-type throughout the fabrication process. Accordingly, later dopants that enter electrodes 48A–48F are not mentioned below or indicated in the drawings. The portions of gate dielectric layers 50 underlying gate electrodes 48A–48F respectively constitute gate dielectric layers 50A–50F.

Thin sealing layers 170 of silicon oxide are thermally grown along the upper surfaces of gate electrodes 48A–48F. See FIG. 11d. Implants for the lightly doped portions of the source/drain zones are now performed.

The P-channel FETs are handled first. A P-type dopant, typically boron, is ion implanted at a low dosage through gate dielectric layers 50 and into (source/drain) portions of N– device regions 38B and 38D situated respectively to the sides of gate electrodes 48B and 48D in FIGS. 11d.1 and 11d.2. The P-type dopant also enters a (source) portion of N– device region 38I/38J situated to the left of the left-hand edge of gate electrode 48F in FIG. 11d.4. In addition, the P-type dopant may also enter (a) the far left-hand part of P– device region 40C in FIG. 11d.2, (b) the right-hand part (40G) of P– device region 40F/40G in FIG. 11d.3, and (c) P– device region 40I in FIG. 11d.4.

Field oxide 44 and gate electrodes 48B, 48D, and 48F prevent the P-type dopant from being implanted into the parts of device regions 38B, 38D, 38I/38J, and 40I that lie directly under oxide 44 and electrodes 48B, 48D, and 48F. A photoresist mask (not shown) is utilized during the light P-type implant to prevent the P-type dopant from entering other silicon areas where none of the dopant is desired. The photoresist mask is removed after completing the P-type implant.

The N-channel FETs are handled next. An N-type dopant, typically phosphorus, is ion implanted at a low dosage through gate dielectric layers 50 and into (source/drain) portions of P– device regions 40A and 40C situated respectively to the sides of gate electrodes 48A and 48C in FIGS. 11d.1 and 11d.2. The N-type dopant also enters a (source) portion of P– device region 40F situated to the left of the left-hand edge of gate electrode layer 48E in FIG. 11d.3. In addition, the N-type dopant may enter (a) the far right-hand part of N– device region 38D in FIG. 11d.2, (b) N– device regions 38F/38H and 38G in FIG. 11d.3, and (c) the right-hand part (38J) of N– device region 38I/38J in FIG. 11d.4.

Field oxide 44 and gate electrodes 48A, 48C, and 48E prevent the N-type dopant from being implanted into the directly underlying parts of device regions 40A, 40C, 40F/40G, and 38G. A photoresist mask (not shown) is employed during the light N-type implant to protect other silicon areas from the N-type dopant. The photoresist mask is subsequently removed.

Moving to FIG. 11e, items 172, 174, and 176 generally indicate the lightly doped N-type source/drain zones defined by the just-implanted N-type dopant. Items 178, 180, and 182 generally indicate the lightly doped P-type source/drain zones defined by the just-implanted P-type dopant. The portions of these two dopants that enter other parts of upper epitaxial layer 30 are not electrically consequential and thus are not shown in FIG. 11e.

A layer (52) of silicon oxide is conformally deposited at low temperature on top of the structure to a thickness less than that of gate electrodes 48A–48E. An anisotropic etch is performed to remove all of the low-temperature oxide except for spacers 52A–52F situated along the sides of gate electrodes 48A–48F. Implants for the contact zones and the heavily doped source/drain portions of the FETs are now performed to produce the structures shown in FIG. 11f.

Specifically, an N-type dopant, typically arsenic, is ion implanted at a high dosage through upper epitaxial surface 42 into (source/drain) portions of P– device regions 40A and 40C situated respectively to the outsides of spacers 52A and 52C in FIGS. 11f.1 and 11f.2. The N-type dopant also enters a (source) portion of P– device region 40F/40G situated to the left of left-hand spacer 52E in FIG. 11f.3. Part of the N-type dopant enters (a) the far right-hand part of N– device region 38D in FIG. 11f.2, (b) N– device regions 38F/38H and 38G in FIG. 11f.3, and (c) the right-hand part (38J) of N– device region 38I/38J in FIG. 11f.4.

Field oxide 44, gate electrodes 48A, 48C, and 48E, and spacers 52A, 52C, and 52C prevent the N-type dopant from being implanted into the parts of device regions 40A, 40C, 40F/40G, and 38G that lie directly under elements 44, 48A, 48C, 48E, 52A, 52C, and 52E. A photoresist mask (not shown) is employed during the heavy N-type implant to prevent the N-type dopant from entering other silicon areas where none of the dopant is desired. The photoresist mask is removed after completing the N-type implant.

Thin sealing layers 184 of silicon oxide are thermally grown along the upper silicon surfaces. During the growth of sealing oxide 184, the recently implanted N-type and P-type dopants are activated and driven further into upper epitaxial layer 30, and lattice damage is repaired. Consequently, the various heavily doped N-type portions of upper epitaxial layer 30 not covered by field oxide 44 become (a) the N+ portions of source/drain zones 46 and 66 in FIGS. 11f.1 and 11f.2, (b) N+ main drain zone 76 and the N+ portion of source 74 in FIG. 11f.3, and (c) N+ contact zones 62B, 62F, 62G, and 62H in FIGS. 11f.2, 11f.3, and 11f.4. The N– portions of (a) source/drain zones 46 and 66 in FIGS. 11f.1 and 11f.2 and (b) source 74 in FIG. 11f.3 are likewise produced from the portions of N– zones 172–176 outside the N+ source/drain portions.

A P-type dopant, typically boron, is ion implanted at a high dosage through sealing oxide 184 and into (source/drain) portions of N– device regions 38B and 38D situated respectively to the outsides of spacers 52B and 52D in FIGS. 11f.1 and 11f.2. The P-type dopant also enters a (source) portion of N– device region 38I/38J situated to the left of left-hand spacer 52F in FIG. 11f.4. Part of the P-type dopant enters (a) the far left-hand part of P– device region 40C in FIG. 11f.2, (b) the right-hand part (40G) of P– device region 40G in FIG. 11f.3, and (c) P– device region 40I in FIG. 11f.4.

Field oxide 44, gate electrodes 48B, 48D, and 48F, and spacers 52B, 52D, and 52F prevent the P-type dopant from being implanted into directly underlying parts of device regions 38B, 38D, 38I/38J, and 40I. A photoresist mask (not shown) is utilized during the heavy P-type implant to protect other silicon areas from the P-type dopant. The photoresist mask is subsequently removed.

Borophosphotetraethylorthosilicate ("BPTEOS", not shown) is deposited on top of the structure and reflowed to achieve a relatively smooth upper glass surface. The BPTEOS deposition and reflow are preferably done at sufficiently high temperature to anneal the structure. The just implanted P-type dopant is thereby activated, and lattice damage is again repaired. As a result, the various heavily doped P-type portions of upper epitaxial layer 30 not covered by field oxide 44 become (a) the P+ portions of source/drain zones 54 and 68 in FIGS. 2.1 and 2.3, (b) P+ main drain zone 80 and the P+ portion of source 78 in FIG. 2.6, and (c) P+ contact zones 60B and 60D in FIGS. 2.3 and 2.6. The P– portions of (a) source/drain zones 54 and 68 in FIGS. 2.1 and 2.3 and (b) source 78 in FIG. 2.6 are likewise produced from the portions of P– zones 178–182 outside the P+ source/drain portions. During the anneal provided by the BPTEOS deposition and reflow, the various implanted dopants are also driven (diffused) deeper into the epitaxial layer 30 to complete the FET fabrication up through the stage shown in FIGS. 2.1, 2.3, 2.5, and 2.6.

Bipolar transistors and other semiconductor elements such as capacitors, Schottky diodes, and EPROM cells can be added to the core process in the manner shown in Table 2. Any ion-implantation steps incorporated into the core process to produce such additional elements are masked out in the structural areas containing the core FETs.

7. Fabrication of Bipolar Transistors

Figure 12A:
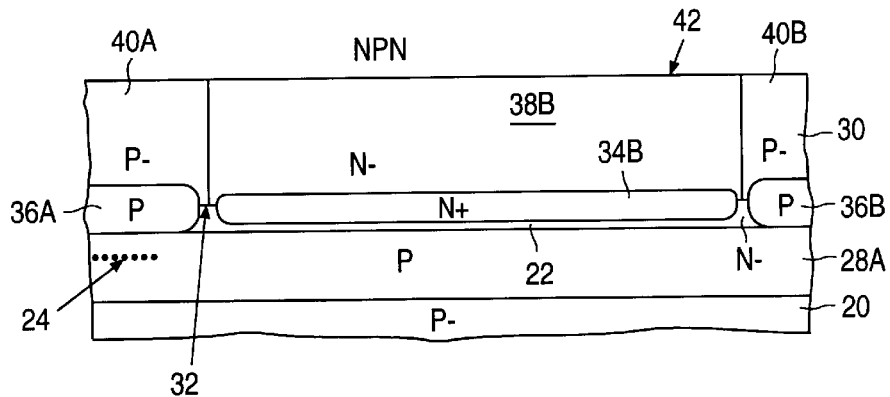
FIGS. 12a–12f are cross-sectional structural views representing stages in fabricating the NPN transistor of FIG. 2.2.

FIGS. 12a–12f (collectively "FIG. 12") illustrate how the NPN transistor of FIG. 2.2 is manufactured from the structure of FIG. 1. The small circles and "xs" in FIG. 12 have the meanings used above. Fabrication of the NPN transistor involves the high-dosage N-type and P-type (source/drain) implants of the complementary FET process core of FIG. 11, a moderate-dosage P-type base implant, and a high-dosage N-type collector sink implant. All other implants are masked out in the NPN area of the overall structure. N– device region 38B in FIG. 12a is utilized for the NPN transistor.

Figure 12B:
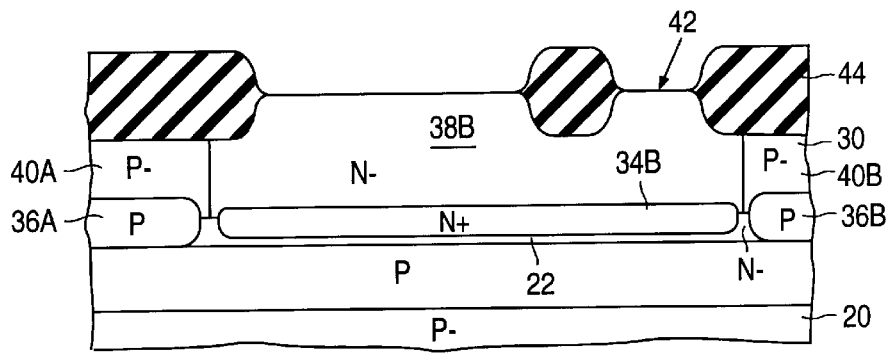
Figure 12C:
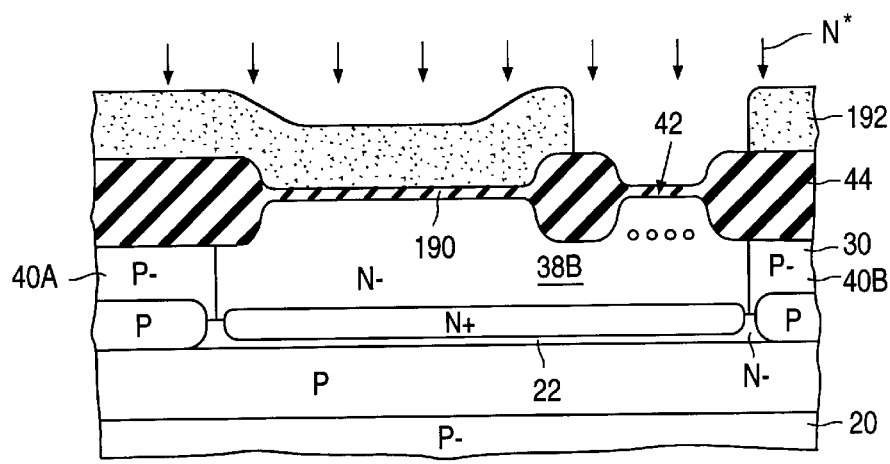

Starting from the structure of FIG. 12a, field oxide 44 is provided along upper epitaxial surface 42 as shown in FIG. 12b. Thin layers 190 of silicon oxide are thermally grown along upper surface 42. See FIG. 12c. Using a photoresist mask 192, the collector sink implant is performed by ion implanting an N-type dopant, typically phosphorus, at a high dosage and a moderate-to-high energy through oxide 190 into the far right-hand part of device region 38B in FIG. 12c. Photoresist 192 is subsequently removed. Item 64 in FIG. 12d generally indicates the location of the N-type sinker dopant at this point in the process.

Figure 12D:
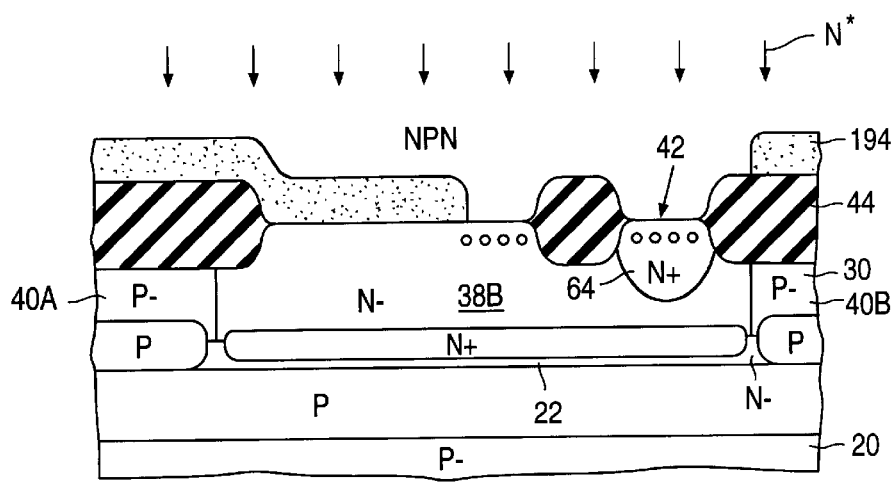
Figure 12E:
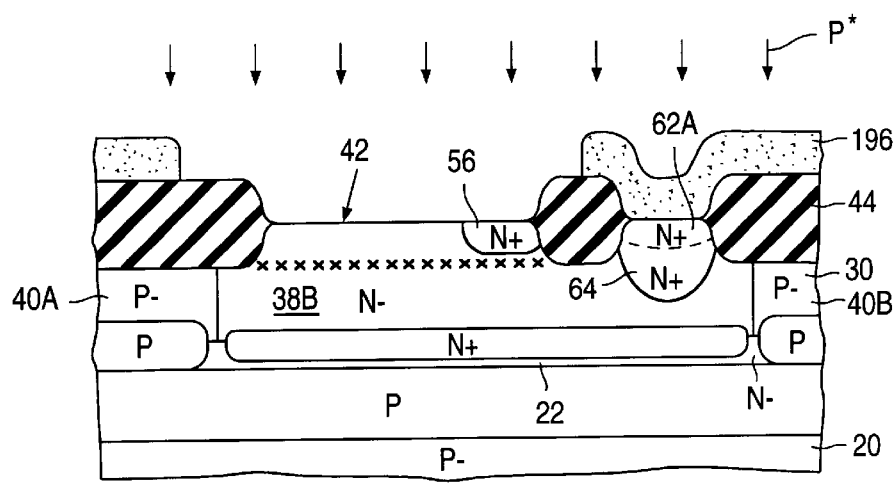

Next, N+ emitter 56 and N+ collector contact zone 62A are defined. Using a photoresist mask 194, the high-dosage N-type (source/drain) implant is performed into N– device region 38B through portions of upper surface 42 overlying the intended locations for emitter 56 and collector contact zone 62A. See FIG. 12d. Photoresist 194 is subsequently removed. FIG. 12d indicates where the N-type dopant that later forms emitter 56 and collector contact zone 62A is located at this point.

Finally, P base 58 and P+ base contact zone 60A are defined. Using a photoresist mask 196, a P-type base dopant, typically boron, is ion implanted at a moderate dosage and a low energy through upper surface 42 into the left-hand portion of N– device region 30B at the location for base 58. See FIG. 12e. Photoresist 196 is then removed.

Figure 12F:
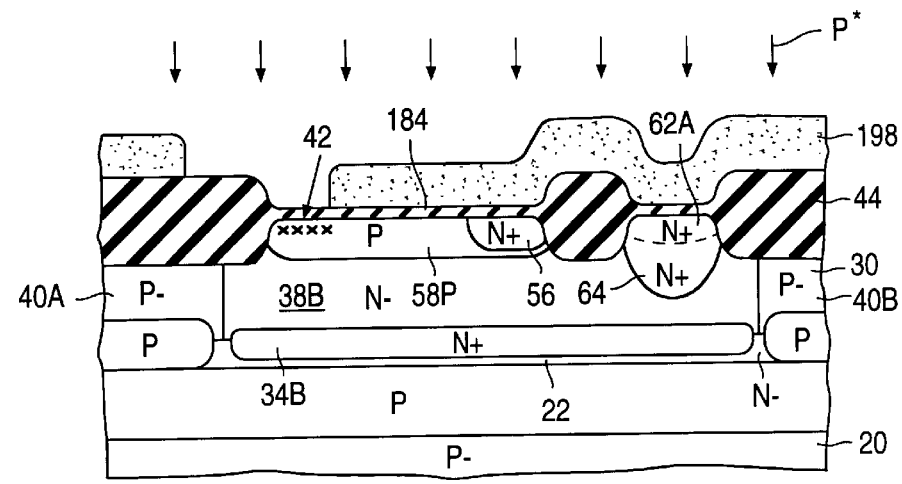

Sealing oxide layers 184 are thermally grown as described above. During the growth of sealing oxide 184, the recently implanted N-type and P-type dopants are activated and driven further into upper epitaxial layer 30. A moderately doped P-type zone 58P that constitutes a precursor to base 58 is thereby produced as shown in FIG. 12f.

Using a photoresist mask 198, the high-dosage P-type (source/drain) implant is performed through the portion of oxide 184 overlying the intended location for P+ base contact zone 60A. Photoresist 198 is subsequently removed. The just implanted P-type dopant is activated during the anneal that accompanies the subsequent BPTEOS deposition/reflow. During the BPTEOS deposition/reflow, the various implanted dopants are also driven deeper into upper epitaxial layer 30 to produce the NPN transistor of FIG. 2.2. The remainder of P zone 58P is base 58.

Figure 13:
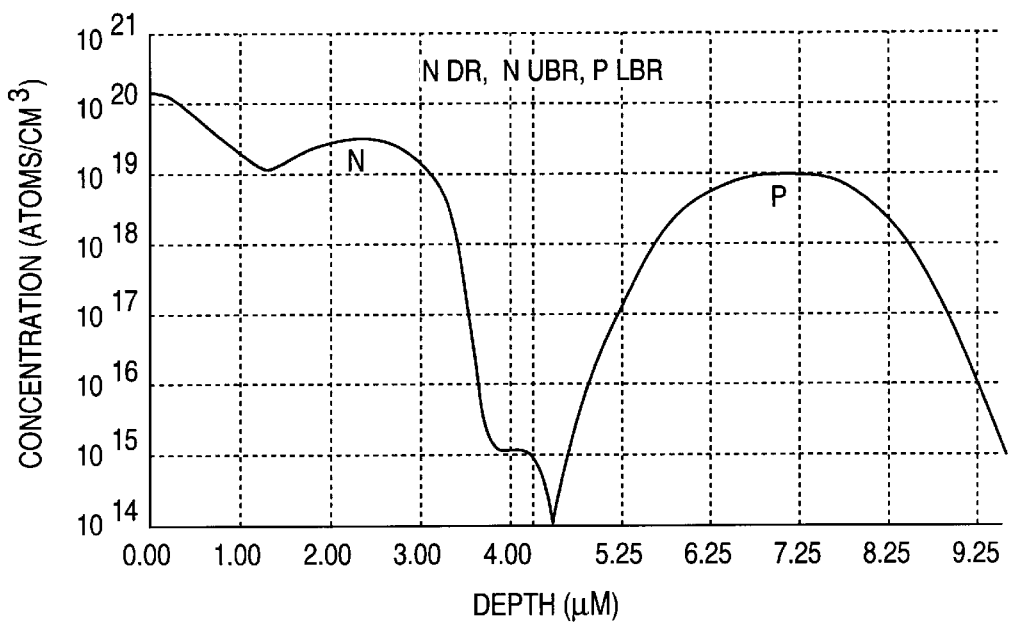
FIG. 13 is a graph of dopant concentration as a function of depth at one location for the embodiment of the NPN transistor of FIG. 2.2 as produced according to the composite process of FIGS. 9a–9f, 9g.1–9n.2, and 12a–12f.

FIG. 13 depicts a computer-simulated dopant concentration profile through one part of the NPN transistor of FIG. 2.2 as fabricated according to the process of FIGS. 9 and 12. The concentration profile of FIG. 13 is taken through a cross section having an N+ sinker zone, an N– device region 30, an N+ upper buried region 34, and a P lower buried region 28. An example is regions 64, 38B, 34B, and 28A used for the NPN transistor of FIG. 2.2.

Figure 14A:
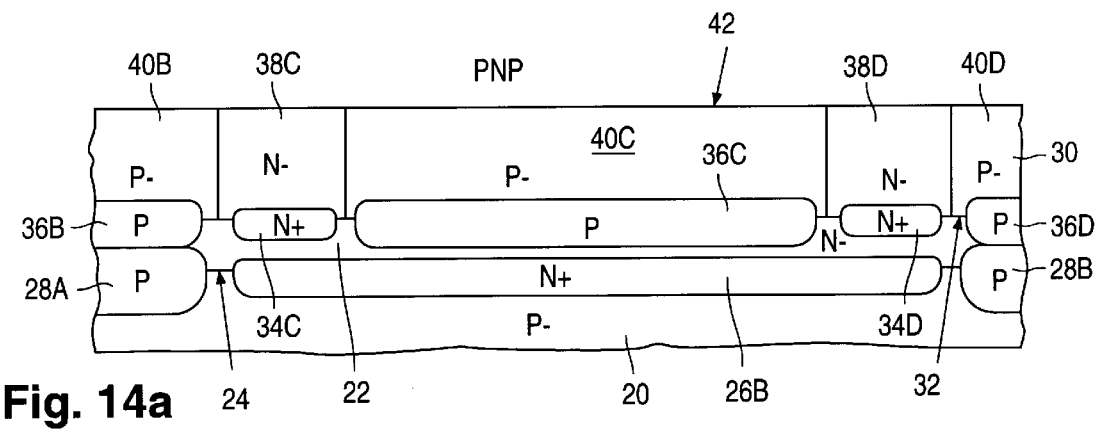
FIGS. 14a–14e are cross-sectional structural views representing stages in fabricating the PNP transistor of FIG. 2.4.

FIGS. 14a–14e (collectively "FIG. 14") illustrate how the PNP transistor of FIG. 2.4 is manufactured from the structure of FIG. 1. The small circles and "xs" in FIG. 14 have the above-described meanings. Fabrication of the PNP transistor involves the high-dosage N-type and P-type (source/drain) implants of the FET core process of FIG. 11 and a moderate-dosage N-type base implant. All other implants are masked out in the PNP area. P– device region 40C in FIG. 14a is utilized for the PNP transistor, with N– device region 38C/38D providing lateral isolation.

Figure 14B:
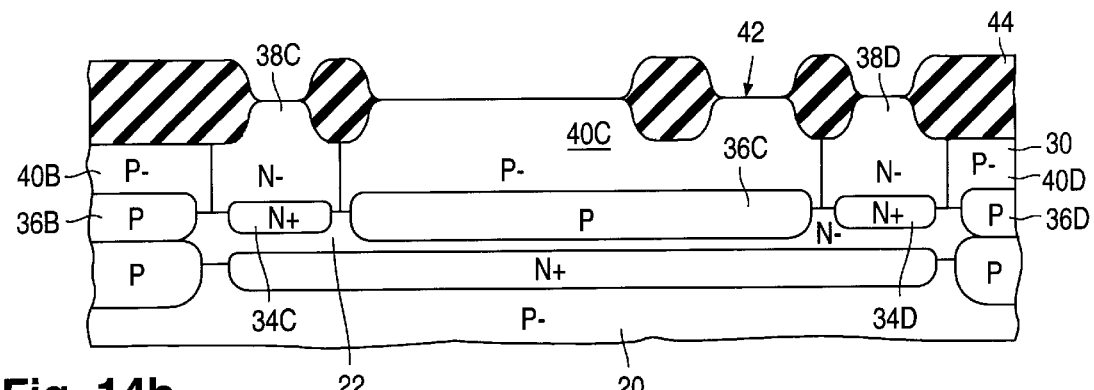
Figure 14C:
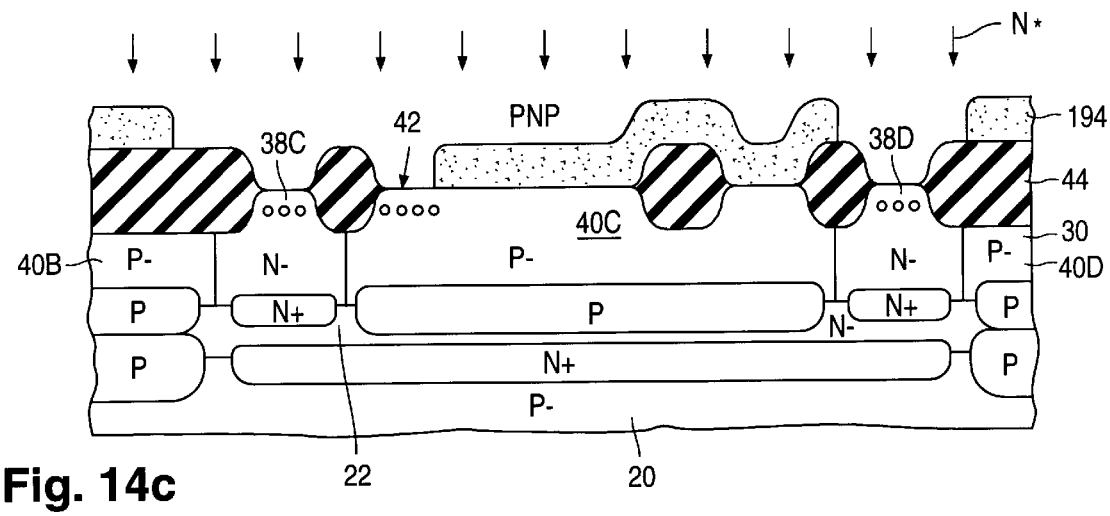
Figure 14D:
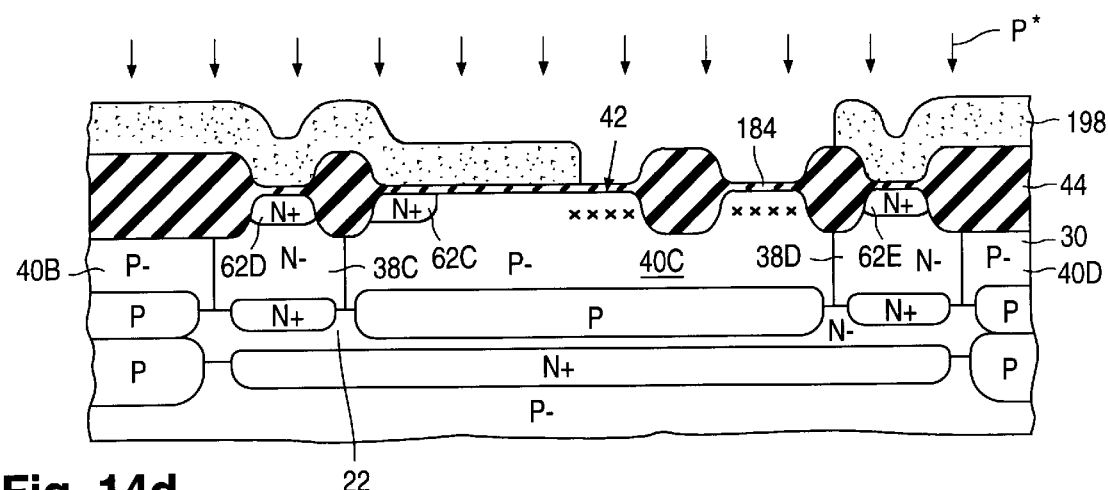

Starting from the structure of FIG. 14a, field oxide 44 is created as shown in FIG. 14b. After forming photoresist mask 194, the high-dosage N-type (source/drain) implant is performed into device regions 40C, 38C, and 38D through portions of upper epitaxial surface 42 overlying the intended locations for base contact zone 62C and side contact zones 62D and 62E. See FIG. 14c. With photoresist 194 having been removed after the high-dosage N-type implant, sealing oxide layers 184 are grown along upper surface 42 as described above. The just-implanted N-type dopant is activated and driven further into upper epitaxial layer 30 during the growth of sealing oxide 184 to produce contact zones 62C–62E as shown in FIG. 14d.

Next, P+ emitter 70 and P+ collector contact zone 60C are defined. Using photoresist mask 198, the high-dosage P-type (source/drain) implant is performed through the portions of oxide 184 overlying the intended locations for emitter 70 and collector contact zone 60C. See FIG. 14d. With photoresist 198 having been removed after the high-dosage P-type implant, FIG. 14e indicates where the P-type dopant that later forms emitter 70 and collector contact zone 60C is located at this point.

Figure 14E:
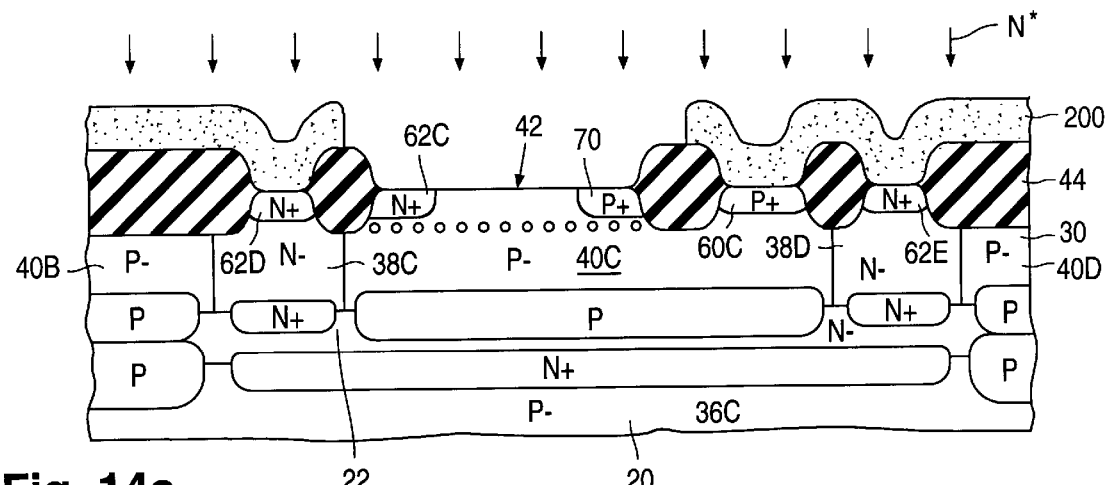

Finally, N base 72 is defined. Oxide layers 184 are removed. Using a photoresist mask 200, an N-type dopant, typically phosphorus, is ion implanted at a moderate dosage and a low energy through upper surface 42 into the left-hand portion of P– device region 40C as shown in FIG. 14e. Photoresist 200 is then removed. The recently implanted N-type and P-type dopants are activated during the anneal provided by the subsequent BPTEOS deposition/reflow. The various implanted dopants are also driven further into epitaxial layer 30 during the BPTEOS deposition/reflow to produce the PNP transistor of FIG. 2.4.

8. Fabrication of Polysilicon Capacitors and Schottky Diodes

Figure 15A:
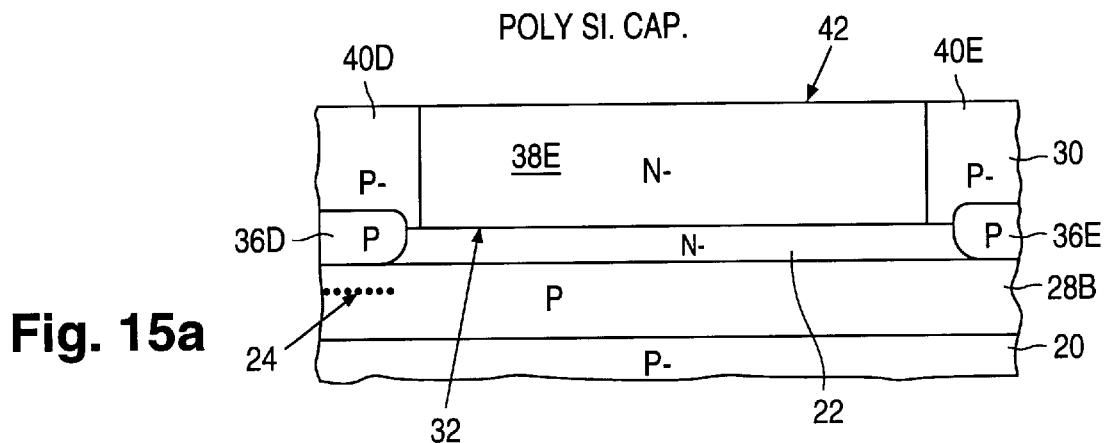
FIGS. 15a–15e are cross-sectional structural views representing stages in fabricating the polysilicon capacitor of FIG. 2.7.

FIGS. 15a–15e (collectively "FIG. 15") depict how the polysilicon capacitor of FIG. 2.7 is fabricated from the structure of FIG. 1. In manufacturing the polysilicon capacitor, the high-dosage N-type (source/drain) implant of the complementary FET process core of FIG. 11 is employed in combination with the high-dosage N-type sinker implant of FIG. 12. Other implants are masked out in the polysilicon capacitor area. N– device region 38E in FIG. 15a is utilized for the polysilicon capacitor.

Figure 15B:
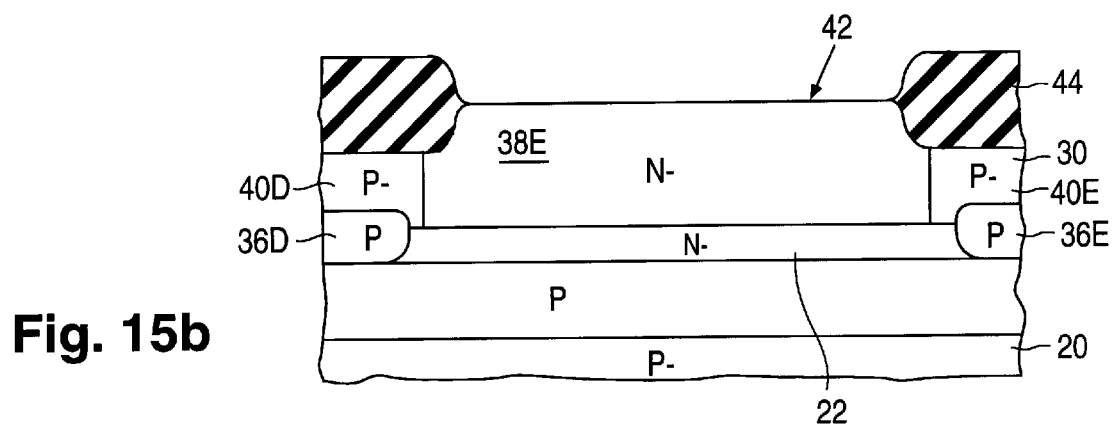
Figure 15C:
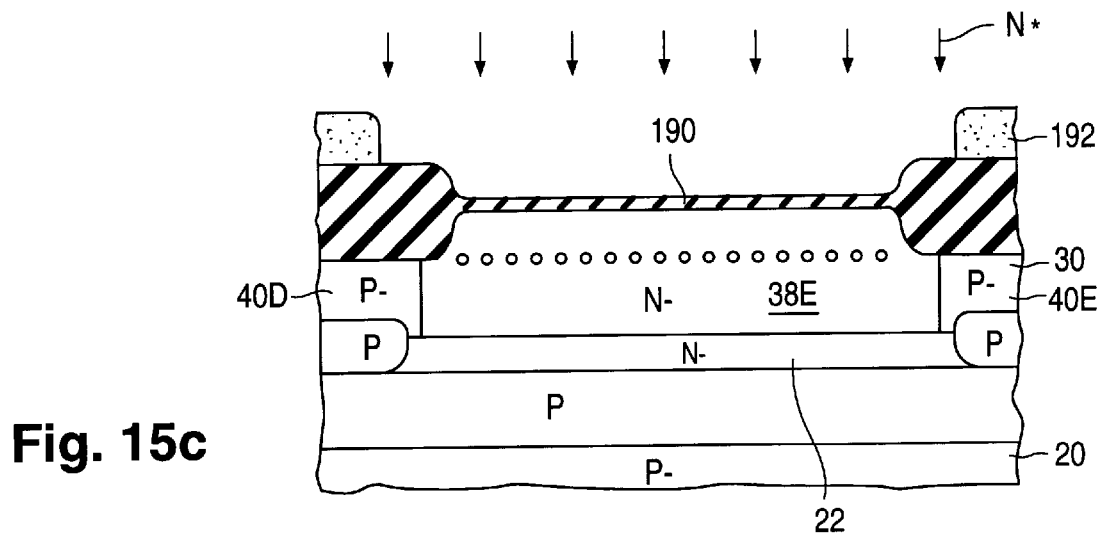

Beginning with the structure of FIG. 15a, field oxide 44 is created as shown in FIG. 15b. After growing one of oxide layers 190 along the top of N– device region 38E and forming photoresist mask 192 so that substantially all of oxide layer 190 is exposed, the N-type sinker implant is performed through oxide 190 into device region 38E. See FIG. 15c. The small circles in FIG. 15c indicate the mean depth of the N-type sinker dopant. With photoresist 192 having been removed after the sinker implant, item 82 in FIG. 15d generally indicates the location of N+ lower plate 82 at this point in the process.

Figure 15D:
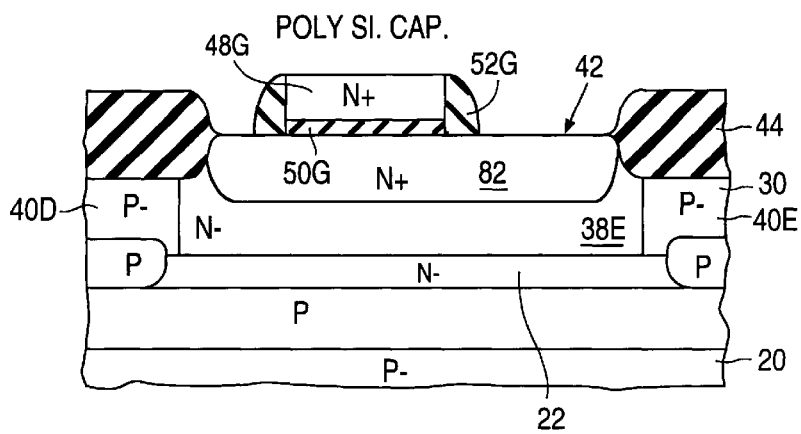
Figure 15E:
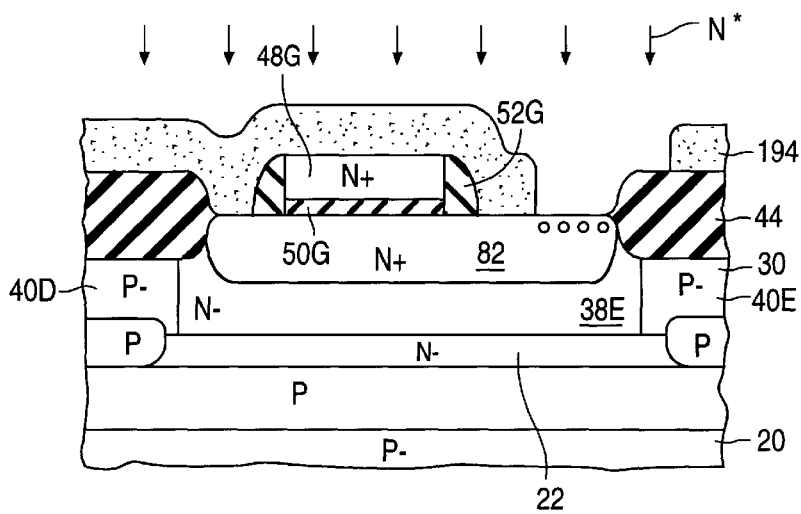

N+ upper plate 48G and capacitor dielectric layer 50G, along with spacers 52G, are then formed over N+ lower plate 82 as shown in FIG. 15d. Upper plate 48G, dielectric layer 50G, and spacers 52G are created at the same time, and in the same manner, as N+ gate electrodes 48A and 48C, gate dielectric layers 50A and 50C, and spacers 52A and 52C of the low-voltage N-channel FETs.

After creating photoresist mask 194 in such a way as to expose a portion of N+ lower plate 82 spaced well apart from N+ upper plate 48G, the high-dosage N-type (source/drain) implant is performed into lower plate 82 at the location for N+ contact zone 62I. See FIG. 15e. With photoresist 194 having been removed after the high-dosage N-type implant, the recently implanted N-type dopants are activated and driven further into upper epitaxial layer 30 during the subsequent formation of sealing oxide 184 (not otherwise relevant here). The polysilicon capacitor is thereby produced as shown in FIG. 2.7.

Figure 16:
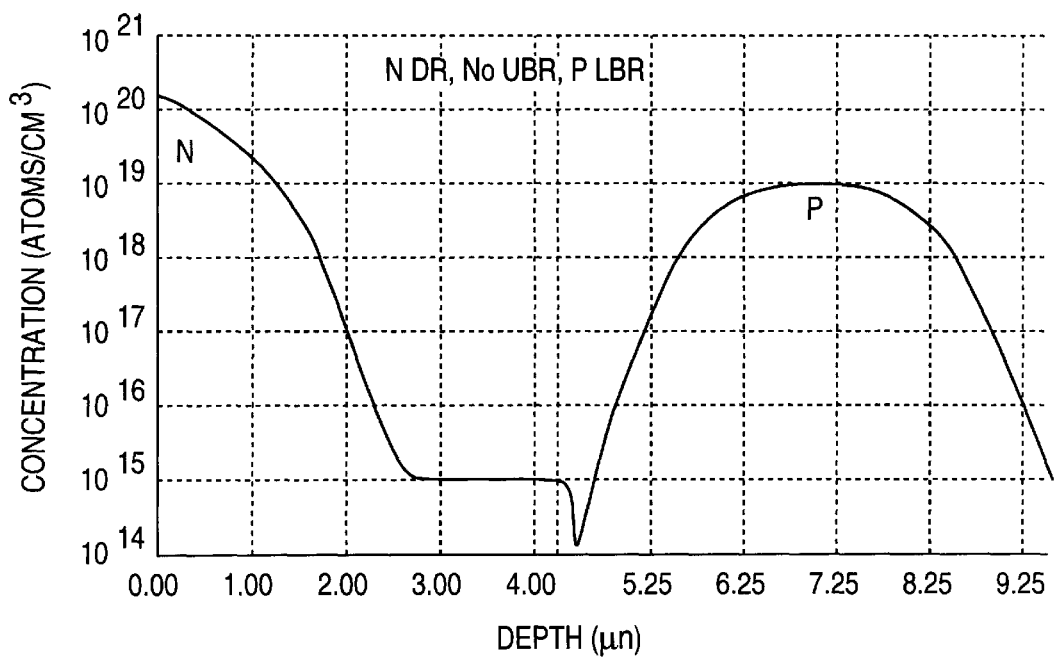
FIG. 16 is a graph of dopant concentration as a function of depth at one location for the embodiment of the polysilicon capacitor of FIG. 2.7 as produced according to the composite process of FIGS. 9a–9f, 9g.1–9n.2, and 15a–15e.

FIG. 16 depicts a computer-simulated dopant concentration profile through one part of the polysilicon capacitor of FIG. 2.7 as fabricated according to the process of FIGS. 9 and 15. The concentration profile is taken through an N+ sinker zone, an N– device region 30, and a P lower buried region 28, but no upper buried region. An example is regions 82, 38E, and 28B used for the polysilicon capacitor of FIG. 2.7.

Figure 17A:
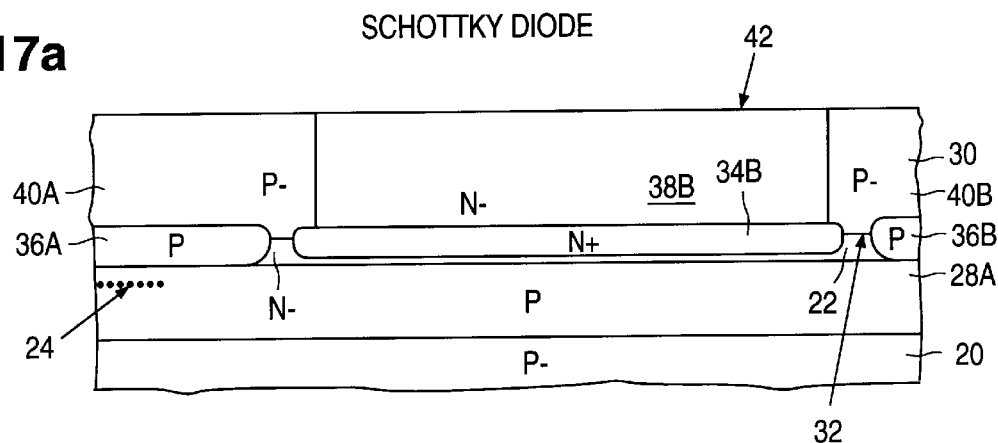

FIGS. 17a–17f (collectively "17") illustrate how the Schottky diode of FIG. 2.8 is created from the structure of FIG. 1. The only implants utilized in manufacturing the Schottky diode are the high-dosage N-type and P-type (source/drain) implants of the complementary FET process core of FIG. 11. All other implants are masked out in the Schottky diode area. N– device region 38B in FIG. 17a is employed for the Schottky diode.

Figure 17B:
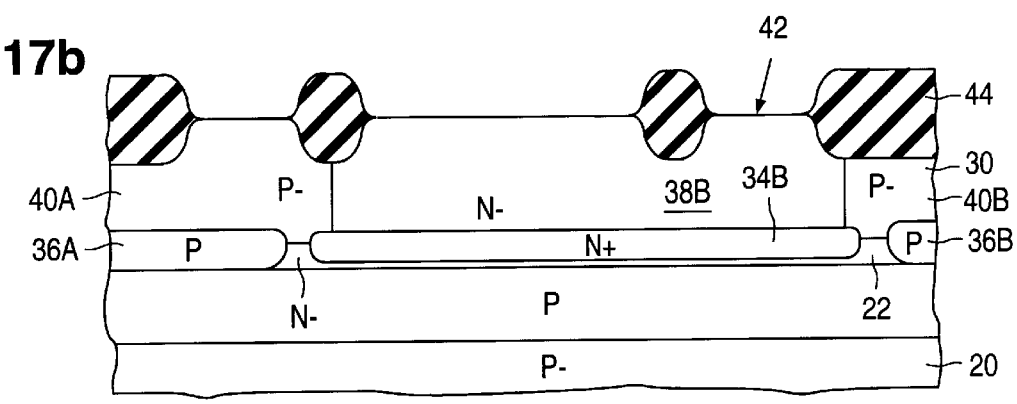
Figure 17C:
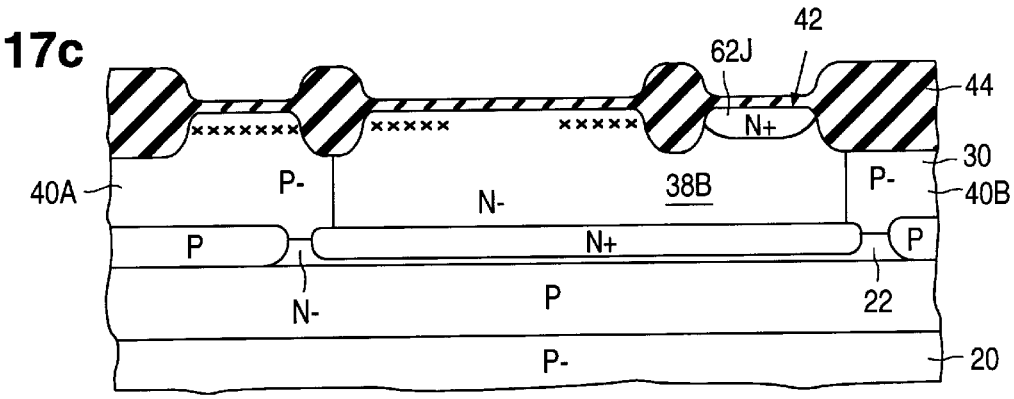

Beginning with the structure of FIG. 17a, field oxide 44 is provided as shown in FIG. 17b. Using a suitable photoresist mask (194, not shown here), the high-dosage N-type (source/drain) implant is performed into upper epitaxial layer 30 at the location for N+ cathode contact zone 62J. During the formation of sealing oxide 184 along the exposed silicon, the N-type dopant is activated to produce N+ contact zone 62J as depicted in FIG. 17c.

Using another photoresist mask (198, not shown here), the high-dosage P-type (source/drain) implant is performed through sealing oxide 184 into epitaxial layer 30 at the locations for P+ guard ring 84 and P+ substrate contact zone 60E. After removing sealing oxide 184, the BPTEOS deposition/reflow is performed to produce BPTEOS dielectric 86 having a relatively flat upper surface. See FIG. 17d.

During the anneal provided by the BPTEOS deposition/ reflow, the P-type dopant is activated and driven deeper into epitaxial layer 30 to produce guard ring 84 and substrate contact zone 60E. N+ cathode contact zone 62J is also driven further into layer 30 during the BPTEOS deposition/ reflow.

Using a suitable photoresist mask (not shown), an opening 202 is etched through dielectric layer 86 down to the portion of upper semiconductor surface 42 enclosed by guard ring 84. See FIG. 17e. Opening 202 also exposes part of guard ring 84. A thin layer of refractory metal, typically platinum, is deposited on top of the structure, including into opening 202. The metal is sintered to produce a thin layer 88 of metal silicide along the silicon exposed through opening 202. Platinum silicide is produced when the deposited metal is platinum. The unreacted metal lying on dielectric 86 is removed with a suitable etchant, aqua regia in the platinum case.

Using a photoresist mask (not shown), openings 204A and 204B are etched through dielectric 86 respectively down to cathode contact zone 62J and substrate contact zone 60E as shown in FIG. 17f. A layer of barrier metal, typically titanium-tungsten, is deposited on top of the structure, including into openings 202, 204A, and 204B. A layer of primary interconnect metal, typically tungsten, is deposited on the barrier metal. The primary interconnect metal could alternatively be an aluminum alloy. The primary-interconnect and barrier metal layers are then patterned using another photoresist mask (also not shown) to produce metallic contacts 90 for the Schottky diode of FIG. 2.8.

9. Variations of Two-Level Buried-Layer Configuration, Including Special Bipolar Transistors FIG. 18 illustrates how a variation of the structure of FIG. 1 utilizes two levels of buried layers for achieving vertical isolation in accordance with the invention. Depicted in FIG. 18 are an isolated low-voltage N-channel insulated-gate FET, an isolated low-voltage P-channel insulated-gate FET, and an NPN transistor formed with the same device region as the P-channel FET.

FIGS. 19.1 and 19.2 (collectively "FIG. 19") illustrate how two levels of buried layers are employed to achieve vertical isolation according to the invention in another variation of the structure of FIG. 1. The two structural sections in FIG. 19 may be laterally separated or may adjoin each other. Depicted in FIG. 19.1 is a special NPN transistor whose base includes the portion of a P-type device region outside the emitter and which is formed without using a separate base mask to introduce the base dopant. FIG. 19.2 depicts a special PNP transistor whose base similarly includes the portion of an N-type device region outside the emitter and which is also formed without using a separate base mask to introduce the base dopant.

As discussed further below, a separate masking step is utilized in forming the base of the NPN transistor in FIG. 18. Accordingly, the NPN transistor of FIG. 18 is typically not present in an integrated circuit that contains the NPN transistor of FIG. 19.1, and vice versa. However, the structures of FIGS. 18 and 19 are otherwise quite similar to each other. For this reason, the two structures are, in part, described in the following paragraphs as if they were one structure.

The transistors of FIGS. 18 and 19 are constructed from a monocrystalline silicon semiconductive substrate consisting of a heavily doped P-type substructure 218 and an overlying lightly doped major P-type substrate region 220. The resistivity of P+ substructure 218 is less than 0.03 ohm-cm. P− substrate region 220 has a resistivity of 5–50 ohm-cm, typically 20 ohm-cm, just like P− substrate region 20 in the structure of FIG. 1.

A lower epitaxial silicon layer 222 is situated on P− substrate region 20 along a lower metallurgical semiconductor interface 224. Lower epitaxial layer 222 may be provided in intrinsic or lightly doped (N-type or P-type) form. The thickness of layer 222 is 1–6 $\mu$m, typically 3 $\mu$m.

A moderately doped N-type lower buried layer formed with N regions 226A–226C (collectively "226") is located along lower semiconductor interface 224. A moderately doped P-type lower buried layer consisting of P regions 228A–228F is also located along lower interface 224. N buried regions 226 and P buried regions 228 form a lower level of buried regions generally analogous to buried regions 26 and 28 in the structure of FIG. 1. Each of lower buried regions 226 and 228 extends partway into both substrate region 220 and epitaxial layer 222. In contrast to FIG. 1 where N+ buried regions 26 are spaced laterally apart from P buried regions 28, each N buried region 226 in the example of FIGS. 18 and 19 laterally adjoins one or more of P buried regions 228.

The sheet resistance of N lower buried regions 226 is 200–2000 ohms/sq., typically 800 ohms/sq. This is somewhat higher than the sheet resistance of N+ lower buried regions 26 in the structure of FIG. 1 because N buried regions 226 here adjoin P buried regions 228. However, one less masking step is needed to form buried regions 226 and 228 in FIGS. 18 and 19 than buried regions 26 and 28 in FIG. 1. Each P buried region 228 has a greater net dopant concentration than P− substrate 220. The sheet resistance of P buried regions 228 is 200–800 ohms/sq., typically 400 ohms/sq.

Certain of P lower buried regions 228 are continuous with one another outside the planes of FIGS. 18 and 19. For example, buried regions 228A and 228B in FIG. 18 are laterally connected to form a single P lower buried region 228A/228B that laterally surrounds N lower buried region 226A. Similarly, lower buried regions 228C and 228D in FIG. 19.1 laterally connect to each other to form a P lower buried region 228C/228D that laterally surrounds N lower buried region 226B. Certain of N lower buried regions 226 may also be continuous with one another outside the planes of FIGS. 18 and 19.

An upper epitaxial silicon layer 230 is situated on lower epitaxial silicon layer 222 along an upper metallurgical semiconductor interface 232. Upper epitaxial layer 230 is preferably furnished in intrinsic form. Epitaxial layer 230 has a thickness of 0.8–3.0 $\mu$m, typically 2.2 $\mu$m.

A heavily doped N-type upper buried layer consisting of N+ regions 234A–234F (collectively "234") is located along upper semiconductor interface 232. A moderately doped P-type upper buried layer consisting of P regions 236A–236I (collectively "236") is likewise situated along upper semiconductor interface 232. N+ upper buried regions 234 and P upper buried regions 236 form an upper level of buried regions analogous to buried regions 34 and 36 in the structure of FIGS. 1 and 2. Each of buried regions 234 and 236 extends partway into both of epitaxial layers 222 and 230. As with lower buried regions 226 and 228, each N+ upper buried region 234 in the example of FIGS. 18 and 19 laterally adjoins one or more of P upper buried regions 238.

N+ upper buried regions 234 variously overlie lower buried regions 226 and 228. P upper buried regions 236 likewise variously overlie buried regions 226 and 228. In the example shown in FIGS. 18 and 19, each upper buried region 234 or 236 that overlies one of buried regions 226 and 228 meets that lower buried region 226 or 228. This is necessary when lower epitaxial layer 222 is furnished in intrinsic form. As indicated in FIG. 18, N+ upper buried region 234A meets underlying N buried region 226A. N+ upper buried region 234B in FIG. 18 meets both of underlying buried regions 226A and 228B.

If lower epitaxial layer 222 were lightly doped N-type, each P upper buried region 236 that overlies one of P lower buried regions 228 would still need to contact that P buried region 228 to form an electrical connection. However, each N+ upper buried region 234 that overlies one of N buried regions 226 could be vertically separated from that buried region 226. An electrical connection between those two N-type buried regions 234 and 226 would be provided by the intervening lightly doped N-type epitaxial material as in FIG. 1. The reverse would arise if epitaxial layer 222 were lightly doped P-type.

Certain of N+ upper buried regions 234, although labeled with reference symbols that end with different letters, are continuous with one another outside the planes of FIGS. 18 and 19. In particular, N+ upper buried regions 234A and 234B in FIG. 18 are laterally connected to form an N+ upper buried region 234A/234B that laterally surrounds P upper buried region 236B. Likewise, N+ upper buried regions 234C and 234D in FIG. 19.1 laterally connect to each other to form an N+ upper buried region 234C/234D that laterally surrounds P upper buried region 236E. N+ upper buried regions 234E and 234F in FIG. 19.2 are laterally connected to form an N+ upper buried region 234E/234F that laterally surrounds P upper buried region 236H. Certain of P buried regions 236 are similarly continuous with one another outside the planes of FIGS. 18 and 19.

Upper epitaxial layer 230 is divided into a group of lightly doped N-type device regions 238A–238G (collectively "238") and a group of lightly doped P-type device regions 240A–240J (collectively "240"). N– device regions 238 and P– device regions 240 have the same respective characteristics as N– device regions 38 and P– device regions 40 in the structure of FIG. 1. For example, each N– device region 238 laterally adjoins one or more of P– device regions 240, and vice versa. Device regions 238 and 240 are more lightly doped than respective upper buried regions 234 and 236.

Each of device regions 238 and 240 extends from upper surface 242 of epitaxial layer 230 down to one or more of upper buried regions 234 and 236. In particular, P– device region 240B and underlying P upper buried region 236B in FIG. 18 form a P-type well 240B/236B for the isolated N-channel FET. N– device region 238B and underlying N+ upper buried region 234B in FIG. 18 form an N-type well 238B/234B for the isolated P-channel FET and the accompanying NPN transistor. P– device region 240E and P upper buried region 236E in FIG. 19.1 form a P-type well 240E/236E for the special NPN transistor. A device region 238 or 240 which is not fully underlain by one or more of upper buried regions 234 and 236 typically extends all the way down to upper semiconductor interface 232.

Certain of N– device regions 238, although labeled with reference symbols that end with different letters, are continuous with one another outside the planes of FIGS. 18 and 19. The same applies to P– device regions 240. These connections of device regions 238 and 240 are described in more detail in the following paragraphs. With device regions 238 and 240 so connected, the two levels of buried layers enable vertical electrical isolation—i.e., the absence of a resistive connection—to be achieved in the structures of FIGS. 18 and 19 according to the principles of the invention.

Turning specifically to the structure of FIG. 18, P device region 240B and underlying P upper buried region 236B are utilized for the isolated N-channel FET. N– device regions 238A and 238B are connected together to form a single N– device region 238A/238B that laterally surrounds P– device region 240B. N– device region 238A/238B overlies N+ upper buried region 234A/234B which, in turn, overlies N lower buried region 226A. The result is that regions 238A/238B, 234A/234B, and 226A form an N-type tub that surrounds composite P-type region 240B/236B along its lateral and lower surfaces—i.e., along the portions of its outside surface located within epitaxial layers 228 and 230. The N-type tub vertically and laterally isolates the N-channel FET of FIG. 18 from P– substrate region 220 and also from devices created in P-type regions other than P-type region 240B/236B. The fact that N+ upper buried region 234A/234B partially overlies both N lower buried region 226A and P lower buried region 228B is not particularly material to the isolation as long as N+ upper buried region 294A/234B meets N lower buried region 226A.

The N-channel FET in FIG. 18 is formed with a pair of heavily doped N-type source/drain zones 246 separated by a channel zone in P– device region 240B. A heavily doped N-type polysilicon gate electrode 248A is situated on a gate dielectric layer 250A above the channel zone. Device region 240B also has a heavily doped P-type surface contact zone (not shown). Aside from the differences in isolation configuration and the fact that LDD extensions are not shown in FIG. 18, the isolated N-channel FET of FIG. 18 is configured and operates in substantially the same way as the isolated N-channel FET of FIG. 2.3.

A similar comparison exists between the P-channel FETs of FIGS. 2.3 and 18. N– device region 238B and underlying N+ upper buried region 234B are utilized for the P-channel FET of FIG. 18. The P-channel FET has a pair of heavily doped P-type source/drain zones 254 separated by a channel zone in device region 238B. A heavily doped N-type polysilicon gate electrode 248B is situated on a gate dielectric layer 250B above the channel zone.

N– device region 238B has a heavily doped N-type contact zone 252A which is maintained at a high voltage. Consequently, the PN junction along the outside of N-type well 238B/234B automatically isolates the P-channel FET from devices created in N-type regions other than well 238B/234B. Aside from the differences in isolation configuration, the presence of the NPN transistor in well 238B/234B, and the absence of LDD extensions, the P-channel FET in FIG. 18 is configured and operates in largely the same manner as the P-channel FET of FIG. 2.3.

The NPN transistor in FIG. 18 consists of a heavily doped N-type emitter 256, a moderately doped P-type base 258, and an N-type collector formed with N+ upper buried region 234B and the overlying N-type material of device region 238B. Inasmuch as the collector also includes N+ contact zone 252A which is maintained at high voltage, the collector of the NPN transistor is maintained at high voltage. As with the P-channel FET created from N-type well 238B/234B, the PN junction along the outside surface of well 238B/234B automatically isolates the NPN transistor from devices created in N-type regions other than well 238B/234B.

Turning to the special NPN transistor of FIG. 19.1, the special NPN transistor centers around P– device region 240E and underlying P upper buried region 236E. N– device regions 238C and 238D laterally connect to each other to form an N– device region 238C/238D that laterally surrounds P– device region 240E. Letting reference symbol 240E/236E represent the composite P-type region formed by device regions 240E and 236E, the result is that regions 238C/238D, 234C/234D, and 226B form an N-type tub that surrounds P-type region 240E/236E along the portion of its outside surface located within epitaxial layers 222 and 230. The PN junction along the outside of the N-type tub isolates the NPN transistor from other NPN transistors in the structure and also from other P-channel FETs in the structure. The NPN transistor in FIG. 19.1 has a heavily doped N-type emitter 266 situated in P– device region 240E. The transistor's base is formed with P upper buried region 236E and the P-type portion of overlying device region 240E outside N+ emitter 266. Contact for the base is made through a heavily doped P-type contact zone 260B. The collector consists of the N-type tub formed with regions 226B, 234C/234D, and 238C/238D that surround the base laterally and from below. A heavily doped N-type collector contact zone 252B situated in N– device region 238C/238D completes the special NPN transistor.

P upper buried region 236E in the NPN transistor of FIG. 19.1 is utilized as part of the base to avoid having N+ emitter 266 punch through vertically to the collector during circuit operation. If upper epitaxial layer 230 is sufficiently thick, P buried region 236E could be replaced with an N+ upper buried region 234 that forms part of the collector. The base would then be formed solely with the P-type portion of device region 240E outside N+ emitter 266.

FIG. 19.1 further depicts a connection from upper surface 242 to P– substrate region 220. The surface-to-substrate connection is accomplished with a heavily doped P-type substrate contact zone 260C, underlying P– device region 240F, and underlying P buried regions 236F and 228F.

The special NPN transistor of FIG. 19.2 centers around N– device region 238F. P– device regions 240H and 240I are laterally connected to form a P– device region 240H/240I that laterally surrounds N– device region 238F. Device regions 240H/240I and 238F both overlie P upper buried region 236H. Consequently, regions 240H/240I and 236H form a P-type collector tub 240H/240I/236H that surrounds N– device region 238F along its lateral and lower surfaces.

N– device regions 238E and 238G laterally connect to each other to form an N– device region 238E/238G that laterally surrounds P-type region 240H/240I. N– device region 238E/238G overlies N+ upper buried region 234E/234F which, along with P upper buried region 236H, overlies N lower buried region 226C. Regions 238E/238G and 234E/234F thereby combine with region 226C to form an N-type tub that surrounds P-type collector tub 240H/240I/236H along the portions of its outside surface within epitaxial material 222 and 230. The N-type tub electrically isolates the PNP transistor of FIG. 19.2 from other PNP transistors in the structure and also from N-channel FETs in the structure.

The PNP transistor in FIG. 19.2 has a heavily doped P-type emitter 268 situated in N– device region 238F. The transistor's base consists of the N-type portion of device region 238F outside P+ emitter 268. The base is contacted through a heavily doped N-type contact zone 252C. The collector is formed with P-type tub 240H/240I/236H. The collector is contacted through a heavily doped P-type contact zone 260D situated in device region 240H/240I. A heavily doped N-type tub contact zone 252D is also provided in N– device region 238E/238G for the N-type tub.

Figure 20:
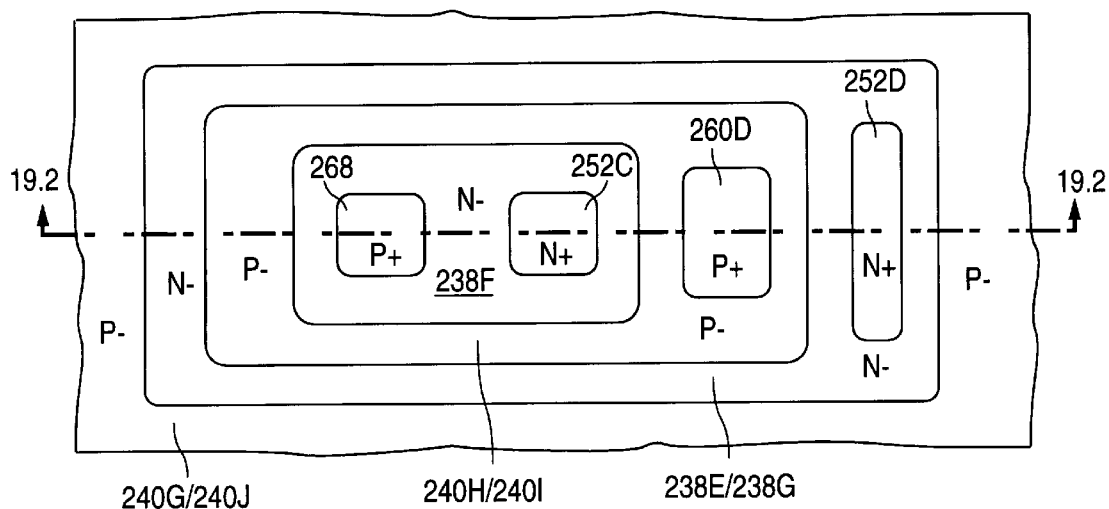
FIG. 20 is a top view below field oxide of the isolated transistor of FIG. 19.2. The cross section of FIG. 19.2 is taken through plane 19.2—19.2 in FIG. 20.

The general layout of the PNP transistor of FIG. 19.2 along upper semiconductor surface 242 below field-oxide region 244 is shown in FIG. 20. Field oxide 244 overlies all of upper surface 242 except where emitter 268 and contact zones 252C, 252D, and 260D are located. FIG. 20 shows how N– device region 238E/238G laterally surrounds P– device region 240H/240I which, in turn, laterally surrounds N– device region 238F. P– device regions 240G and 240J are also connected together to form a P– device region 240G/240J that laterally surrounds N– device region 238E/238G as depicted in FIG. 20.

10. Fabrication of Transistors in Variations of Two-Level Buried-Layer Configuration The steps involved in fabricating the buried layers and device regions in the structures of FIGS. 18 and 19 are typically the same. This part of the transistor fabrication process is illustrated in FIGS. 21a–21g (collectively "FIG. 21"). For convenience, FIG. 21 specifically illustrates the structural changes that lead to the structural section of FIG. 19.2.

Starting with a (100) monocrystalline silicon semiconductive substrate consisting of P+ substructure 218 and P– substrate region 220, a thin pad layer 270 of silicon oxide is thermally grown along the top of P– region 220. See FIG. 21a. A layer 272 of silicon nitride is deposited on pad oxide layer 270.

Figure 21A:
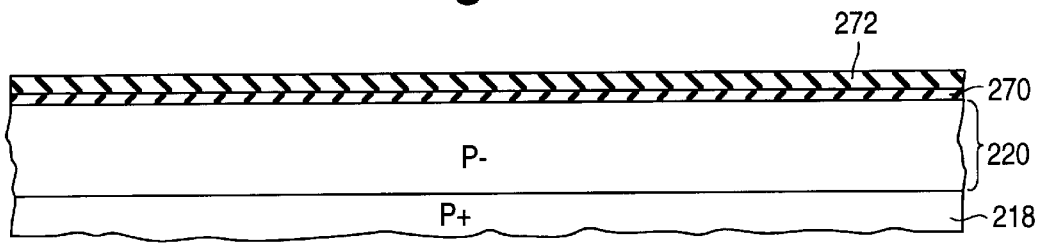
FIGS. 21a–21g are cross-sectional structural views representing stages in fabricating the transistors of FIGS. 18, 19.1 and 19.2.
Figure 21B:
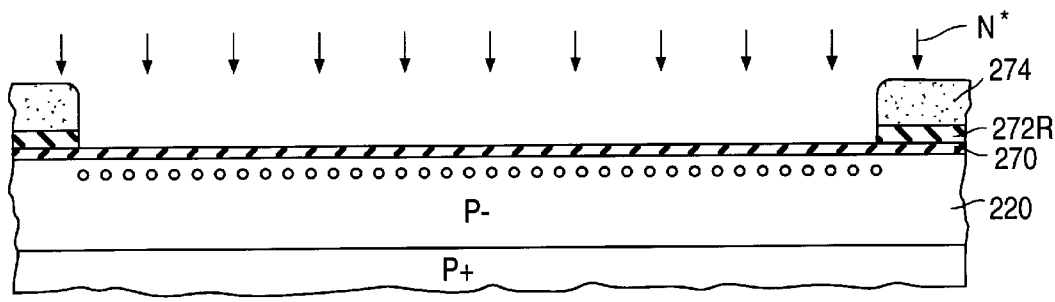

A photoresist mask 274 is formed on nitride layer 270 as shown in FIG. 21b. Photoresist mask 274 has openings at the general locations for N lower buried regions 226. An etch is performed to remove the nitride exposed through the mask openings. The remainder of nitride 274 is indicated as item 274R in FIG. 21b. An N-type dopant, preferably phosphorus, is ion implanted at a moderate dosage through the mask openings, through pad oxide 270, and into upper epitaxial layer 220. The small circles in FIG. 21b indicate the mean depth of the N-type implant.

Figure 21C:
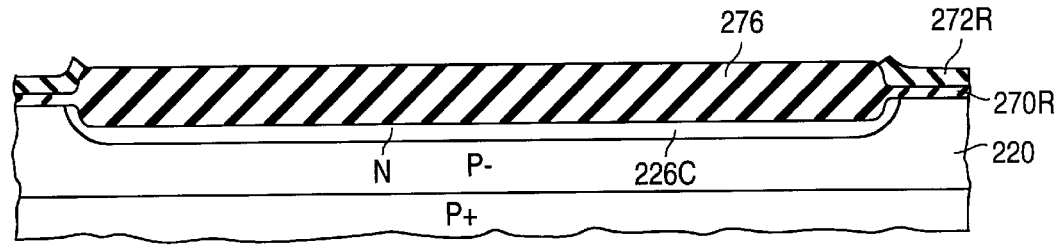
Figure 21D:
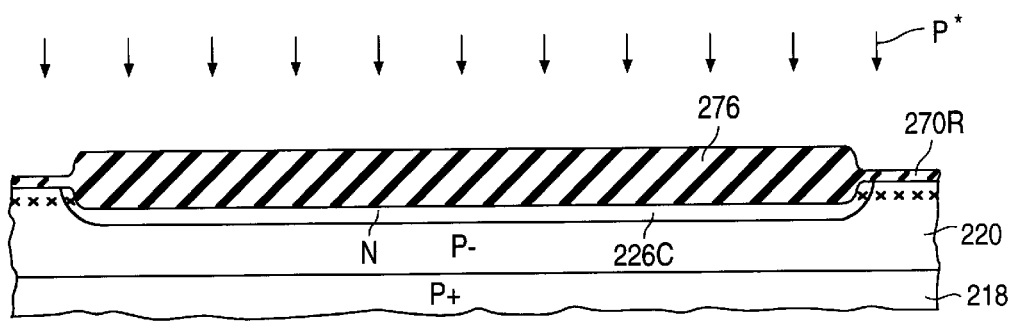

After removing photoresist 274, a thermal oxidation is performed to grow moderately thick silicon oxide 276 along the material of epitaxial layer 230 not covered by remaining nitride 272R. FIG. 21c shows the structure at this point. Oxide 276 reaches a thickness sufficient to act as a boron implantation mask. The remainder of oxide layer 270 is indicated as item 270R in FIG. 21c. During the oxidation, the implanted N-type dopant is activated and driven outward to the positions illustrated, for example, by item 226C in FIG. 21c. Lattice damage is also repaired.

Nitride 274R is removed to expose remaining pad oxide layer 270R. Using thick oxide 276 as a mask, a P-type dopant, typically boron, is ion implanted at a moderate dosage through oxide 270R and into upper epitaxial layer 220. See FIG. 21d. The small "xs" in FIG. 21d indicate the mean depth of the P-type implant. Inasmuch as oxide 276 substantially overlies N+ regions 226, the P-type implant is self-aligned to the previous N-type implant. The P-type dopant thus passes through oxide 270R at the locations for P lower buried regions 228.

Figure 21E:
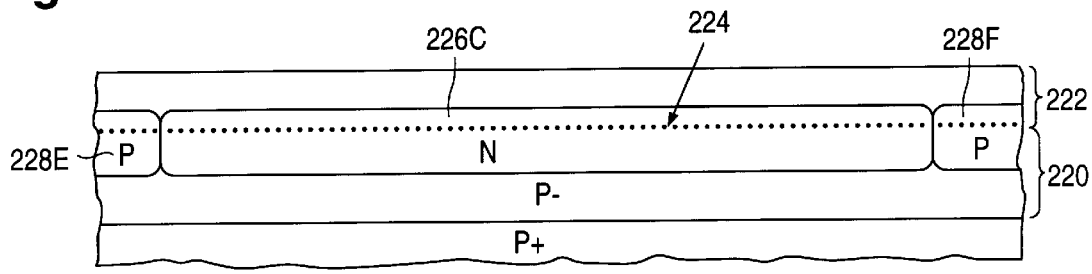

Oxide 276 is removed. The structure is annealed to activate the implanted P-type dopant and drive both implanted dopants further into substrate region 220. After removing any oxide that grew along the upper surface of the structure during the anneal, lower epitaxial layer 222 is deposited on top of substrate region 220. During the epitaxial deposition, part of each of the implanted N-type and P-type dopants updiffuses into epitaxial layer 222. N buried regions 226 and P buried regions 228 are thereby produced as indicated in FIG. 21e. The surface irregularities produced along lower semiconductor interface 224 due to the usage of oxide 276 are relatively small and are not shown in FIG. 21e.

Figure 21F:
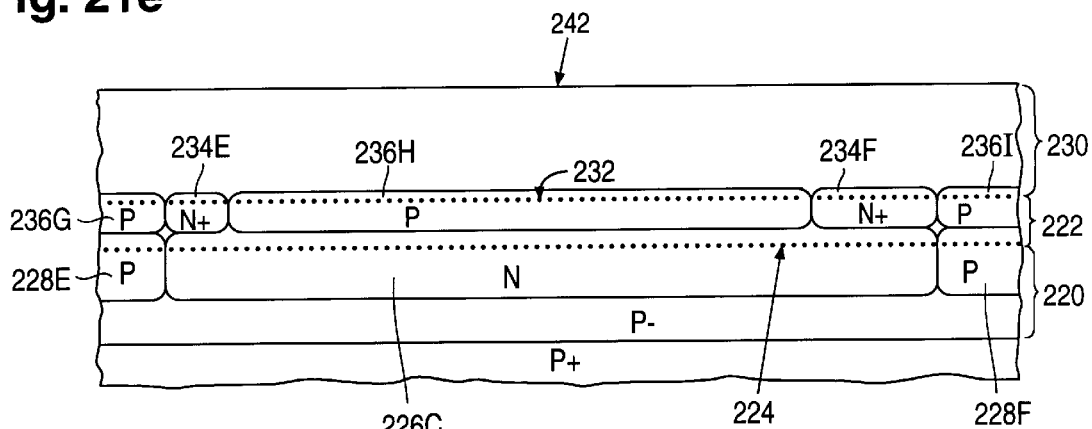

The steps of FIGS. 21a–21e are now repeated to form upper epitaxial layer 230 along with N+ upper buried regions 234 and P upper buried regions 236 as shown in FIG. 21f. The implant dosage used in forming N+ upper buried regions 234 is considerably higher than that used in forming N lower buried regions 226. The implant dosage used in forming P upper buried regions 236 can be the same as, or different from, that used in creating lower buried regions 228. The irregularities produced along upper semiconductor interface 232 as a result of using moderately thick field oxide as an implant mask during the second implantation are relatively small and are not shown in FIG. 21f.

The steps of FIGS. 21a–21d, including the removal of the thick oxide and a subsequent anneal, are repeated again, this time at appropriately lower N-type and P-type implant dosages, to produce N– device regions 238 and P– device regions 240. The specific recipe used in the partial process of FIGS. 9k–9n could, for example, be followed here. The resulting structure, as shown in FIG. 21g, is suitable for producing both the structure of FIG. 18 and the structure of FIG. 19.

Figure 21G:
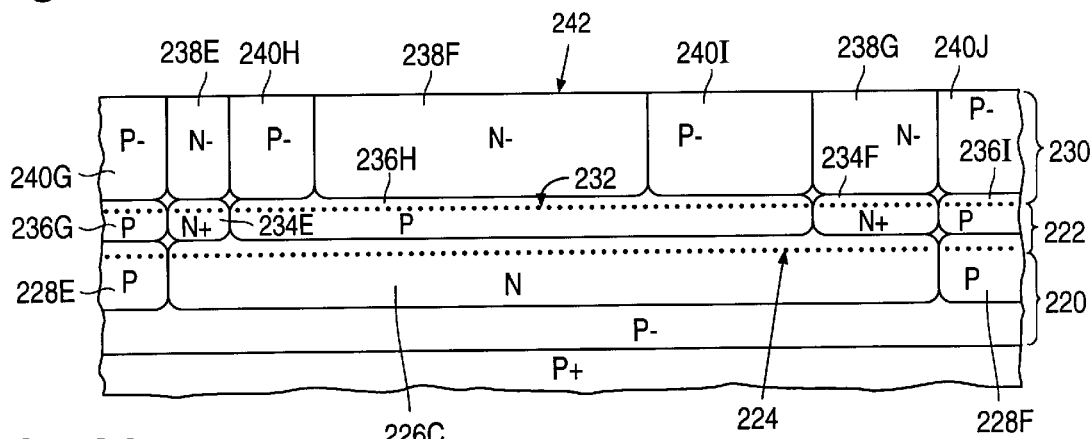

To convert the structure of FIG. 21g into the structure of FIG. 18, the portion of the process of FIGS. 11 and 12 used to complete fabrication of the transistors of FIGS. 2.2 and 2.3 is followed, except that the N-type collector sink implant and the steps dealing with the LDD extensions are deleted. That is, after creating field oxide 44 and forming the gate-electrode structures, (a) a high-dosage N-type source/drain implant is performed to define N+ source/drain zones 246, N+ emitter 256, and N+ contact zone 252A, (b) a high-dosage P-type source/drain implant is done to define P+ source/drain regions 254 and P+ base contact zone 260A, and (c) a moderate-dosage P-type base implant is performed to define P base 258. The base implant is typically done after the high-dosage N-type implant but before the high-dosage P-type implant.

The moderately doped N-type base implant of the process in FIG. 14 is added to the fabrication process when a PNP transistor is incorporated in the structure of FIG. 18. If a heavily doped N-type collector sink is desired for the NPN transistor, the collector sink implant of FIG. 12 is performed. The steps utilized for creating lightly doped source/drain extensions in the process of FIG. 11 are performed when LDD extensions are desired in the structure of FIG. 18.

Figure 22A:
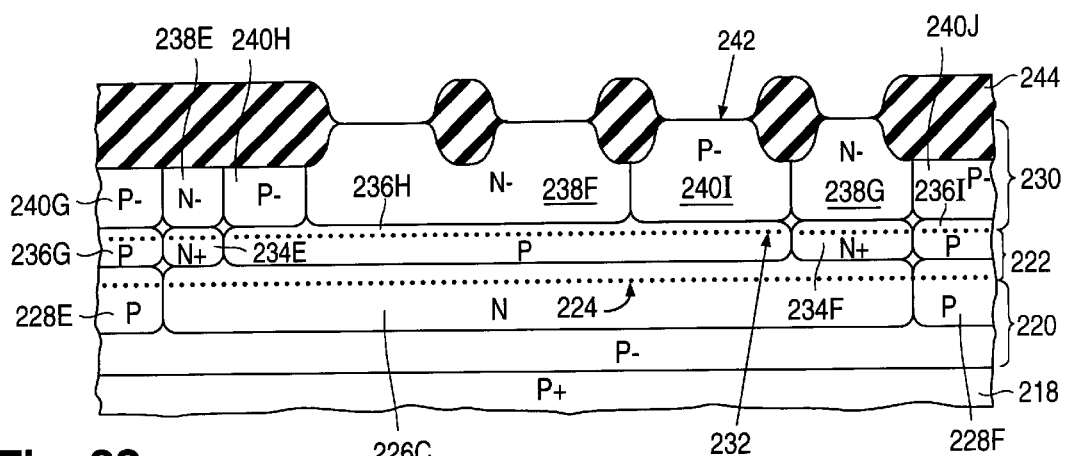
FIGS. 22a–22c are cross-sectional structural views representing stages in fabricating the bipolar transistors of FIGS. 19.1 and 19.2 starting from structural portions of the type illustrated in FIG. 21g.
Figure 22B:
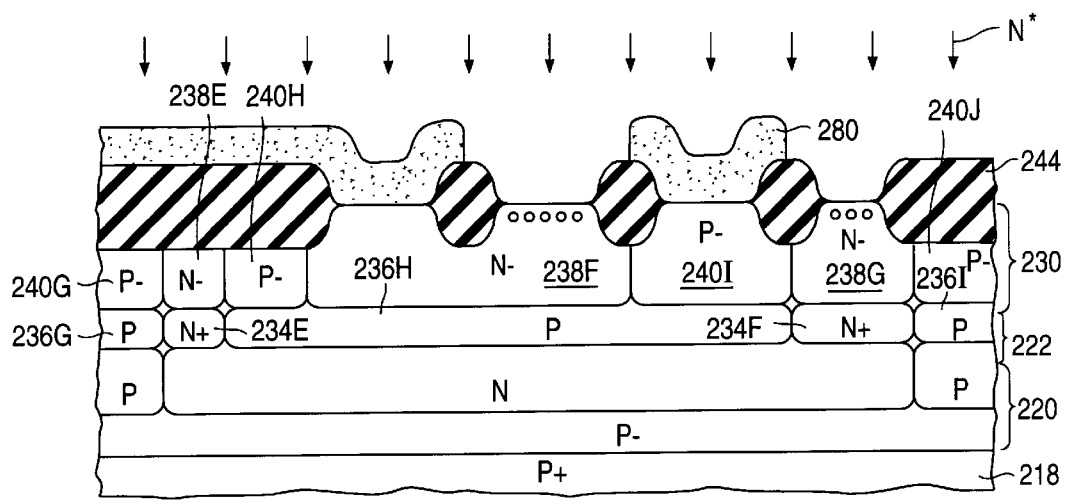
Figure 22C:
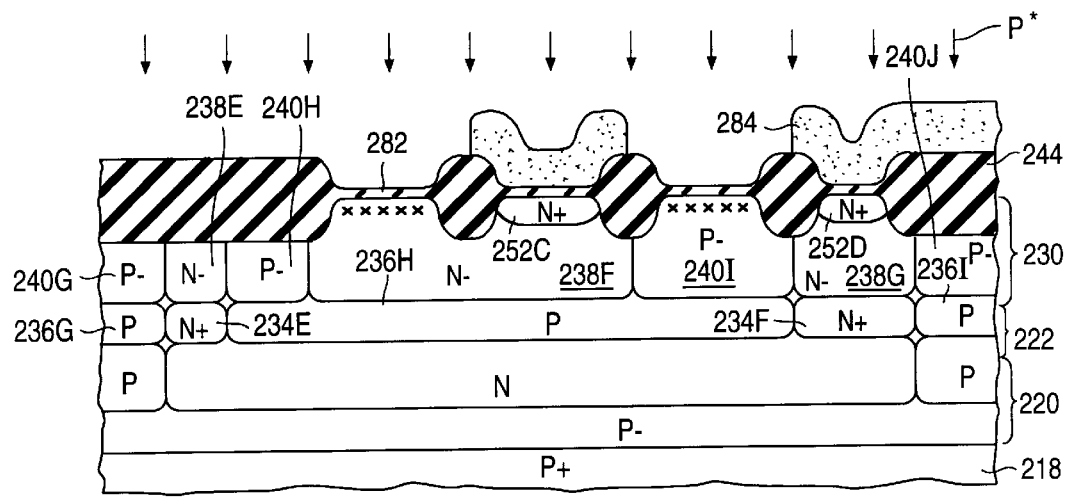

To convert the structure of FIG. 21g into the structure of FIG. 19, the partial process shown in FIGS. 22a–22c (collectively "FIG. 22") is followed. For convenience, FIG. 22 specifically illustrates the additional steps that lead to the PNP transistor of FIG. 19.2.

Field oxide 244 is provided along upper silicon surface 242 as indicated in FIG. 22a. Using a photoresist mask 280, an N-type dopant, typically arsenic, is ion implanted at a high dosage through upper surface 242 at the locations for base contact zone 252C and tub contact zone 252D. See FIG. 22b. The small circles in FIG. 22b indicate the mean depth of the N-type implant.

After removing photoresist 280, a sealing layer 282 of silicon oxide is thermally grown along the exposed silicon surfaces as shown in FIG. 22c. During the growth of sealing oxide 282, the N-type dopant is activated to produce N+ base contact zone 252C and N+ tub contact zone 252D, and lattice damage is repaired. Using another photoresist mask 284, a P-type dopant, typically boron, is ion implanted at a high dosage through sealing oxide 282 and into upper epitaxial layer 230 at the locations for P+ emitter 268 and P+ collector contact zone 260D. Photoresist 284 is subsequently removed.

A dielectric layer is deposited on top of the structure and reflowed to achieve a relatively flat upper surface. The P-type dopant is activated during the dielectric deposition/reflow. The structure of FIG. 19 is thereby produced, except that the dielectric is not shown in FIG. 19.

Low-voltage N-channel and P-channel FETs are typically provided in the structure of FIG. 19. The high-dosage N-type and P-type implants are then used to form the source/drain zones for the N-channel and P-channel FETs. When LDD extensions are desired, the above-mentioned steps involved in forming lightly doped source/drain extensions are performed in the process of FIG. 22.

No specific base masking steps are performed in the process of FIG. 22. When both NPN and PNP transistors are provided, the process of FIG. 22 thereby saves at least two masking steps in fabricating complementary bipolar transistors compared to the process of FIGS. 12 and 14. This is beneficial when bipolar transistors are needed but do not have to be high-performance devices.

11. Further Variation of Two-Level Buried-Layer Configuration

FIGS. 23a–23j (collectively "FIG. 23") illustrate another process for manufacturing a semiconductor structure that utilizes two levels of buried regions to achieve vertical isolation according to the principles of the invention. The process of FIG. 23 furnishes complementary bipolar transistors, including an isolated vertical PNP ("VPNP") transistor. Complementary insulated-gate FETs, including isolated low-voltage N-channel and P-channel FETs, are also provided in the process of FIG. 23.

Figure 23A:
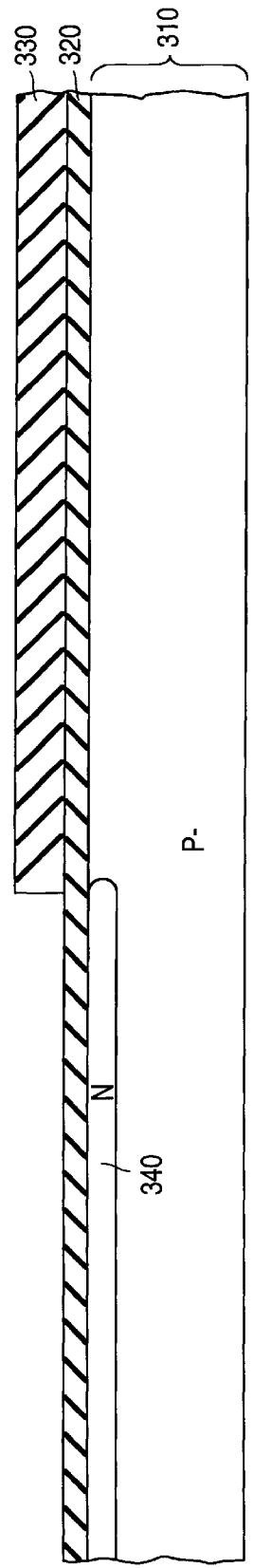
Figure 23B:
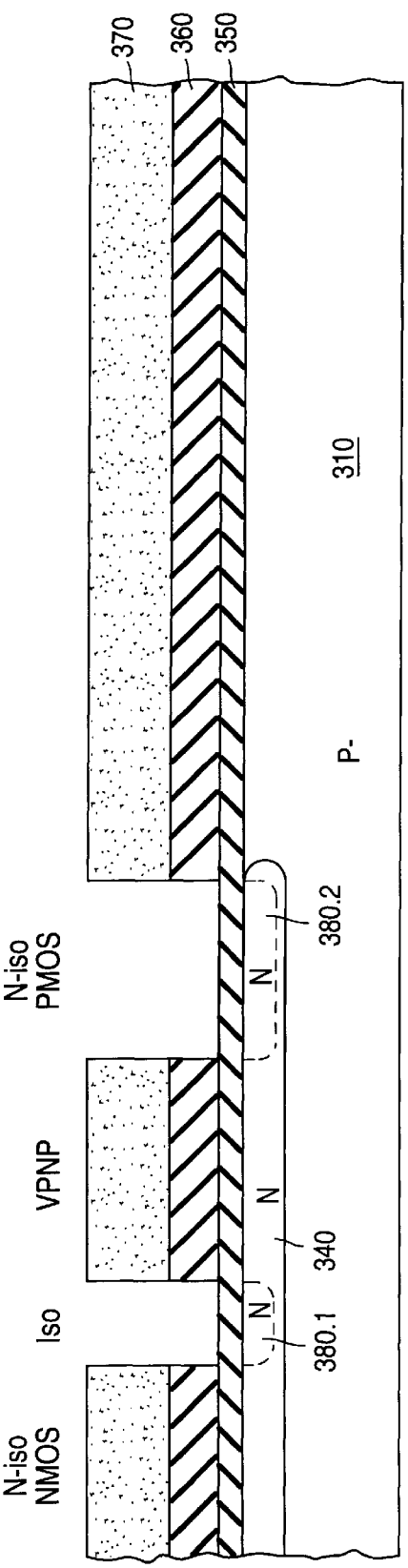
Figure 23C:
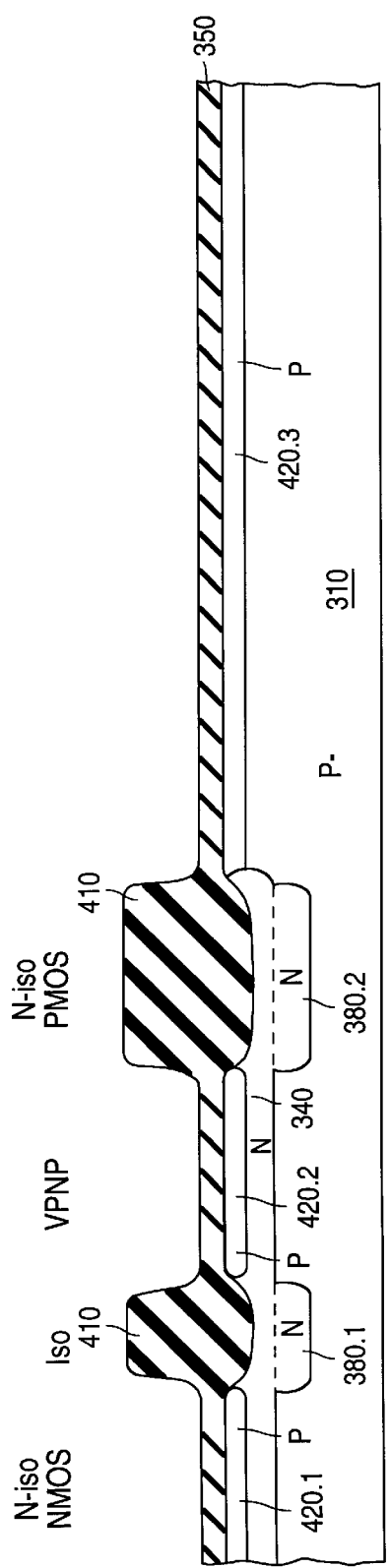

Referring to FIG. 23a, the fabrication starts with a boron-doped P– monocrystalline silicon substrate 310 of a semiconductor wafer. P– substrate 310 has a dopant concentration of about $10^{15}$ atoms/cm$^3$ and a resistivity of 8–10 ohm-cm. A pad layer 320 of silicon oxide is thermally grown along the top of P– substrate 310 to a thickness of 25 nm±5 nm. A silicon nitride layer 330 is deposited on oxide layer 320 to a thickness of 110 nm.

A photoresist mask (not shown) is formed on top of the structure so as to expose the nitride over a region 340 in which a buried lower N-type vertical isolation well ("N-iso well") will be formed. The nitride is etched away over region 340. Arsenic is implanted at a moderate dose of $4 \times 10^{13}$ ions/cm$^2$ and an energy of 100 KeV to convert region 340 to N conductivity type. N-iso well 340 later provides vertical PN-junction isolation between P– substrate 310, on one hand, and various transistors including the VPNP transistor, on the other hand. These transistors will be formed in epitaxial layers grown over substrate 310. Arsenic is chosen for its relatively low diffusivity which limits the arsenic up-diffusion into the later-formed epitaxial layers.

N-iso well 340 has a moderately low sheet resistance and thus a moderately low resistivity. Indeed, the N-iso well final sheet resistance (after dopant diffusion in subsequent steps) is less than 500 ohms/sq., and is about 100 ohms/sq. in some embodiments. The low resistivity makes N-iso well 340 an effective electromagnetic shield between substrate 310 and the later-formed VPNP collector and NMOS body regions, thereby improving the noise immunity. The low resistivity also improves the latchup immunity.

The wafer is now prepared for an N-type linkage implant that will help provide lateral PN-junction isolation for the VPNP transistor. After removing the photoresist, nitride 330 and oxide 320 are removed. A pad layer 350 of silicon oxide is thermally grown to a thickness of 25 nm±5 nm. See FIG. 23b. Nitride 360 is deposited to a thickness of 110 nm. A photoresist mask 370 is formed on top of the structure so as to expose the nitride over regions 380.1 and 380.2 of substrate 310. Regions 380.1 and 380.2 connect to each other outside the plane of FIG. 23b to form a single lower lateral isolation region 380 that laterally surrounds the lower portion of the region where the VPNP transistor will be formed. All the nitride over region 380 is exposed by mask 370.

The exposed portions of nitride 360 are etched away. Phosphorus is implanted into region 380 at a moderate dose of $3\times10^{13}$ ions/cm$^2$ and an energy of 140 KeV. Phosphorus is chosen for its relatively high diffusivity. Because of its high diffusivity, phosphorus will diffuse relatively far up into the later-formed epitaxial layers, helping create the lateral PN-junction isolation for the VPNP transistor.

An isolated low-voltage P-channel FET ("N-Iso PMOS") will be formed over N region 380.2. N region 380.1 will be used solely for lateral isolation ("Iso"). An isolated low-voltage N-channel FET ("N-iso NMOS") will be formed over N-iso well 340 to the left of N region 380.1 in FIG. 23b. N-iso well 340 will vertically isolate the later-formed P-type well of the N-iso NMOS FET from P– substrate 310.

After removing photoresist 370, boron is implanted in a self-aligned manner outside N link region 380. The implant mask is formed by a self-aligned technique such as that used in a conventional self-aligned twin-well CMOS process. For example, see Wolf, *Silicon Processing*, vol. 2, 1990, pages 432–434, incorporated by reference herein. More particularly, the wafer is heated in an oxidizing atmosphere to increase the oxide thickness over the region 380 by 250 nm±25 nm, as represented by items 410 in FIG. 23c. Nitride 360 is then removed. Boron is implanted at a low-to-moderate dose of $5\times10^{12}$ ions/cm$^2$ and an energy of 90 KeV through thin oxide 350, using oxide 410 as a mask. P regions 420.1, 420.2, and 420.3 (collectively "420") are thereby formed in substrate 310. Part of the implanted boron later diffuses into the later-formed lower epitaxial layer, doping the layer to P type.

Oxide 350 and 410 is stripped. A lower epitaxial silicon layer 430 is grown on top of substrate 310 to a thickness of 3.0 µm±0.3 µm. See FIG. 23d. Item 432 (shown in dotted line) is the metallurgical interface between substrate 310 and lower epitaxial layer 430. Epitaxial layer 430 is intrinsic or slightly autodoped by arsenic.

Part of the boron implanted into P regions 420 diffuses into epitaxial layer 430 during the epitaxial deposition, converting the overlying portions of epitaxial layer 430 to P conductivity type. Region 420.3 is now a P lower buried region extending along lower semiconductor interface 432. Inasmuch as (a) boron diffuses faster than arsenic and (b) the boron implant dosage is less than the arsenic implant dosage, region 420.1 divides into a pair of P lower buried regions 420.1T and 420.1S situated respectively along the top and bottom of N-iso region 340. Region 420.2 similarly divides into a pair of P lower buried regions 420.2T and 420.2S situated along the top and bottom of region 430. As discussed below, P region 420.2T later becomes a capacitance-lowering buffer region for the VPNP transistor.

Alternatively, epitaxial layer 430 can be doped P-type during deposition. The boron implant for creating P regions 420 is then omitted.

Figure 23D:
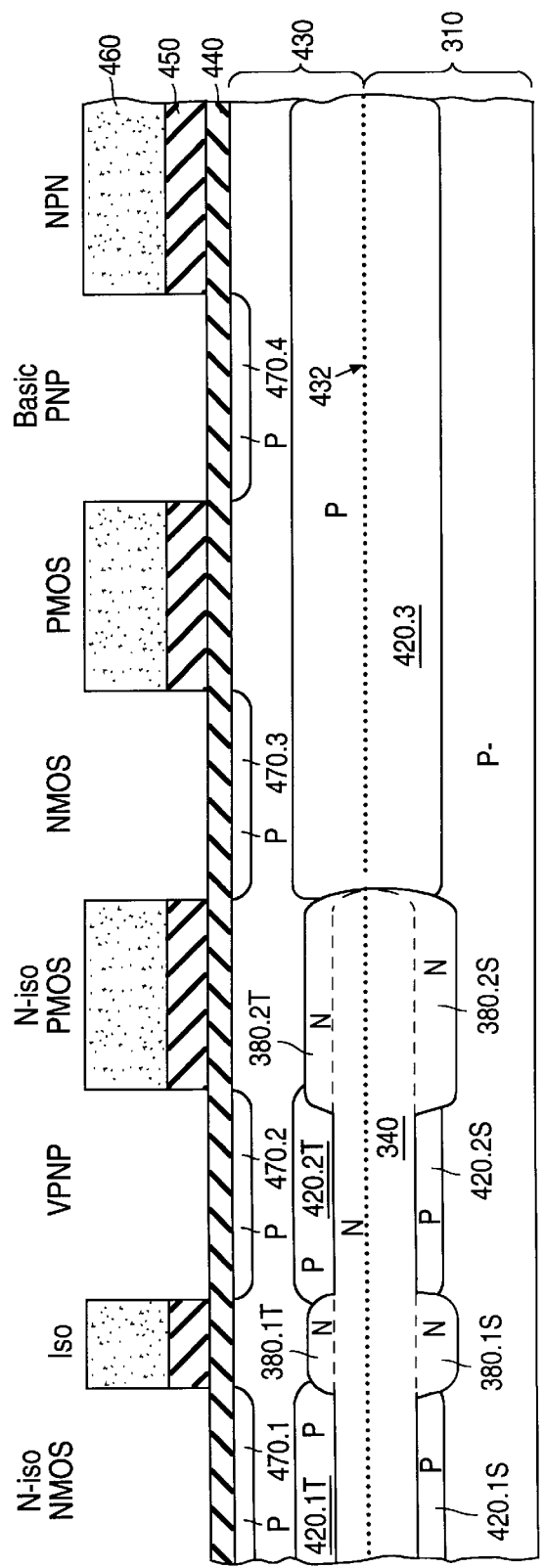

Part of the arsenic in N-iso region 340 and part of the phosphorus in N link region 380 also diffuse into epitaxial layer 430 as shown in FIG. 23d. Since (a) arsenic has a lower diffusivity than phosphorus and (b) the implant dosages for the arsenic implant ($4\times10^{13}$ ions/cm$^2$) are close to each other, the implanted arsenic diffuses less than the implanted phosphorus. N link region 380 thereby divides into a pair of annular N regions 380T and 380S situated respectively along the top and bottom of N-iso well 340. Region 380T, represented by (interconnected) portions 380.1T and 420.2T in FIG. 23d, laterally surrounds P buffer region 420.2T to form a lower lateral isolation region for the VPNP transistor. Region 380S is represented by portions 380.1S and 380.2S in FIG. 23d.

N-iso well 340 does not diffuse up completely through layer 430 even during subsequent fabrication stages. This increases the distance between N-iso well 340 and the vertical PNP collector. Well 340 is now an N lower buried region extending along lower semiconductor interface 432.

Precursors to P-type and N-type upper buried layers are now formed in epitaxial layer 430 in a self-aligned manner as follows. A pad layer 440 of silicon oxide is thermally grown along the top of epitaxial layer 430 to a thickness of 25 nm±5 nm. Silicon nitride 450 is deposited on oxide layer 420 to a thickness of 110 nm. A photoresist mask 460 is formed on top of the structure so as to expose the nitride over regions 470.1–470.4 (collectively "470") of epitaxial layer 430. Boron is implanted at a moderate dose of $2\times10^{13}$ ions/cm$^2$ and an energy of 90 KeV to convert layers 470 to P conductivity type.

Layer 470.3 later becomes a P upper buried region of an NMOS FET. Layer 470.4 becomes a P upper buried collector region of a second vertical PNP transistor. The P-type collector of this PNP transistor ("Basic PNP" in FIG. 23) will not be isolated from P– substrate 310. Layer 470.2, which overlies N-iso well 340 and which is laterally surrounded by N link 380, later becomes a P upper buried collector zone of the VPNP transistor. Layer 470.1 becomes a P upper buried region of the N-iso NMOS FET.

Figure 23E:
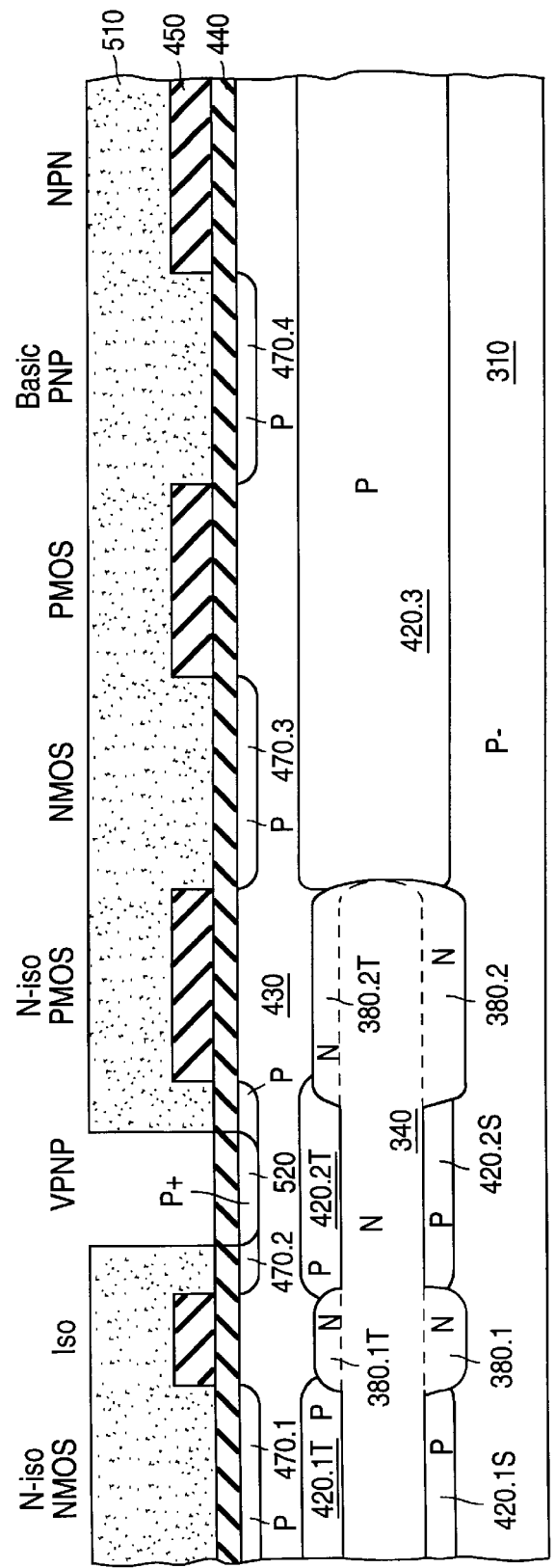

After removing photoresist 460, a photoresist mask 510 is formed on top of the structure so as to expose a portion of layer 470.2 in the manner shown in FIG. 23e. Boron is implanted at a high dose of $1.8\times10^{14}$ ions/cm$^2$ and an energy of 90 KeV to create a P+ region 520 in P region 470.2.

After removing photoresist 510, the structure is oxidized to increase the oxide thickness over P layers 470 by 250 nm±25 nm as represented by items 610 in FIG. 23f. Nitride 450 is removed. Arsenic is implanted at a high dose of $6\times10^{15}$ ions/cm$^2$ and an energy of 75 KeV to form N+ layers 620.1–620.4 (collectively "620") in epitaxial layer 430.

Layer 620.1, situated between layers 470.1 and 470.2, later becomes an N+ upper buried region that provides lateral isolation for transistors. Layer 620.2, which overlies N link 380.2, becomes an N+ upper buried region that provides isolation and, in addition, serves as a buried region for the N-iso PMOS FET. Layers 620.1 and 620.2 connect to each other outside the plane of FIG. 23f to form a single N+ intermediate lateral isolation region 620.1/620.2 that laterally surrounds composite P-type collector zone 470.2/520. Layer 620.3 becomes an N+ upper buried region of another PMOS FET. Layer 620.4 becomes an N+ upper buried collector zone of the second vertical NPN transistor.

The boron dopants in regions 520 and 470.2, on one hand, and region 420.2T, on the other hand, diffuse towards one another to form a composite P-type region that extends from the top of epitaxial layer 430 down to N-iso well 340. The diffusion occurs partly during the preceding oxidation but primarily during subsequent high-temperature operations. P+ region 520, which is fully surrounded by P region 470.2, later serves as a heavily doped buried collector zone for the VPNP transistor.

P buffer region 420.2T, which lies between P+ buried collector region 520 and N-iso well 340, has a lower peak net dopant concentration than both P+ enhanced collector zone 520 and P collector zone 470.2. This reduces the junction capacitance between N-iso region 340 and composite P-type buried collector zone 520/470.2. If P region 420.2T consisted of intrinsic silicon, the junction capacitance between N-iso region 340 and composite P-type buried collector zone 520/470.2 would be even lower. However, arranging for buffer region 420.2T to be maintained in (substantially) intrinsic form would require an additional masking step, and an accompanying increase in cost and fabrication time. Forming P region 420.2T in the preceding way thus yields a relatively low junction capacitance without requiring an extra masking step. In subsequent steps, N+ layers 620.1 and 620.2 meet N link region 380 due to dopant diffusion, specifically because phosphorus has a high diffusivity. Complete lateral PN-junction isolation of the VPNP transistor is then achieved.

The boron dopants in regions 470.1 and 420.1T likewise diffuse towards each other to form a composite P region for the N-iso NMOS FET. The boron dopants in regions 470.3 and 470.4, on one hand, and region 420.3, on the other hand, also diffuse toward one another to form a composite P region for the NMOS FET and the second PNP transistor.

Oxide 440 and 610 is stripped. An upper epitaxial silicon layer 710, intrinsic or slightly autodoped by arsenic, is grown on top of epitaxial layer 430 to a thickness of 1.87 $\mu$m±0.19 $\mu$m. See FIG. 23g. Item 712 (shown in dotted line) is the metallurgical interface between epitaxial layers 430 and 710.

A thin silicon oxide layer (not shown) is thermally grown along the top of epitaxial layer 710. Silicon nitride (not shown) is deposited over the oxide layer to seal the front of the wafer. The backside of the wafer is etched to remove any epitaxial silicon grown during the formation of layers 430 and 710. The nitride and the oxide overlying layer 710 are then removed. Layers 470 and 620 diffuse into epitaxial layer 710 during the epitaxial deposition and subsequent steps to become P-type and N-type upper buried regions extending along upper semiconductor interface 712.

Lightly doped P-type wells (or device regions) 720.1–720.4 (collectively "720") and lightly doped N-type wells (or device regions) 730.1–730.4 (collectively "730") are then formed in upper epitaxial layer 710 by a self-aligned twin-well CMOS technique similar to that described above for FIGS. 23b–23d and 23f. More particularly, silicon oxide (not shown) is thermally grown over epitaxial layer 710 to a thickness of 45 nm±5 nm. Silicon nitride (not shown) is deposited on the oxide layer to a thickness of 135 nm±12.5 nm. The nitride is patterned using a suitable photoresist mask (not shown) to expose the locations for N– wells 730. Phosphorus is implanted at a low dose of $3 \times 10^{13}$ ions/cm$^2$ and an energy of 140 KeV to form N– wells 730.

After removing the photoresist, the wafer is thermally oxidized to increase the thickness of the silicon oxide over N– wells 730 by 560 nm±40 nm. The nitride is stripped, and boron is ion implanted at a low dose of $2.1 \times 10^{12}$ ions/cm$^2$ and an energy of 50 KeV to form P– wells 720. Although wells 720 sometimes have a greater P doping than P lower buried regions 420, wells 720 are still classified as P– here because they are lightly doped relative to the adjoining regions. The oxide is subsequently removed.

The wafer is heated in an oxidizing atmosphere to drive in the just-implanted dopants. A thin layer of silicon oxide (not shown) forms along the exposed silicon to a typical thickness of 16 nm during the heating step. The oxide is then removed.

Figure 23G:
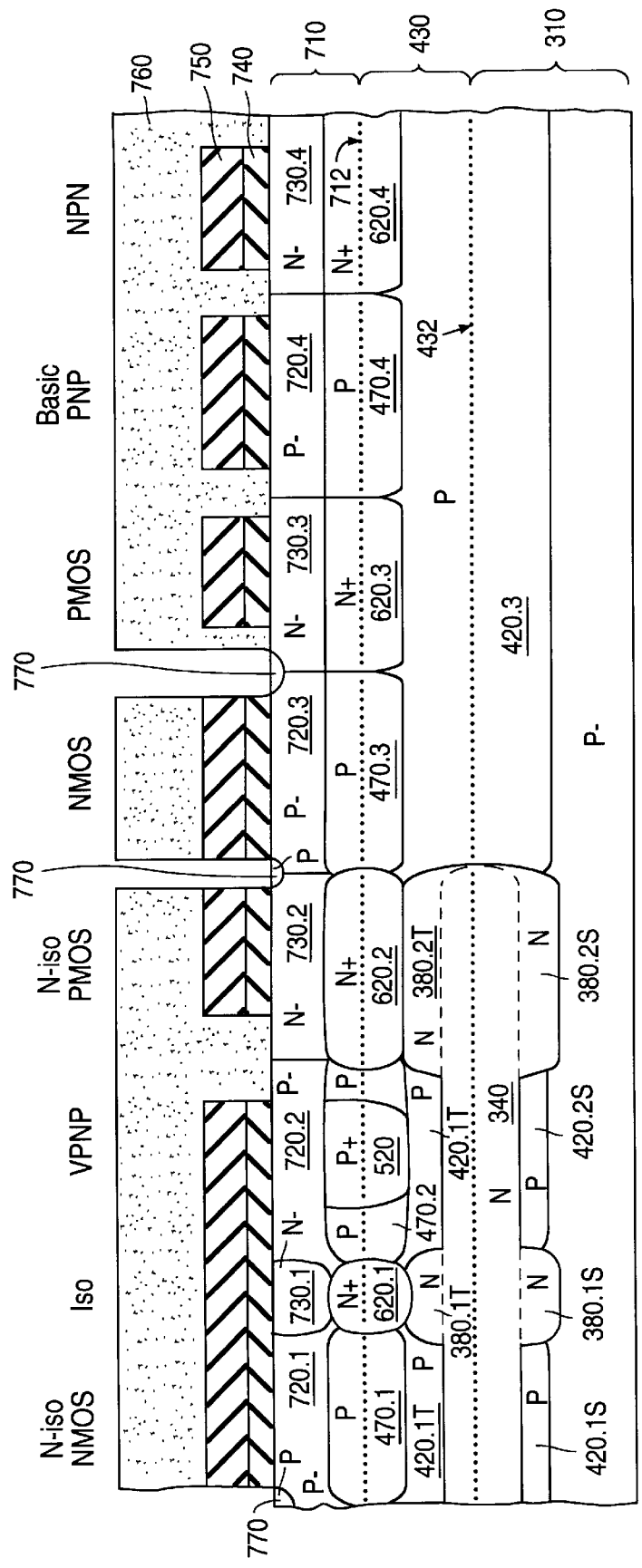

As shown in FIG. 23g, each P-type well 720.i, where i varies from 1 to 4, overlies and meets more heavily doped P-type buried region 470.i. Each N-type well 730.i overlies and meets more heavily doped N-type upper buried region 620.i. Wells 720.1, 720.2, 730.2, 720.3, 730.3, 720.4, and 730.4 respectively provide device regions for the N-iso NMOS, VPNP, N-iso PMOS, NMOS, PMOS, PNP, and NPN transistors. Wells 720.1, 730.2, 720.3, 730.3 also provide body regions for the respective MOS transistors.

Furthermore, P– well 720.2 combines with P-type regions 470.2, 520, and 420.2T to form a composite P-type well 420.2T/470.2/520/720.2 for the VPNP transistor. N– wells 730.1 and 730.2 connect to each other outside the plane of FIG. 23g to form a single N-upper lateral isolation region that laterally surrounds P– device region 720.2. As a result, N-type regions 340, 380T, 620.1/620.2, and 730.1/730.2 form an N-type tub that surrounds composite P-type well 420.2T/470.2/520/720.2 along its lateral and lower surfaces. The PN junction along the inside of the N-type tub fully isolates the later-formed VPNP transistor from P– substrate region 310 and from other PNP transistors in the structure.

P– well 720.1 similarly combines with P regions 470.1 and 420.1T to form a composite P-type well 420.1T/470.1/720.1 for the N-iso NMOS FET. N-type regions 730.1, 620.1, and 380.1T extend fully around P-type well 420.1T/470.1/720.1 beyond the left-hand edge of FIG. 23g. Another N-type tub is thereby formed by regions 340, 380.1T, 620.1 and 730.1. This N-type tub surrounds composite P-type well 420.1T/470.1/720.1 along its lateral and lower surfaces to isolate the later-formed N-iso NMOS FET from substrate 310. Crosstalk between the N-iso NMOS FET and other transistors in the structure, especially NMOS FETs, is substantially reduced.

Field isolation is then formed as follows. A pad layer 740 of silicon oxide is thermally grown along the top of epitaxial layer 710 to a thickness of 25 nm±2.5 nm. Silicon nitride 750 is deposited on oxide layer 740 to a thickness of 185 nm±18.5 nm. A photoresist mask (not shown) is provided on top of the structure so as to expose the nitride over the areas where the field isolation will be formed. The exposed portions of the nitride are etched away. The photoresist is removed. A buffered oxide etch is performed to remove portions of oxide 740 exposed through nitride 750.

A photoresist mask 760 is provided on top of structure so as to expose locations for P field implant regions 770 to the left of P-type well 720.1 and to the left and right of P-type well 720.3. Boron is implanted at a moderate dose of $5.5 \times 10^{13}$ ions/cm$^2$ and an energy of 30 KeV to form field implant regions 770. Photoresist 760 is then removed.

Figure 23H:
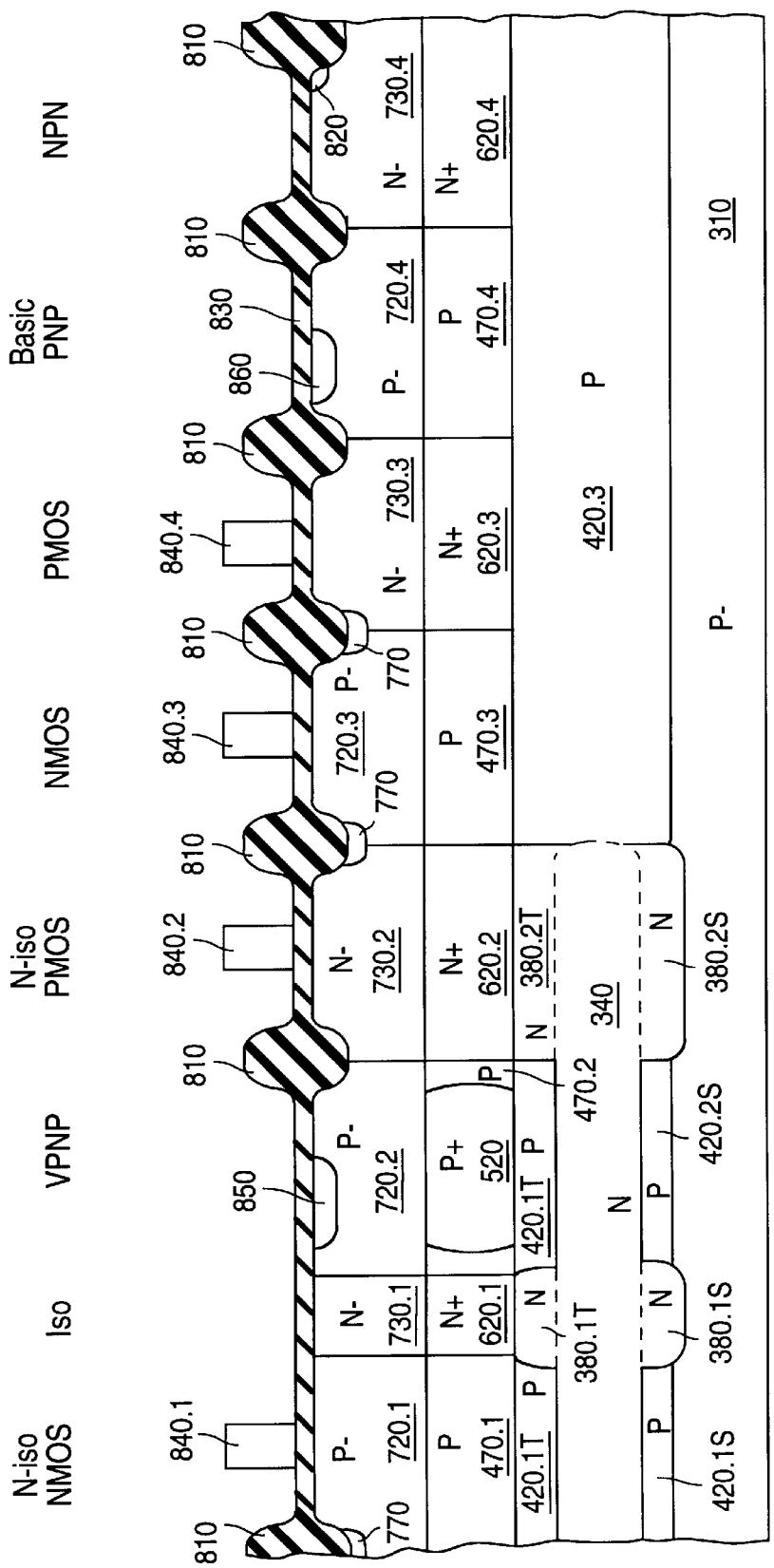

The wafer is thermally oxidized to form a field-oxide isolation region 810 as shown in FIG. 23h. Field oxide 810 lies to the left of well 720.1, to the right of well 730.4, and between the adjacent ones of wells 720.2, 730.2, 720.3, 730.3, 720.4, 730.4. The field-oxide thickness is 700 nm±50 nm.

Nitride 750 and oxide 740 are removed. A sacrificial layer of silicon oxide (not shown) is thermally grown along the exposed silicon to a thickness of 40 nm±5 nm. A blanket implant of boron is performed at a dose of $3 \times 10^{12}$ ions/cm$^2$ and an energy of 30 KeV to adjust the threshold voltages of the FETs.

Optionally, a masked implant of phosphorus is performed into region 820 of well 730.4 to form a heavily doped N-type collector contact zone for the NPN transistor. The N+ contact zone reduces the transistor collector resistance. The implant dose is $1 \times 10^6$ ions/cm$^2$, and the energy is 145 KeV.

The sacrificial oxide is removed. Gate oxide 830 is thermally grown along the exposed silicon areas to a thickness of 15 nm±1.5 nm. A polysilicon layer is deposited over the wafer to a thickness of approximately 325 nm. A blanket photoresist layer (not shown) is provided over the polysilicon. A plasma etch is performed on the wafer backside to remove polysilicon from the backside. A buffered oxide etch is done to remove silicon oxide from the backside.

After removing the photoresist, the polysilicon is heavily doped with phosphorus by POCl$_3$. A polysilicon deglaze step is performed to remove POCl$_3$ glass formed on top of the polysilicon. The polysilicon is patterned by a masked etch to form gate electrodes 840.1–840.4 (collectively "840")) for the MOS transistors. Silicon oxide (not shown) is thermally grown along polysilicon 840 to a thickness of 8 nm±1.5 nm to seal polysilicon gate electrodes 840.

Using a photoresist mask (not shown), phosphorus is implanted at a moderate dose into P-type wells 720.2 and 720.4 to form N-type base zones 850 and 860 for the respective VPNP and PNP transistors. The implant dose is 1×10$^{14}$ ions/cm$^2$, and the energy is 40 KeV. The remainders of wells 720.2 and 720.4 respectively constitute collectors for the VPNP and PNP transistors.

Figure 23I:
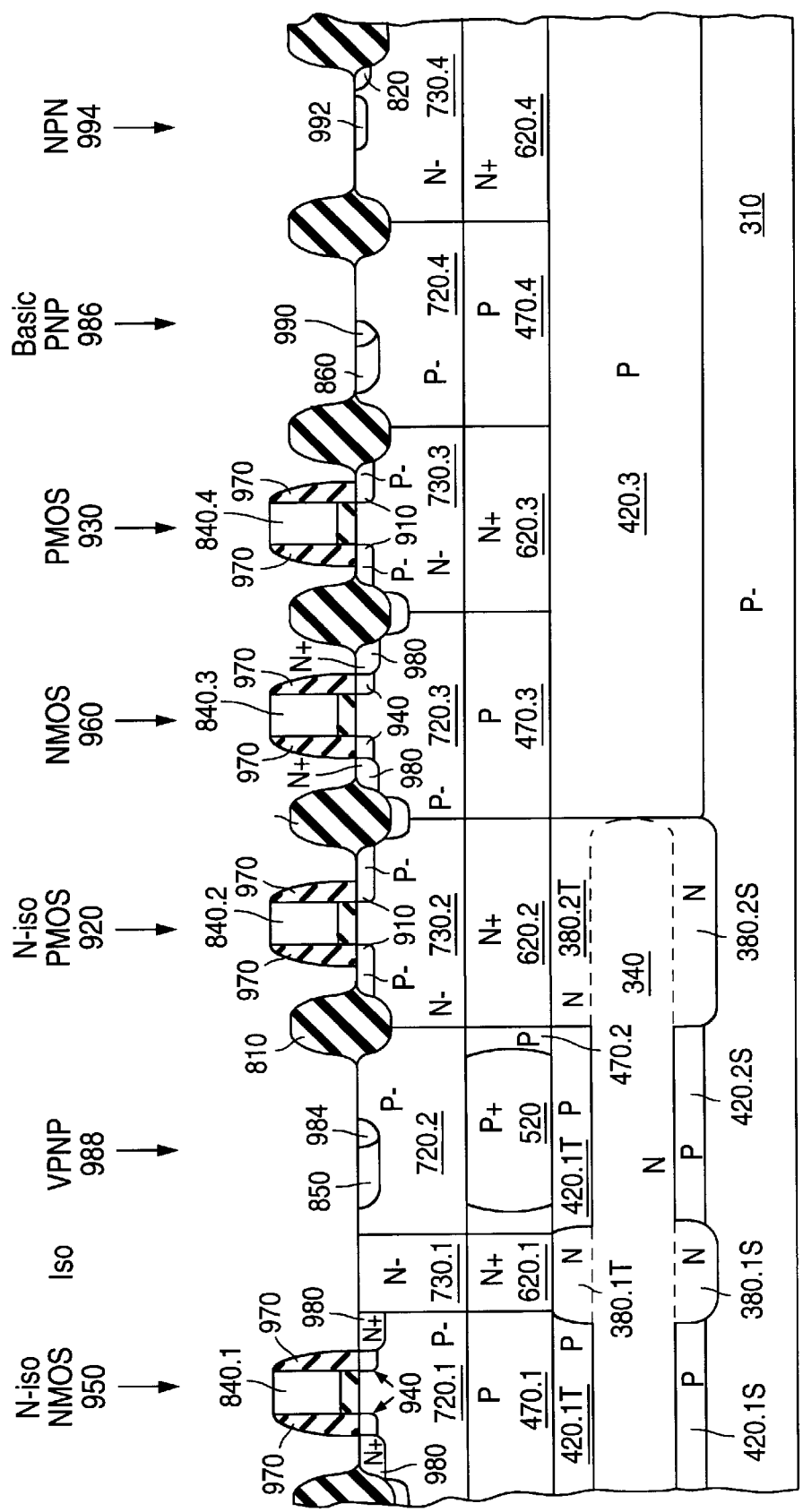

Referring to FIG. 23i, a low-dosage masked boron implant is performed into N-type wells 730.2 and 730.3 to create P-type LDD extensions 910 for N-iso PMOS FET 920 and PMOS FET 930. The boron source is BF$_2$, the implant dose is 5×10$^2$ ions/cm$^2$, and the energy is 45 KeV. The photoresist mask (not shown) used for the implant need not be perfectly aligned to P-type LDD regions 910 because field oxide 810 and polysilicon gates 840.2 and 840.4 also mask the implant.

A low-dosage masked phosphorus implant is performed into P-type wells 720.1 and 720.3 to create N-type LDD extensions 940 for N-iso NMOS FET 950 and NMOS FET 960. The implant dose is 2×10$^{13}$ ions/cm$^2$, and the energy is 50 KeV. The photoresist mask (not shown) used for the implant likewise need not be perfectly aligned to N-type LDD regions 940 because field oxide 810 and polysilicon gate electrodes 840.1 and 840.3 mask the implant and because well 730.1 can be exposed to the implant. The photoresist is subsequently removed.

A conformal layer of silicon oxide is deposited by chemical vapor deposition on top of the structure to a thickness of 200 nm. The conformal oxide is etched anisotropically to form spacers 970 along the sidewalls of polysilicon gate electrodes 840. See FIG. 23i.

A high-dosage masked arsenic implant is performed into epitaxial layer 710 so as to: (1) form heavily doped N-type main source/drain zones 980 for NMOS FETs 950 and 960; (2) form a heavily doped N-type base contact zone 984 inside base zone 850 of VPNP transistor 988; (3) form a heavily doped N-type base contact zone 990 inside base zone 860 of PNP transistor 986; (4) form an N-type emitter zone 994 for NPN transistor 994; and (5) increase the dopant concentration in N-type collector contact zone 820. The implant dose is 3×10$^{15}$ ions/cm$^2$, and the energy is 50 KeV. The photoresist mask (not shown) used for the implant need not be perfectly aligned to N+ source/drain zones 980 because field oxide 810, polysilicon gate electrodes 840, and spacers 970 mask the implant and because the implant is allowed to get into N-type well 730.1. A perfect alignment from the right in FIG. 23i to region 820 is also unnecessary because field oxide 810 masks the implant. The photoresist is subsequently removed.

A masked boron implant is performed at a moderate dose of 4.8×10$^{13}$ ions/cm$^2$ and an energy of 30 KeV into N-type well 730.4 to create a P base zone 1010 for NPN transistor 994. See FIG. 23j. The photoresist mask opening overlaps field oxide 810 to the left of well 730.4 as oxide 810 also masks the implant. P base zone 1010 surrounds N+ emitter zone 994. The portion of well 730.4 outside P base zone 1010 constitutes an N-collector zone for the NPN transistor. The base implant photoresist is removed.

Silicon dioxide 1020 is thermally grown along the exposed silicon areas to a thickness of 8 nm±1.5 nm. A high-dosage masked boron implant is performed into epi-taxial layer 710 to create: (1) a P-type emitter zone 1030 inside base zone 950 of VPNP transistor 988; (2) a heavily doped P-type collector contact zone 1040 in P-type well 720.2 of VPNP transistor 988; (3) heavily doped P-type main source/drain zones 1050 for PMOS transistors 920 and 930; (4) a P-type emitter zone 1060 inside base zone 860 of PNP transistor 986; (5) a heavily doped P-type collector contact zone 1070 in well 720.4 of PNP transistor 986; and (6) a heavily doped P-type base contact zone 1080 in base zone 1010 of NPN transistor 994. The implant dose is 3×10$^{15}$ ions/cm$^2$, and the energy is 45 KeV. The openings in the photoresist mask used for the implant overlap field oxide 810 so that zones 1040, 1050, 1070, and 1080 are aligned to the adjacent parts of field oxide 810. The implant mask is subsequently removed.

A layer of undoped silicon glass (not shown) is deposited over the wafer for passivation and for isolation from overlying conductive layers (not shown). Contacts, interconnects and other circuit elements are formed as needed. The structure fabrication is completed using methods known in the art.

FIG. 24 is a plan view of the structure of FIG. 23j. An N-type isolation region 1110 surrounds transistors 950, 988, 920, and N-well 730.1 on the left, top, and bottom, and extends partially around field oxide 810 to the right of transistor 920. Region 1110 is created by the same implants that create N-iso well 340, N link region 380, N-type buried layers 620, and N– wells 730. Thus, region 1110 extends from the upper wafer surface down to substrate 310.

A P-type isolation layer 1120 surrounds transistors 960, 930, 986, and 994 on the right, top, and bottom, and meets region 1110 to the left of transistor 960. Region 1120 extends from the upper wafer surface down to substrate 310. Region 1120 is formed by the same implants that form P regions 420, P-type buried layers 470, and P– wells 720.

Figure 25:
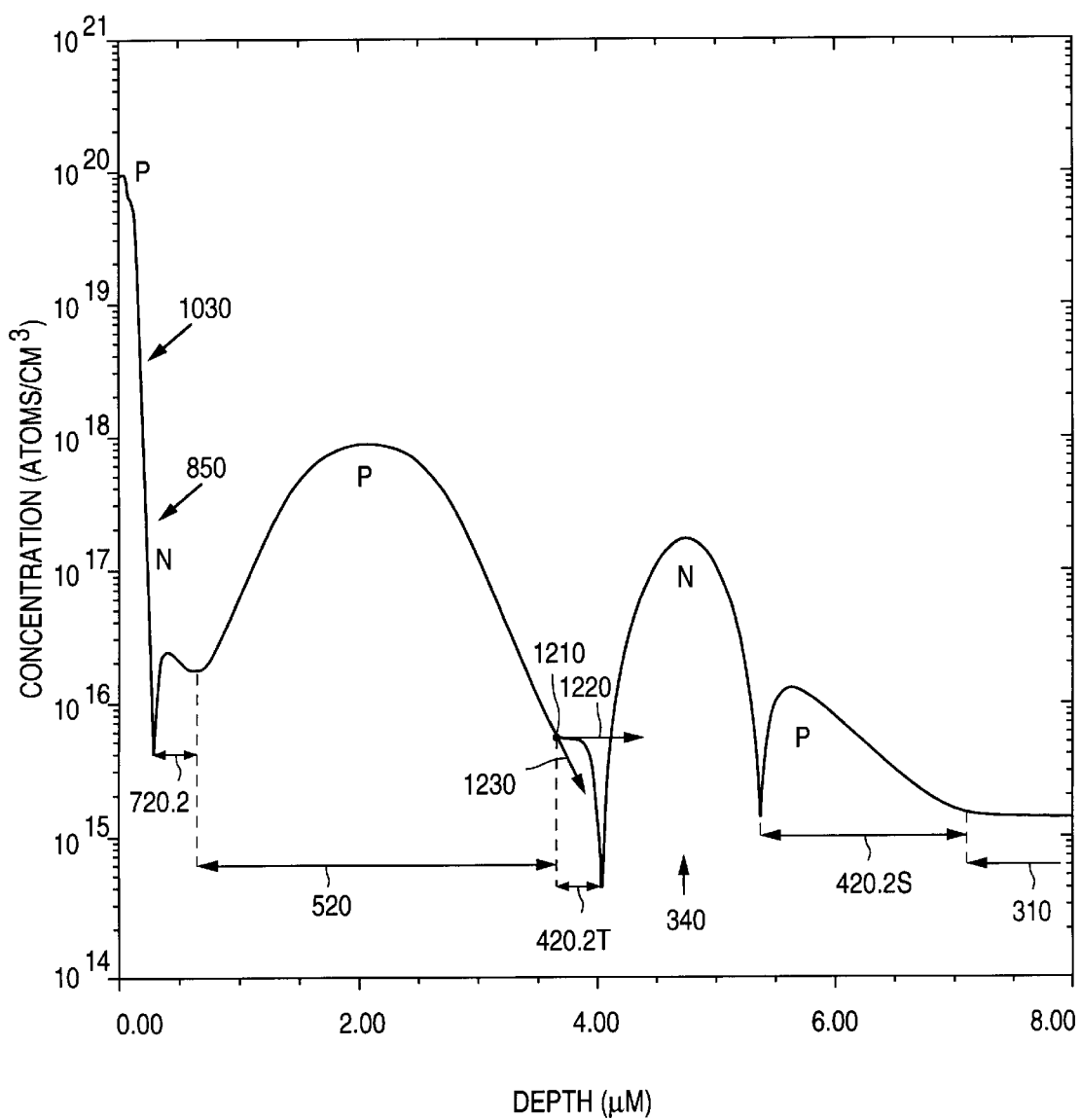
FIG. 25 is a graph of dopant concentration as a function of depth at a location extending through the heavily doped P-type upper buried region in FIG. 23j.

FIG. 25 presents a computer-simulated dopant distribution in the active VPNP transistor region. The simulation was obtained by a one-dimensional process simulation program SUPREM-3. The depth into the wafer is plotted along the horizontal axis. The net dopant concentration is plotted along the vertical axis. The diagram shows, from left to right, the net dopant concentration in P+ emitter zone 1030, N base zone 850, P-type collector zone 720.2, enhanced P+ upper buried collector zone 520, P-type buffer region 420.2T, N-iso well 340, P-type lower buried region 420.2S, and P-substrate 310.

At the general location 1210 where buried collector zone 520 meets P-type buffer region 420.2T, the vertical gradient 1220 of the net dopant concentration in region 420.2T is close to zero because the dopant concentration is nearly constant to the immediate right of location 1210—i.e., the dopant concentration curve in FIG. 25 is essentially horizontal. Note that the vertical gradient is the rate of change of the net dopant concentration in moving vertically down from the upper wafer surface. In contrast, the magnitude of the vertical gradient 1230 of the net dopant concentration in P+ enhanced collector zone 520 is fairly large at location 1210 since, in going from left to right in FIG. 25, the dopant concentration decreases steeply to the immediate left of location 1210.

As shown in FIG. 25, the peak net dopant concentration in enhanced collector zone 520 is about 10$^{18}$ ions/cm$^3$, while the peak net dopant concentration in buffer region 420.2T is below 10$^{16}$ ions/cm$^3$. Because P buffer region 420.2T has a lower net peak dopant concentration than P+ enhanced collector zone 520, buffer region 420.2T furnishes a collector-to-isolation spacing that reduces the capacitance between collector zone 520 and N-iso well 340.

P+ enhanced collector zone 520 is separated from N+ buried lateral isolation region 620.1/620.2 by part of P-type buried collector zone 470.2. Since collector zone 470.2 is more lightly doped than collector zone 520, the collector-to-isolation capacitance of VPNP transistor 988 is further reduced.

12. Other Variations

While the invention has been described with reference to particular embodiments, this description is solely for the purpose of illustration and is not be construed as limiting the scope of the invention below. For example, semiconductor materials of opposite conductivity type to those described above could be used to achieve similar results.

Instead of reversing all the conductivity types, upper epitaxial layer 22 could be converted from N-type to P-type in the structure of FIG. 1. In this case, the particular N+ upper buried regions 34 that need to be electrically connected to underlying N+ lower buried regions 26 (e.g., to form N-type tubs that enclose P-device regions) would meet the underlying N+ lower buried regions rather than being connected to them by the N- material of epitaxial layer 22. Likewise, the particular P upper buried regions 36 that need to be electrically connected to underlying lower buried regions 28 (e.g., to form P-type tubs that enclose N-device regions) would make electrical connections by way of the P- upper epitaxial material rather than actually physically contacting the P lower buried regions.

Instead of providing upper epitaxial layer 30 as intrinsic semiconductor material and then performing two doping operations to create device regions 38 and 40 as self-aligned twin wells, device regions 38 and 40 could be created in one doping operation by depositing epitaxial layer 30 as lightly doped silicon of either N-type or P-type conductivity and then selectively introducing dopant of opposite conductivity type into the lightly doped upper epitaxial material. Semiconductor elements other than those described above could be fabricated with the invention. DMOS FETs, lateral bipolar transistors, and monocrystalline silicon resistors are examples.

The special bipolar transistors of FIG. 19 could be implemented in the isolation structure of FIG. 1. Conversely, the devices of FIGS. 2.3–2.8 could be implemented with the isolation structures of FIGS. 18 and 19 or that of FIG. 23*j*.

The lightly doped portions of the sources in the high-voltage FETs of FIGS. 2.5 and 2.6 could be eliminated by selectively removing spacers 52E and 52F using a suitable photoresist mask. The low-voltage LDD P-channel FETs of FIGS. 2.1 and 2.2 could be converted into non-LDD devices by selectively removing spacers 52B and 52D using the same photoresist mask. If all the low-voltage P-channel FETs are to be non-LDD devices in the process of FIGS. 9 and 11, the low-dosage P-type implant for creating the lightly doped source/drain portions would also be deleted. Like remarks apply to the low-voltage N-channel LDD FETs. If only non-LDD FETs are desired in the process of FIGS. 9 and 11, the steps involved in forming spacers 48A–48F could be deleted along with the steps (including masks) involved in forming the lightly doped source/drain extensions.

The high-voltage P-channel FET of FIG. 2.6 could be provided with an N+ upper buried provided that the buried region is not too close to P+ drain 80. The same applies to the polysilicon capacitor of FIG. 2.7. On the other hand, P upper buried layer 36A and/or N+ upper buried layer 34B could be deleted in the basic low-voltage FETs of FIG. 2.1.

Analogous to N+ collector sink 64 of the NPN transistor in FIG. 2.2, the PNP transistor of FIG. 2.4 could be furnished with a heavily doped P-type collector sink extending substantially down to P upper buried region 36C. This would entail performing a high-dosage P-type ion implant using an additional photoresist mask. Instead of implanting P+ emitter 70 of the PNP transistor, emitter 70 could be created by outdiffusion from an overlying heavily doped emitter contact so that emitter 70 is self-aligned to the emitter contact. Emitter 56 of the NPN transistor could be formed in the same way.

Trench isolation could be used in place of semi-recessed field oxide to assist in achieving lateral isolation. Process parameters such as implant dosages, implant energies, annealing conditions, and so on could have different values than those presented above. Various modifications and applications may thus be made by those skilled in the art without departing from the true scope and spirit of the invention as defined in the appended claims.

We claim:

1. A semiconductor structure comprising (a) a monocrystalline semiconductive substrate, (b) a lower monocrystalline semiconductive layer that overlies the substrate and adjoins it along a lower semiconductor interface, and (c) an upper monocrystalline semiconductive layer that overlies the lower semiconductive layer and adjoins it along an upper semiconductor interface, wherein:

first and second lower buried regions of opposite conductivity types are situated along the lower semiconductor interface;

first and second upper buried regions of opposite conductivity types are situated along the upper semiconductor interface;

the upper semiconductive layer contains a plurality of P-type device regions and a plurality of N-type device regions; and one of the device regions of each conductivity type laterally meets one of the device regions of the other conductivity type and vertically extends into the upper semiconductive layer to a depth sufficient to meet one of the upper buried regions.

2. A structure as in claim 1 wherein:

each lower buried region vertically extends partway through each of the substrate and the lower semiconductive layer; and one of the upper buried regions vertically extends partway through each semiconductive layer.

3. A structure as in claim 2 wherein the two lower buried regions are spaced laterally apart from each other along the lower semiconductor interface.

4. A structure as in claim 2 wherein transistor zones are situated in the P-type and N-type device regions.

5. A structure as in claim 2 wherein at least one of each of the P-type and N-type device regions is vertically electrically isolated from the substrate.

6. A structure as in claim 5 wherein each so-isolated device region, including any directly underlying semiconductive material of the same conductivity type as that device region, is surrounded along its outside surface within the semiconductive layers and the substrate by semiconductive material of opposite conductivity type to that device region.

7. A structure as in claim 6 wherein the semiconductive material surrounding one of the so-isolated device regions comprises (a) another of the device regions, (b) a specified one of the upper buried regions, and (c) a specified one of the lower buried regions connected through the lower semiconductive layer to the specified upper buried region.

8. A structure as in claim 5 wherein one of the so-isolated device regions, including any directly underlying semiconductive material of the same conductivity type as that device region, is surrounded along its outside surface within the semiconductive layers and the substrate by a tub of opposite conductivity type to that device region, the tub being surrounded along its outside surface within the semiconductive layers and the substrate by semiconductive material of opposite conductivity type to the tub.

9. A structure as in claim 8 wherein:
the tub comprises (a) another of the device regions, (b) one of the upper buried regions, and (c) one of the lower buried regions; and
the semiconductive material directly surrounding the tub comprises (a) a further one of the device regions and (b) the other lower buried region.

10. A structure as in claim 2 including an N-channel field-effect transistor ("FET") and a P-channel FET, wherein the N-channel FET comprises:
a pair of N-type source/drain zones situated in a first of the P-type device regions and laterally separated from each other by a first channel zone; and
a first gate electrode overlying the first channel zone and vertically separated from the first channel zone by a first gate dielectric layer; and wherein the P-channel FET comprises:
a pair of P-type source/drain zones situated in a first of the N-type device regions and laterally separated from each other by a second channel zone; and
a second gate electrode overlying the second channel zone and vertically separated from the second channel zone by a second gate dielectric layer.

11. A structure as in claim 10 wherein:
the first P-type device region, including any directly underlying P-type semiconductive material, is surrounded along its outside surface within the semiconductive layers and the substrate by an N-type tub; and
the first N-type device region, including any directly underlying N-type semiconductive material, is surrounded along its outside surface within the semiconductive layers and the substrate by a P-type tub.

12. A structure as in claim 10 further including a PNP transistor and an NPN transistor, wherein the PNP transistor comprises:
an N-type base situated in a second of the P-type device regions;
a P-type emitter situated in the N-type base along its upper surface; and
a P-type collector comprising material of the second P-type device region outside the N-type base; and wherein the NPN transistor comprises:
a P-type base situated in a second of the N-type device regions;
an N-type emitter situated in the P-type base along its upper surface; and
an N-type collector comprising material of the second N-type device region outside the P-type base.

13. A structure as in claim 12 wherein:
each of the first and second P-type device regions, including any directly underlying P-type semiconductive material, is surrounded along its outside surface within the semiconductive layers and the substrate by an N-type tub; and
each of the first and second N-type device regions, including any directly underlying N-type semiconductive material, is surrounded along its outside surface within the semiconductive layers and the substrate by a P-type tub.

14. A structure as in claim 1 wherein:
each lower buried region vertically extends partway through each of the substrate and the lower semiconductive layer; and
each upper buried region vertically extends partway through each semiconductive layer.

15. A structure as in claim 14 wherein:
the two upper buried regions are spaced laterally apart from each other along the upper semiconductor interface; and
the two lower buried regions are spaced laterally apart from each other along the lower semiconductor interface.

16. A structure as in claim 14 wherein at least one of each of the P-type and N-type device regions is vertically electrically isolated from the substrate.

17. A structure as in claim 16 wherein each so-isolated device region, including any directly underlying semiconductive material of the same conductivity type as that device region, is surrounded along its outside surface within the semiconductive layers and the substrate by semiconductive material of opposite conductivity type to that device region.

18. A structure as in claim 16 wherein one of the so-isolated device regions, including any directly underlying semiconductive material of the same conductivity type as that device region, is surrounded along its outside surface within the semiconductive layers and the substrate by a tub of opposite conductivity type to that device region, the tub being surrounded along its outside surface within the semiconductive layers and the substrate by semiconductive material of opposite conductivity type to the tub.

19. A structure as in claim 18 wherein:
the tub comprises (a) another of the device regions, (b) one of the upper buried regions, and (c) one of the lower buried regions; and
the semiconductive material directly surrounding the tub comprises (a) a further one of the device regions, (b) the other upper buried region, and (c) the other lower buried region.

20. A structure as in claim 19 wherein the lower buried region which forms part of the tub has a sheet resistance of no more than 200 ohms/sq.

21. A structure as in claim 20 further including an additional upper buried region situated along the upper semiconductor interface, the additional upper buried region lying directly below the device region surrounded by the tub and being of the same conductivity type as that device region, the additional upper buried region having a sheet resistance of no more than 1000 ohms/sq.

22. A semiconductor structure comprising (a) a monocrystalline semiconductive substrate, (b) a lower monocrystalline semiconductive layer that overlies the substrate and adjoins it along a lower semiconductor interface, and (c) an upper monocrystalline semiconductive layer that overlies the lower semiconductive layer and adjoins it along an upper semiconductor interface, wherein:
the substrate comprises a major substrate region of a first conductivity type;
a lower buried region of the first conductivity type more heavily doped than the major substrate region is situated along the lower semiconductor interface and meets the major substrate region;
a lower buried region of a second conductivity type opposite to the first conductivity type is situated along the lower semiconductor interface and meets the major substrate region;

an upper buried region of the first conductivity type is situated along the upper semiconductor interface;

an upper buried region of the second conductivity type is situated along the upper semiconductor interface;

the upper semiconductive layer contains a device region of the first conductivity type and a device region of the second conductivity type laterally meeting the device region of the first conductivity type; and each device region vertically extends into the upper semiconductive layer to a depth sufficient to meet one of the upper buried regions.

23. A structure as in claim 22 wherein:

the device region of the first conductivity type is more lightly doped than the upper buried region of the first conductivity type and vertically extends through the upper semiconductive layer to meet the upper buried region of the first conductivity type; and the device region of the second conductivity type vertically extends largely through the upper semiconductive layer.

24. A structure as in claim 23 wherein the upper buried region of the first conductivity type at least partially overlies the lower buried region of the second conductivity type.

25. A structure as in claim 24 wherein the device and upper buried regions of the first conductivity type, including any directly underlying semiconductive material of the first conductivity type, are surrounded along their joint outside surface within the semiconductive layers and the substrate by a tub of the second conductivity type, the tub comprising the device and lower buried regions of the second conductivity type.

26. A structure as in claim 25 including a field-effect transistor that comprises:

a pair of source/drain zones of the second conductivity type situated in the device region of the first conductivity type and laterally separated from each other by a channel zone; and a gate electrode overlying the channel zone and vertically separated from the channel zone by a gate dielectric layer.

27. A structure as in claim 26 wherein the lower buried region of the second conductivity type has a sheet resistance of no more than 200 ohms/sq.

28. A structure as in claim 27 wherein the upper buried region of the first conductivity type has a sheet resistance of no more than 1000 ohms/sq.

29. A structure as in claim 25 including a bipolar transistor that comprises:

a base of the second conductivity type situated in the device region of the first conductivity type;

an emitter of the first conductivity type situated in the base along its upper surface; and a collector of the first conductivity type comprising the upper buried region of the first conductivity type and overlying material of the device region of the first conductivity type outside the base.

30. A structure as in claim 25 wherein the upper semiconductive layer further includes an additional device region of the second conductivity type spaced laterally apart from the first-mentioned device region of the second conductivity type, vertically extending largely through the upper semiconductive layer, and at least partially overlying the upper buried region of the first conductivity type.

31. A structure as in claim 30 including a field-effect transistor that comprises:

a source zone of the second conductivity type situated in the device region of the first conductivity type and laterally separated from the additional device region of the second conductivity type by a channel zone;

a main drain zone of the second conductivity type situated in the additional device region of the second conductivity type, more heavily doped than the additional device region, and spaced laterally apart from the channel zone; and a gate electrode overlying the channel zone, vertically separated from the channel zone by a first dielectric layer, extending over part of the additional device region of the second conductivity type, and vertically separated from the additional device region by a second gate dielectric layer thicker than the first gate dielectric layer.

32. A structure as in claim 25 including a bipolar transistor that comprises:

an emitter of the first conductivity type situated in the additional device region of the second conductivity type along its upper surface;

a base of the second conductivity type comprising material of the additional device region outside the emitter; and a collector of the first conductivity type comprising the device and upper buried regions of the first conductivity type.

33. A structure as in claim 25 wherein the first and second conductivity types respectively are P type and N type.

34. A structure as in claim 23 wherein the upper semiconductive layer further includes an additional device region of the first conductivity type more lightly doped than the upper buried region of the first conductivity type, spaced laterally apart from the first-mentioned device region of the first conductivity type, and vertically extending largely through the upper semiconductive layer.

35. A structure as in claim 34 including a field-effect transistor that comprises:

a source zone of the first conductivity type is situated in the device region of the second conductivity type and laterally separated from the additional device region of the first conductivity type by a channel zone;

a main drain zone of the first conductivity type situated in the additional device region of the first conductivity type, more heavily doped than the additional device region, and spaced laterally apart from the channel zone; and a gate electrode overlying the channel zone, vertically separated from the channel zone by a first gate dielectric layer, extending over part of the additional device region of the first conductivity type, and vertically separated from the additional device region by a second gate dielectric layer thicker than the first gate dielectric layer.

36. A structure as in claim 34 including a bipolar transistor that comprises: an emitter of the second conductivity type situated in the additional device region of the first conductivity type along its upper surface;

a base of the first conductivity type comprising material of the additional device region of the first conductivity type outside the emitter; and a collector of the second conductivity type comprising the device and lower buried regions of the second conductivity type.

37. A structure as in claim 36 wherein the base further includes an additional upper buried region of the first conductivity type situated along the upper semiconductor interface, spaced laterally apart from the first-mentioned upper buried region of the first conductivity type, more heavily doped than the additional device region of the first conductivity type, and meeting the additional device region.

38. A structure as in claim 23 wherein the lower and upper buried regions of the first conductivity type are electrically connected to each other through the lower semiconductive layer.

39. A structure as in claim 38 including a field-effect transistor that comprises:
- a pair of source/drain zones of the second conductivity type situated in the device region of the first conductivity type and laterally separated from each other by a channel zone; and
- a gate electrode overlying the channel zone and vertically separated from the channel zone by a gate dielectric layer.

40. A structure as in claim 38 including a capacitor that comprises:
- a lower plate of the second conductivity type situated in the device region of the second conductivity type and more heavily doped than the device region of the second conductivity type; and
- an upper plate situated above the lower plate and vertically separated from the lower plate by a dielectric layer.

41. A structure as in claim 40 wherein the lower plate overlies the lower buried region of the first conductivity type.

42. A structure as in claim 25 wherein:
- the device region of the first conductivity type is more lightly doped than the upper buried region of the first conductivity type and vertically extends through the upper semiconductive layer to meet the upper buried region of the first conductivity type; and
- the device region of the second conductivity type is more lightly doped than the upper buried region of the second conductivity type and vertically extends through the upper semiconductive layer to meet the upper buried region of the second conductivity type.

43. A structure as in claim 42 wherein the device and upper buried regions of the first conductivity type at least partially overlie the lower buried region of the second conductivity type.

44. A structure as in claim 43 wherein the device and upper buried regions of the first conductivity type, including any directly underlying semiconductive material of the first conductivity type, are surrounded along their joint outside surface within the semiconductive layers and the substrate by a tub of the second conductivity type, the tub comprising the device, upper buried, and lower buried regions of the second conductivity type.

45. A structure as in claim 44 including a field-effect transistor that comprises:
- a pair of source/drain zones of the second conductivity type situated in the device region of the first conductivity type and laterally separated from each other by a channel zone; and
- a gate electrode overlying the channel zone and vertically separated from the channel zone by a gate dielectric layer.

46. A structure as in claim 44 including a bipolar transistor that comprises:
- a base of the second conductivity type situated in the device region of the first conductivity type;
- an emitter of the first conductivity type situated in the base along its upper surface; and
- a collector of the first conductivity type comprising the upper buried region of the first conductivity type and overlying material of the device region of the first conductivity type outside the base.

47. A structure as in claim 44 wherein the upper semiconductive layer further includes an additional device region of the second conductivity type more lightly doped than the upper buried region of the second conductivity type, spaced laterally apart from the first-mentioned device region of the second conductivity type, vertically extending largely through the upper semiconductive layer, and at least partially overlying the upper buried region of the first conductivity type.

48. A structure as in claim 47 including a field-effect transistor that comprises:
- a source zone of the second conductivity type situated in the device region of the first conductivity type and laterally separated from the additional device region of the second conductivity type by a channel zone;
- a main drain zone of the second conductivity type situated in the additional device region of the second conductivity type, more heavily doped than the additional device region, and spaced laterally apart from the channel zone; and
- a gate electrode overlying the channel zone, vertically separated from the channel zone by a first dielectric layer, extending over part of the additional device region of the second conductivity type, and vertically separated from the additional device region by a second gate dielectric layer thicker than the first gate dielectric layer.

49. A structure as in claim 47 including a bipolar transistor that comprises:
- an emitter of the first conductivity type situated in the additional device region of the second conductivity type along its upper surface;
- a base of the second conductivity type comprising material of the additional device region outside the emitter; and
- a collector of the first conductivity type comprising the device and upper buried regions of the first conductivity type.

50. A structure as in claim 42 including a bipolar transistor that comprises:
- an emitter of the second conductivity type situated in the device region of the first conductivity type along its upper surface;
- a base of the first conductivity type comprising the upper buried region of the first conductivity type and overlying material of the device region of the first conductivity type outside the emitter; and
- a collector of the second conductivity type comprising the device, upper buried, and lower buried regions of the second conductivity type.

51. A structure as in claim 42 wherein the device and upper buried regions of the second conductivity type, including any directly underlying semiconductive material of the second conductivity type, are surrounded along their joint outside surface within the semiconductive layers and the substrate by a tub of the first conductivity type, the tub comprising the device, upper buried, and lower buried regions of the first conductivity type.

52. A structure as in claim 51 including a bipolar transistor that comprises:

a base of the first conductivity type situated in the device region of the first conductivity type;

an emitter of the second conductivity type situated in the base along its upper surface; and a collector of the second conductivity type comprising the upper buried region of the second conductivity type and overlying material of the device region of the second conductivity type outside the base.

53. A structure as in claim 22 wherein:

the device region of the first conductivity type vertically extends largely through the upper semiconductive layer; and the device region of the second conductivity type is more lightly doped than the upper buried layer of the second conductivity type and vertically extends through the upper semiconductive layer to meet the upper buried region of the second conductivity type.

54. A structure as in claim 53 wherein the upper buried region of the second conductivity type at least partially overlies the lower buried region of the first conductivity type.

55. A structure as in claim 54 including a field-effect transistor that comprises:

a pair of source/drain zones of the first conductivity type situated in the device region of the conductivity type and laterally separated from each other by a channel zone; and a gate electrode overlying the channel zone and vertically separated from the channel zone by a gate dielectric layer.

56. A structure as in claim 54 including a bipolar transistor that comprises:

a base of the first conductivity type situated in the device region of the second conductivity type;

an emitter of the second conductivity type situated in the base along its upper surface; and a collector of the second conductivity type comprising the upper buried region of the second conductivity type and overlying material of the device region of the second conductivity type outside the base.

57. A structure as in claim 54 including a Schottky diode that comprises:

a cathode comprising the upper buried region of the second conductivity type and directly overlying material of the device region of the second conductivity type; and an anode directly overlying the device region of the second conductivity type and comprising metal and/or metal-like material.

58. A structure as in claim 53 wherein the lower and upper buried regions of the second conductivity type are electrically connected to each other through the lower semiconductive layer.

59. A structure as in claim 58 including a field-effect transistor that comprises:

a pair of source/drain zones of the first conductivity type situated in the device region of the second conductivity type and laterally separated from each other by a channel zone; and a gate electrode overlying the channel zone and vertically separated from the channel zone by a gate dielectric layer.

60. A semiconductor structure comprising (a) a semiconductive substrate, (b) a lower semiconductive layer that overlies the substrate and adjoins it along a lower semiconductor interface, and (c) an upper semiconductive layer that overlies the lower semiconductive layer and adjoins it along an upper semiconductor interface, wherein:

the substrate comprises a major substrate region of a first conductivity type;

a lower buried region of a second conductivity type opposite to the first conductivity type is situated along the lower semiconductor interface and meets the major substrate region;

an upper buried region of the first conductivity type is situated along the upper semiconductor interface and at least partially overlies the lower buried region of the second conductivity type;

an upper buried region of the second conductivity type is situated along the upper semiconductor interface;

a device region of the first conductivity type more lightly doped than the upper buried region of the first conductivity type vertically extends through the upper semiconductive layer to meet the upper buried region of the first conductivity type; and a device region of the second conductivity type vertically extends largely through the upper semiconductive layer and laterally meets the device region of the first conductivity type.

61. A structure as in claim 60 wherein the device and upper buried regions of the first conductivity type, including any directly underlying semiconductive material of the first conductivity type, are surrounded along their joint outside surface within the semiconductive layers and the substrate by a tub of the second conductivity type, the tub comprising the device and lower buried regions of the second conductivity type.

62. A structure as in claim 61 including a field-effect transistor that comprises:

a pair of source/drain zones of the second conductivity type situated in the device region of the first conductivity type and laterally separated from each other by a channel zone; and a gate electrode overlying the channel zone and vertically separated from the channel zone by a gate dielectric layer.

63. A structure as in claim 62 wherein:

the lower buried region of the second conductivity type has a sheet resistance of no more than 200 ohms/sq.; and the upper buried region of the first conductivity type has a sheet resistance of no more than 1,000 ohms/sq.

64. A structure as in claim 61 including a bipolar transistor that comprises:

a base of the second conductivity type situated in the device region of the first conductivity type;

an emitter of the first conductivity type situated in the base along its upper surface; and a collector of the first conductivity type comprising the upper buried region of the first conductivity type and overlying material of the device region of the first conductivity type outside the base.

65. A structure as in claim 61 wherein an additional device region of the second conductivity type vertically extends largely through the upper semiconductive layer, is spaced laterally apart from the first-mentioned device region of the second conductivity type, and at least partially overlies the upper buried region of the first conductivity type.

66. A structure as in claim 65 including a field-effect transistor that comprises:

a source zone of the second conductivity type situated in the device region of the first conductivity type and laterally separated from the additional device region of the second conductivity type by a channel zone;

a main drain zone of the second conductivity type situated in the additional device region of the second conductivity type, more heavily doped than the additional device region, and spaced laterally apart from the channel zone; and a gate electrode overlying the channel zone, vertically separated from the channel zone by a first dielectric layer, extending over part of the additional device region of the second conductivity type, and vertically separated from the additional device region by a second gate dielectric layer thicker than the first gate dielectric layer.

67. A structure as in claim 65 including a bipolar transistor that comprises:

an emitter of the first conductivity type situated in the additional device region of the second conductivity type along its upper surface;

a base of the second conductivity type comprising material of the additional device region outside the emitter; and a collector of the first conductivity type comprising the device and upper buried regions of the first conductivity type.

68. An integrated semiconductor structure comprising:

a major region of a first conductivity type;

a vertical isolation region of a second conductivity type opposite to the first conductivity type overlying the major region;

a buffer region of the first conductivity type overlying the vertical isolation region; and a first bipolar transistor that comprises:
  a main collector zone of the first conductivity type overlying and meeting the buffer region such that the main collector zone has a higher net peak dopant concentration than the buffer region and such that, where the main collector zone generally meets the buffer region, the net dopant concentration of the buffer region has a different vertical gradient than the net dopant concentration of the main collector zone;
  a base zone of the second conductivity type overlying at least part of the main collector zone; and
  an emitter zone of the first conductivity type overlying at least part of the base zone.

69. A structure as in claim 68 arranged such that, where the buffer region generally meets the main collector zone, the vertical gradient of the net dopant concentration of the buffer region is less than the vertical gradient of the net dopant concentration of the main collector zone.

70. A structure as in claim 69 further including a lateral isolation region of the second conductivity type laterally surrounding the transistor and meetingthe vertical isolation region so that the two isolation regions provide junction isolation for the transistor laterally and from below.

71. A structure as in claim 70 wherein a further collector zone separates the main collector zone from the lateral isolation region, the further collector zone having a lower net dopant concentration than the main collector zone.

72. A structure as in claim 69 further including a second bipolar transistor of opposite polarity to, and situated laterally with respect to, the first bipolar transistor.

73. A structure as in claim 72 further including:

a first field-effect transistor ("FET") having source/drain zones of the first conductivity type separated by a channel zone in a device region of the second conductivity type; and a second FET having source/drain zones of the second conductivity type separated by a channel zone situated in a device region of the first conductivity type.

74. A structure as in claim 73 wherein the vertical isolation region provides vertical junction isolation between the major region and the device region of the first conductivity type.

75. A structure as in claim 68 wherein the first and second conductivity types respectively are P-type and N-type.

76. A structure as in claim 8 wherein:

the tub comprises (a) another of the device regions and (b) one of the upper buried regions; and the semiconductive material directly surrounding the tub comprises (a) a further one of the device regions and (b) one of the lower buried regions.

77. A structure as in claim 18 wherein:

the tub comprises (a) another of the device regions and (b) one of the upper buried regions; and the semiconductive material directly surrounding the tub comprises (a) a further one of the device regions, (b) the other upper buried region, and (c) one of the lower buried regions.

78. A structure as in claim 18 wherein the tub comprises (a) another of the device regions, (b) one of the upper buried regions, and (c) one of the lower buried regions.

79. A structure as in claim 78 wherein the lower buried region which forms part of the tub has a sheet resistance of no more than 200 ohms/sq.

80. A structure as in claim 79 wherein the other upper buried region lies directly below the device region surrounded by the tub, is of the same conductivity type as that device region, and has a sheet resistance of no more than 1000 ohms/sq.

81. A structure as in claim 25 wherein the tub further includes the upper buried region of the second conductivity type.

82. A semiconductor structure comprising (a) a monocrystalline semiconductive substrate, (b) a lower monocrystalline semiconductive layer that overlies the substrate and adjoins it along a lower semiconductor interface, and (c) an upper monocrystalline semiconductive layer that overlies the lower semiconductive layer and adjoins it along an upper semiconductor interface, wherein:

at least one first lower buried region of a first conductivity type is situated along the lower semiconductor interface;

at least one second lower buried region of a second conductivity type opposite to the first conductivity type is situated along the lower semiconductor interface, each second lower buried region being laterally separated from each first lower buried region along the lower semiconductor interface;

at least one first upper buried region of the first conductivity type is situated along the upper semiconductor interface;

at least one second upper buried region of the second conductivity type is situated along the upper semiconductor interface;

the upper semiconductive layer contains a plurality of P-type device regions and a plurality of N-type device regions; and one of the device regions of each conductivity type laterally meets one of the device regions of the other conductivity type and vertically extends into the semiconductive layer to a depth sufficient to meet one of the upper buried regions.

83. A structure as in claim 82 wherein:

each lower buried region vertically extends partway through each of the substrate and the lower semiconductive layer; and each first upper buried region vertically extends partway through each semiconductive layer.

84. A structure as in claim 83 wherein transistor zones are situated in the P-type and N-type device regions.

85. A structure as in claim 83 wherein at least one of each of the P-type and N-type device regions is vertically electrically isolated from the substrate.

86. A structure as in claim 85 wherein each so-isolated device region, including any directly underlying semiconductive material of the same conductivity type as that device region, is surrounded along its outside surface within the semiconductive layers and the substrate by semiconductive material of opposite conductivity type to that device region.

87. A structure as in claim 86 wherein the semiconductive material surrounding one of the so-isolated device regions comprises (a) another of the device regions, (b) one specified first upper buried region, and (c) one specified first lower buried region connected through the lower semiconductive layer to the specified first upper buried region.

88. A structure as in claim 85 wherein one of the so-isolated device regions, including any directly underlying semiconductive material of the same conductivity type as that device region, is surrounded along its outside surface within the semiconductive layers and the substrate by a tub of opposite conductivity type to that device region, the tub being surrounded along its outside surface within the semiconductive layers and the substrate by semiconductive material of opposite conductivity type to the tub.

89. A structure as in claim 88 wherein:

the tub comprises (a) another of the device regions, (b) one first upper buried region, and (c) one first lower buried region; and the semiconductive material directly surrounding the tub comprises (a) a further one of the device regions and (b) one second lower buried region.

90. A structure as in claim 88 wherein:

the tub comprises (a) another of the device regions and (b) one first upper buried region; and the semiconductive material directly surrounding the tub comprises (a) a further one of the device regions and (b) one second lower buried region.

91. A structure as in claim 61 wherein the device region of the second conductivity type meets the upper buried region of the second conductivity type, the tub further including the upper buried region of the second conductivity type.

92. A structure as in claim 65 wherein the additional device region of the second conductivity type is surrounded along its outside surface within the semiconductive layers and the substrate by a tub of the first conductivity type, the tub of the first conductivity type comprising the device and upper buried regions of the first conductivity type.

93. A semiconductor structure comprising (a) a semiconductive substrate, (b) a lower semiconductive layer that overlies the substrate and adjoins it along a lower semiconductor interface, and (c) an upper semiconductive layer that overlies the lower semiconductive layer and adjoins it along an upper semiconductor interface, wherein:

the substrate comprises a major substrate region of a first conductivity type;

a lower buried region of a second conductivity type opposite to the first conductivity type is situated along the lower semiconductor interface and meets the major substrate region;

an upper buried region of the first conductivity type is situated along the upper semiconductor interface and at least partially overlies the lower buried region of the second conductivity type;

a device region of the first conductivity type more lightly doped than the upper buried region of the first conductivity type vertically extends through the upper semiconductive layer to meet the upper buried region of the first conductivity type;

a first device region of the second conductivity type vertically extends largely through the upper semiconductive layer; and a second device region of the second conductivity type vertically extends largely through the upper semiconductive layer, is spaced laterally apart from the first device region of the second conductivity type, and at least partially overlies the upper buried region of the first conductivity type, the device and upper buried regions of the first conductivity type, including any directly underlying semiconductive material of the first conductivity type, being surrounded along their joint outside surface within the semiconductive layers and the substrate by a tub of the second conductivity type, the tub comprising the first device and lower buried regions of the second conductivity type.

94. A structure as in claim 93 wherein the second device region of the second conductivity type is surrounded along its outside surface within the semiconductive layers and the substrate by a tub of the first conductivity type, the tub of the first conductivity type comprising the device and upper buried regions of the first conductivity type.

95. A structure as in claim 94 including a field-effect transistor that comprises:

a source zone of the second conductivity type situated in the device region of the first conductivity type and laterally separated from the second device region of the second conductivity type by a channel zone;

a main drain zone of the second conductivity type situated in the second device region of the second conductivity type, more heavily doped than the second device region of the second conductivity type, and spaced laterally apart from the channel zone; and a gate electrode overlying the channel zone, vertically separated from the channel zone by a first dielectric layer, extending over part of the second device region of the second conductivity type, and vertically separated from the second device region of the second conductivity type by a second gate dielectric layer thicker than the first gate dielectric layer.

96. A structure as in claim 94 including a bipolar transistor that comprises:

an emitter of the first conductivity type situated in the second device region of the second conductivity type along its upper surface;

a base of the second conductivity type comprising material of the second device region of the second conductivity type outside the emitter; and a collector of the first conductivity type comprising the device and upper buried regions of the first conductivity type.

97. A structure as in claim 2 wherein each device region vertically extends largely through the upper semiconductive layer.

98. A structure as in claim 22 wherein:

each lower buried region vertically extends partway through each of the substrate and the lower semiconductive layer; and one of the upper buried regions vertically extends partway through each semiconductive layer.

99. A structure as in claim 22 wherein:

each lower buried region vertically extends partway through each of the substrate and the lower semiconductive layer; and each upper buried region vertically extends partway through each semiconductive layer.

100. A structure as in claim 60 wherein:

the lower buried region vertically extends partway through each of the substrate and the lower semiconductive layer; and one of the upper buried regions vertically extends partway through each semiconductive layer.

101. A structure as in claim 60 wherein:

the lower buried region vertically extends partway through each of the substrate and the lower semiconductive layer; and each of the upper buried regions vertically extends partway through each semiconductive layer.

102. A structure as in claim 101 wherein the two upper buried regions are spaced laterally apart from each other along the upper semiconductor interface.

103. A structure as in claim 83 wherein each second upper buried region vertically extends partway through each semiconductive layer.

104. A structure as in claim 82 wherein each second upper buried region is laterally separated from each first upper buried region along the upper semiconductor interface.

105. A structure as in claim 104 wherein:

each lower buried region vertically extends partway through each of the substrate and the lower semiconductive layer; and each first upper buried region vertically extends partway through each semiconductive layer.

106. A structure as in claim 105 wherein each second upper buried region vertically extends partway through each semiconductive layer.

107. A structure as in claim 1 wherein each device region is more lightly doped than the upper buried region of the same conductivity type as that device region.

108. A structure as in claim 107 wherein one of the device regions of each conductivity type laterally meets one of the device regions of the other conductivity type and vertically extends largely through the upper semiconductive layer down to at least one of (a) the upper semiconductor interface and (b) one of the upper buried regions.

109. A structure as in claim 22 wherein each device region is more lightly doped than the upper buried region of the same conductivity type as that device region.

110. A structure as in claim 109 wherein each device region vertically extends largely through the upper semiconductive layer down to at least one of (a) the upper semiconductor interface and (b) one of the upper buried regions.

111. A structure as in claim 60 wherein the device region of the second conductivity type is more lightly doped than the upper buried region of the second conductivity type.

112. A structure as in claim 111 wherein the device region of the second conductivity type vertically extends through the upper semiconductive layer down to one of the upper buried regions.

113. A structure as in claim 82 wherein each device region is more lightly doped than the upper buried region of the same conductivity type as that device region.

114. A structure as in claim 113 wherein one of the device regions of each conductivity type laterally meets one of the device regions of the other conductivity type and vertically extends largely through the upper semiconductive layer down to at least one of (a) the upper semiconductor interface and (b) one of the upper buried regions.

* * * * *

UNITED STATES PATENT AND TRADEMARK OFFICE
CERTIFICATE OF CORRECTION

PATENT NO. : 5,889,315
DATED : March 30, 1999
INVENTOR(S) : Farrenkopf, Douglas R.; Merrill, Richard B.; Saha, Samar; Brehmer, Kevin E.; Gadepally, Kamesh; Cacharelis, Phillip J.

It is certified that error appears in the above-identified patent and that said Letters Patent is hereby corrected as shown below:

Column 7,
Line 32, "7a-17f" should read -- 17a-17f --

Column 17,
Line 60, "$\delta I_F$" should read -- $\gamma I_F$ --;
Line 64, "$J=\delta I_F/\pi R^2$" should read -- $J = \gamma I_F/\pi R^2$ --;

Column 18,
Line 8, "$R_{N\square}=4\pi V_D/\delta I_F$" should read -- $R_{N\square} =4\pi V_D/\gamma I_F$ --;
Line 10, "$\delta$" should read -- $\gamma$ --.

Claim 42,
Line 1, "claim 25" should read -- claim 22 --.

Signed and Sealed this

Fifth Day of March, 2002

*Attest:*

JAMES E. ROGAN
*Attesting Officer*      *Director of the United States Patent and Trademark Office*